(12) United States Patent
Lu et al.

(10) Patent No.: US 12,041,783 B2
(45) Date of Patent: *Jul. 16, 2024

(54) FERROELECTRIC MEMORY DEVICE AND METHOD OF FORMING THE SAME

(71) Applicant: Taiwan Semiconductor Manufacturing Company, Ltd., Hsinchu (TW)

(72) Inventors: Chun-Chieh Lu, Taipei (TW); Han-Jong Chia, Hsinchu (TW); Sai-Hooi Yeong, Zhubei (TW); Bo-Feng Young, Taipei (TW); Yu-Ming Lin, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/880,803

(22) Filed: Aug. 4, 2022

(65) Prior Publication Data

US 2022/0384459 A1 Dec. 1, 2022

Related U.S. Application Data

(62) Division of application No. 17/098,919, filed on Nov. 16, 2020, now Pat. No. 11,910,617.

(Continued)

(51) Int. Cl.
*H10B 51/30* (2023.01)
*H01L 29/66* (2006.01)
(Continued)

(52) U.S. Cl.
CPC ....... *H10B 51/30* (2023.02); *H01L 29/66969* (2013.01); *H01L 29/7869* (2013.01); *H01L 29/78696* (2013.01); *H10B 51/20* (2023.02)

(58) Field of Classification Search
CPC .......... H01L 29/78391; H01L 29/6684; H01L 29/7869; H10B 51/20; H10B 51/30; G11C 11/211

See application file for complete search history.

(56) References Cited

U.S. PATENT DOCUMENTS 10,062,784 B1 8/2018 Lee et al.
10,515,896 B2 12/2019 Yu et al.
(Continued)

FOREIGN PATENT DOCUMENTS

EP 3499580 A1 6/2019
KR 20180059271 A 6/2018
TW 200411901 A 7/2004

OTHER PUBLICATIONS

Herregods et al. "Vapour phase self-assembled monolayers for ALD blocking on 300 mm wafer scale." Conference: Joint EuroCVD 21—Baltic ALD 15 At: Linkoping, Sweden, published Jun. 2017.

(Continued)

*Primary Examiner* — Vincent Wall
(74) *Attorney, Agent, or Firm* — Eschweiler & Potashnik, LLC

(57) ABSTRACT

Provided is a ferroelectric memory device having a multilayer stack disposed over a substrate and including a plurality of conductive layers and a plurality of dielectric layers stacked alternately. A channel layer penetrates through the plurality of conductive layers and the plurality of dielectric layers. A plurality of ferroelectric portions are discretely disposed between the channel layer and the plurality of conductive layers. The plurality of ferroelectric portions are vertically separated from one another by one or more non-zero distances.

20 Claims, 54 Drawing Sheets

Related U.S. Application Data

(60) Provisional application No. 63/031,040, filed on May 28, 2020.

(51) Int. Cl.
*H01L 29/786* (2006.01)
*H10B 51/20* (2023.01)

(56) References Cited

U.S. PATENT DOCUMENTS

| | | | |
|---|---|---|---|
| 2007/0236979 A1 | 10/2007 | Takashima | |
| 2011/0298037 A1* | 12/2011 | Choe | G11C 16/0483 257/314 |
| 2020/0075631 A1 | 3/2020 | Dong et al. | |
| 2020/0212068 A1 | 7/2020 | Lee et al. | |
| 2021/0082955 A1* | 3/2021 | Rajashekhar | H10B 51/30 |
| 2021/0375917 A1 | 12/2021 | Lu et al. | |
| 2021/0375919 A1 | 12/2021 | Wang et al. | |
| 2021/0375930 A1 | 12/2021 | Lu et al. | |
| 2021/0375931 A1 | 12/2021 | Lu et al. | |
| 2021/0375933 A1 | 12/2021 | Lu et al. | |
| 2021/0375934 A1 | 12/2021 | Lu et al. | |
| 2021/0375936 A1 | 12/2021 | Chiang et al. | |
| 2021/0376153 A1 | 12/2021 | Lu et al. | |
| 2021/0398568 A1 | 12/2021 | Lin et al. | |
| 2021/0399014 A1 | 12/2021 | Wu et al. | |
| 2021/0399015 A1 | 12/2021 | Lin et al. | |
| 2021/0399016 A1 | 12/2021 | Jiang et al. | |
| 2021/0399017 A1 | 12/2021 | Sun et al. | |
| 2021/0399048 A1 | 12/2021 | Wu et al. | |
| 2021/0399052 A1 | 12/2021 | Wu et al. | |
| 2021/0407569 A1 | 12/2021 | Young et al. | |
| 2021/0407845 A1 | 12/2021 | Wang et al. | |
| 2021/0407980 A1 | 12/2021 | Young et al. | |
| 2021/0408038 A1 | 12/2021 | Lin et al. | |
| 2021/0408044 A1 | 12/2021 | Chiang et al. | |
| 2021/0408045 A1 | 12/2021 | Chiang et al. | |
| 2021/0408046 A1 | 12/2021 | Chang et al. | |
| 2022/0036931 A1 | 2/2022 | Lin et al. | |
| 2022/0037362 A1 | 2/2022 | Lin et al. | |
| 2022/0052060 A1 | 2/2022 | Young et al. | |
| 2022/0052075 A1 | 2/2022 | Young et al. | |
| 2022/0123003 A1 | 4/2022 | Young et al. | |
| 2022/0179693 A1 | 6/2022 | Aronovich | |
| 2022/0231026 A1 | 7/2022 | Wu et al. | |
| 2022/0231050 A1 | 7/2022 | Young et al. | |
| 2022/0231051 A1 | 7/2022 | Young et al. | |
| 2022/0262809 A1 | 8/2022 | Lin et al. | |
| 2022/0285393 A1 | 9/2022 | Young et al. | |
| 2022/0286949 A1 | 9/2022 | Sapra et al. | |
| 2022/0310132 A1 | 9/2022 | Lin et al. | |
| 2022/0358984 A1 | 11/2022 | Young et al. | |
| 2022/0359486 A1 | 11/2022 | Young et al. | |
| 2022/0359570 A1 | 11/2022 | Lu et al. | |
| 2022/0366952 A1 | 11/2022 | Lin et al. | |
| 2022/0367515 A1 | 11/2022 | Lu et al. | |
| 2022/0384292 A1 | 12/2022 | Wang et al. | |
| 2022/0384347 A1 | 12/2022 | Lin et al. | |
| 2022/0384348 A1 | 12/2022 | Chang et al. | |
| 2022/0384459 A1 | 12/2022 | Lu et al. | |
| 2022/0384461 A1 | 12/2022 | Lin et al. | |
| 2022/0384484 A1 | 12/2022 | Young et al. | |
| 2022/0384486 A1 | 12/2022 | Jiang et al. | |
| 2022/0384487 A1 | 12/2022 | Sun et al. | |
| 2022/0406350 A1 | 12/2022 | Lin et al. | |
| 2022/0416085 A1 | 12/2022 | Lu et al. | |
| 2023/0008998 A1 | 1/2023 | Yeong et al. | |
| 2023/0046715 A1 | 2/2023 | Sun et al. | |
| 2023/0063038 A1 | 3/2023 | Young et al. | |
| 2023/0065891 A1 | 3/2023 | Ling et al. | |
| 2023/0067455 A1 | 3/2023 | Wang et al. | |

OTHER PUBLICATIONS

Florent et al. "Vertical Ferroelectric Hf02 FET based on 3-D NAND Architecture: Towards Dense Low-Power Memory" 2018 IEEE International Electron Devices Meeting (IEDM), published on Jan. 17, 2019.

Final Office Action dated Feb. 14, 2023 for U.S. Appl. No. 17/098,919.

Non-Final Office Action dated Apr. 18, 2023 for U.S. Appl. No. 17/098,919.

Final Office Action dated Aug. 15, 2023 for U.S. Appl. No. 17/098,919.

Beesley et al. "Sub-15-nm Patterning of Asymmetric Metal Electrodes and Devices by Adhesion Lithography." Nature Communications, DOI: 10.1038/ncomms4933, published on May 27, 2014.

U.S. Appl. No. 17/186,852, filed Feb. 26, 2021.

Non-Final Office Action dated Jun. 16, 2022 for U.S. Appl. No. 17/098,919.

Notice of Allowance dated Oct. 20, 2023, for U.S. Appl. No. 17/098,919.

\* cited by examiner

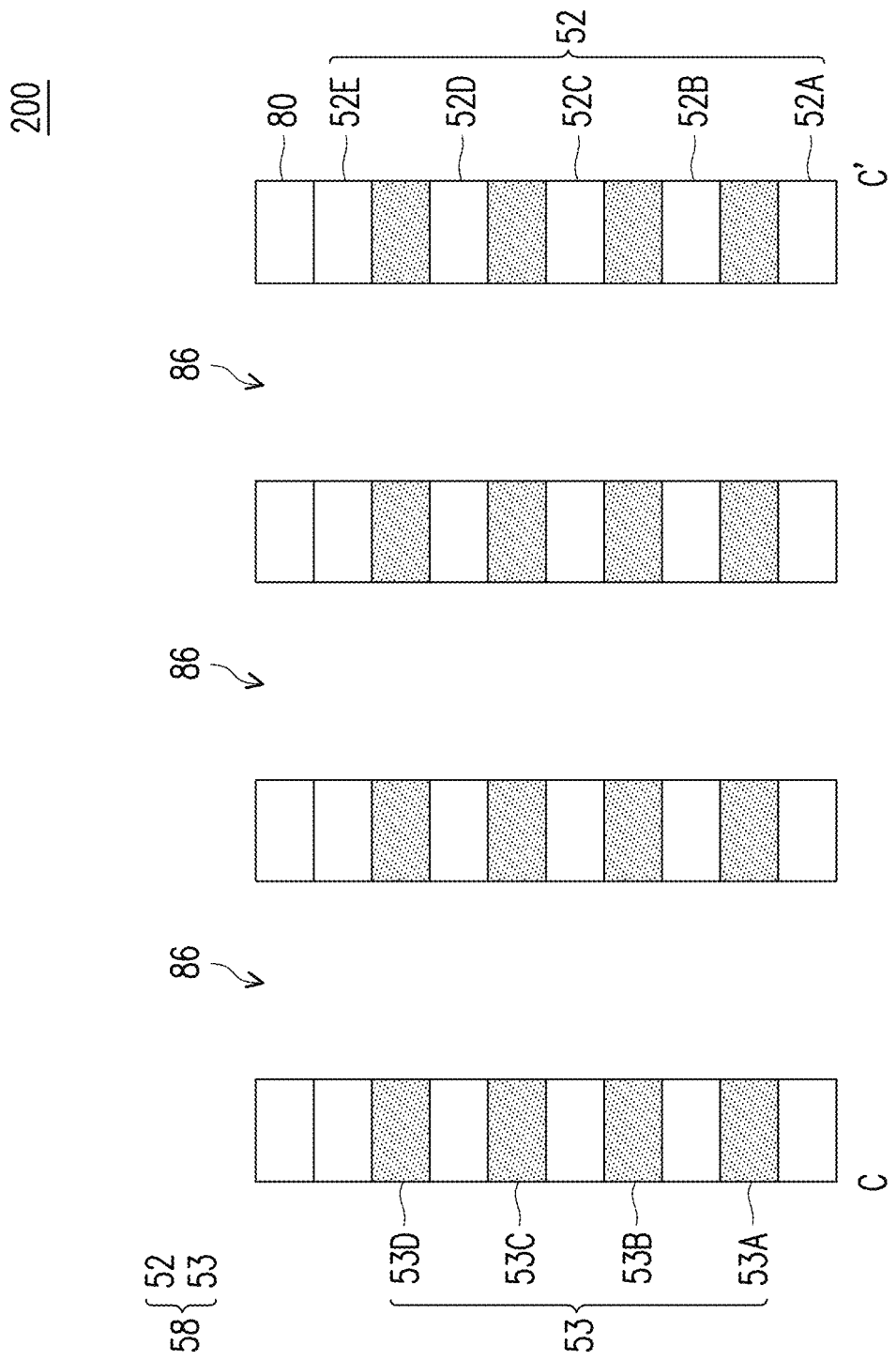

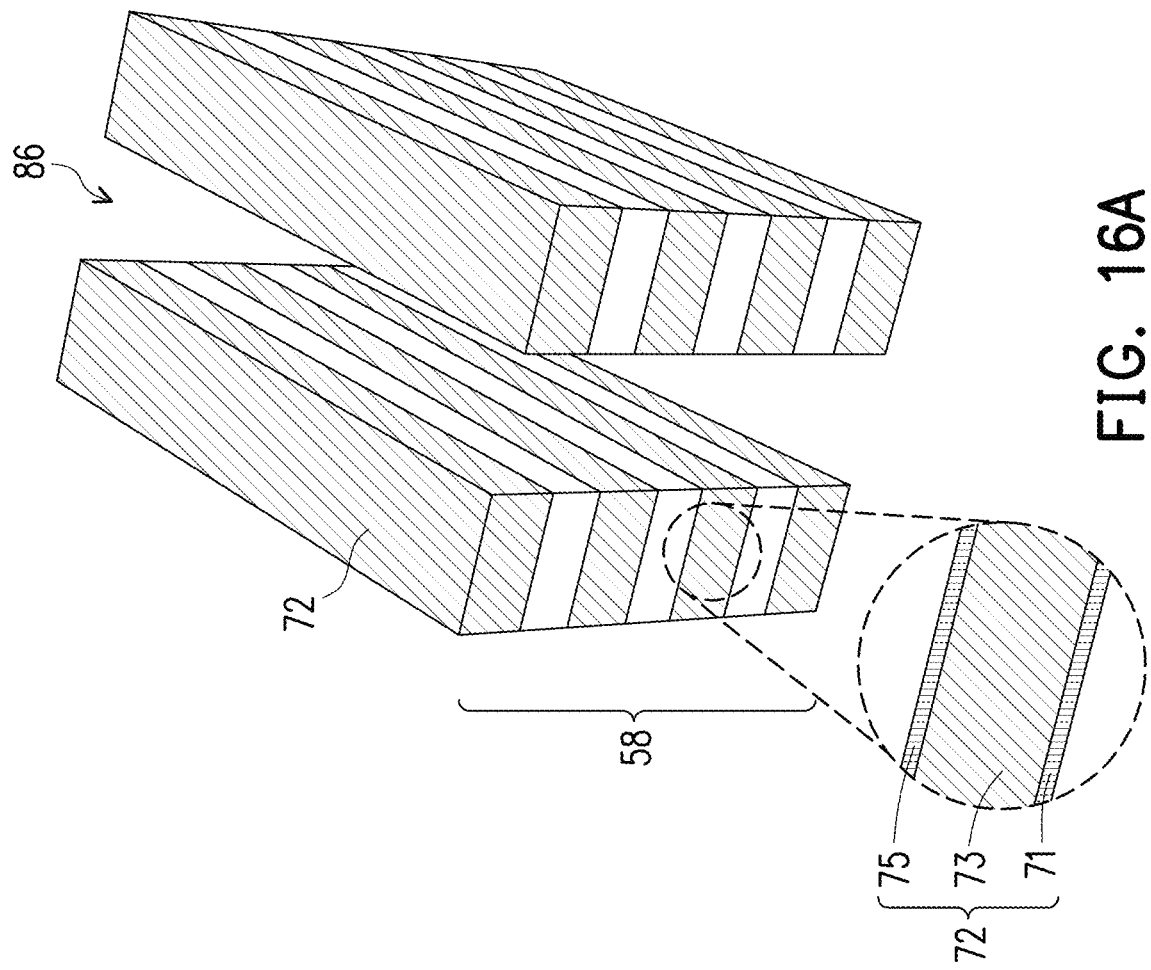

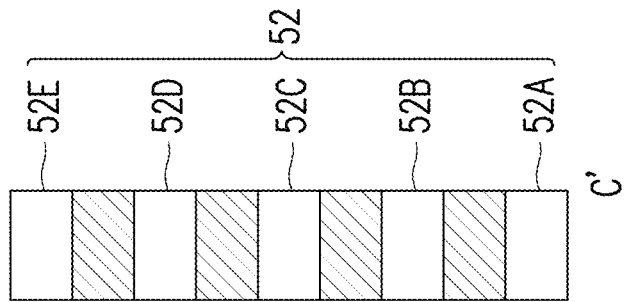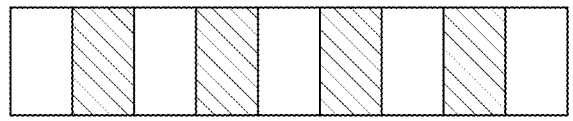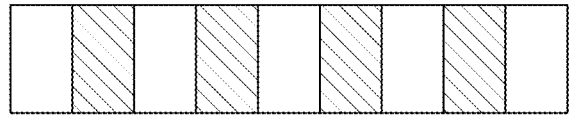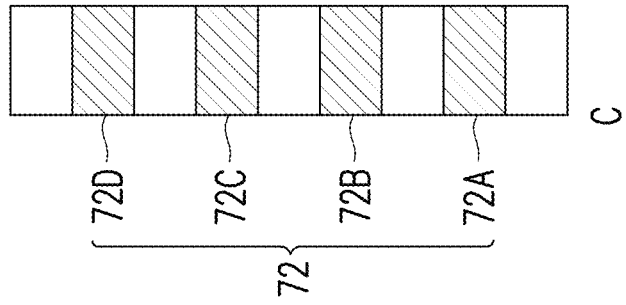
FIG. 16B

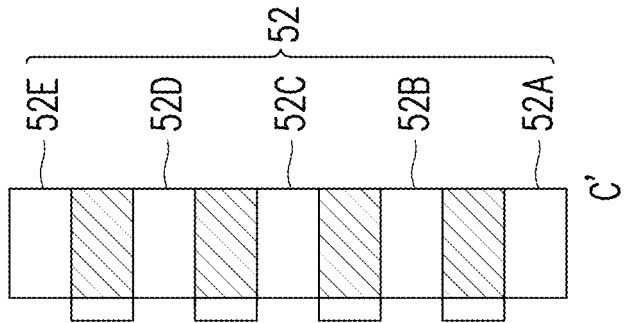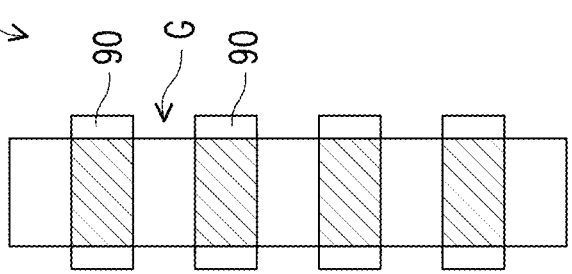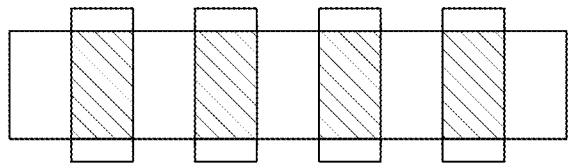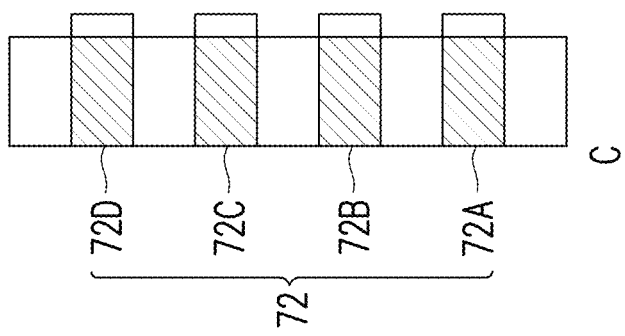
FIG. 19B

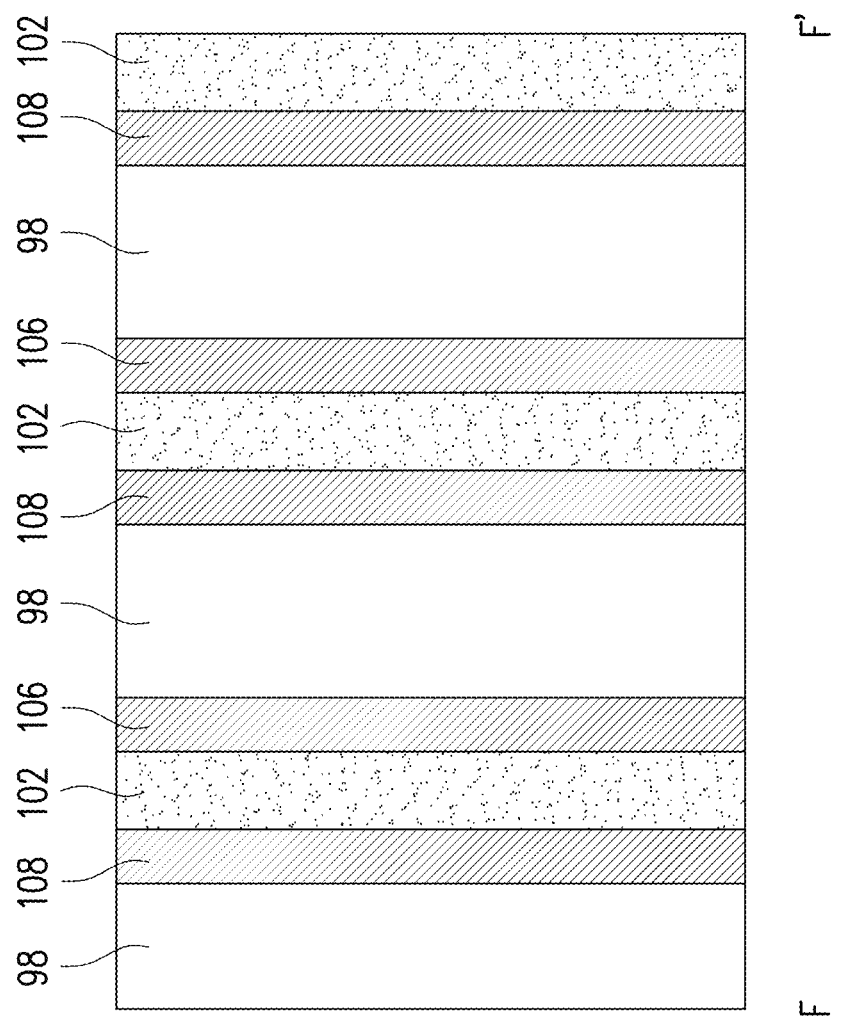

FERROELECTRIC MEMORY DEVICE AND METHOD OF FORMING THE SAME

REFERENCE TO RELATED APPLICATIONS

This Application is a Divisional of U.S. application Ser. No. 17/098,919, filed on Nov. 16, 2020, which claims the benefit of U.S. Provisional Application No. 63/031,040, filed on May 28, 2020. The contents of the above-referenced patent applications are hereby incorporated by reference in their entirety.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers over a semiconductor substrate, and patterning the various material layers using lithography and etching techniques to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3, 4, 5, 6, 7, 8, 9, 10, 11, 12, 13, 14, 15A, 15B, 16A, 16B, 17A, 17B, 18A, 18B, 19A, 19B, 20A, 20B, 20C, 20D, 20E, 20F, 21, 22, 23, 24A, 24B, 25A, 25B, 26A, 26B, 27A, 27B, 28A, 28B, 28C, 28D, 28E, 29A, 29B, 29C, 29D, and 29E illustrate varying views of manufacturing a fc memory array in accordance with some embodiments.

DETAILED DESCRIPTION

Figure 1A:
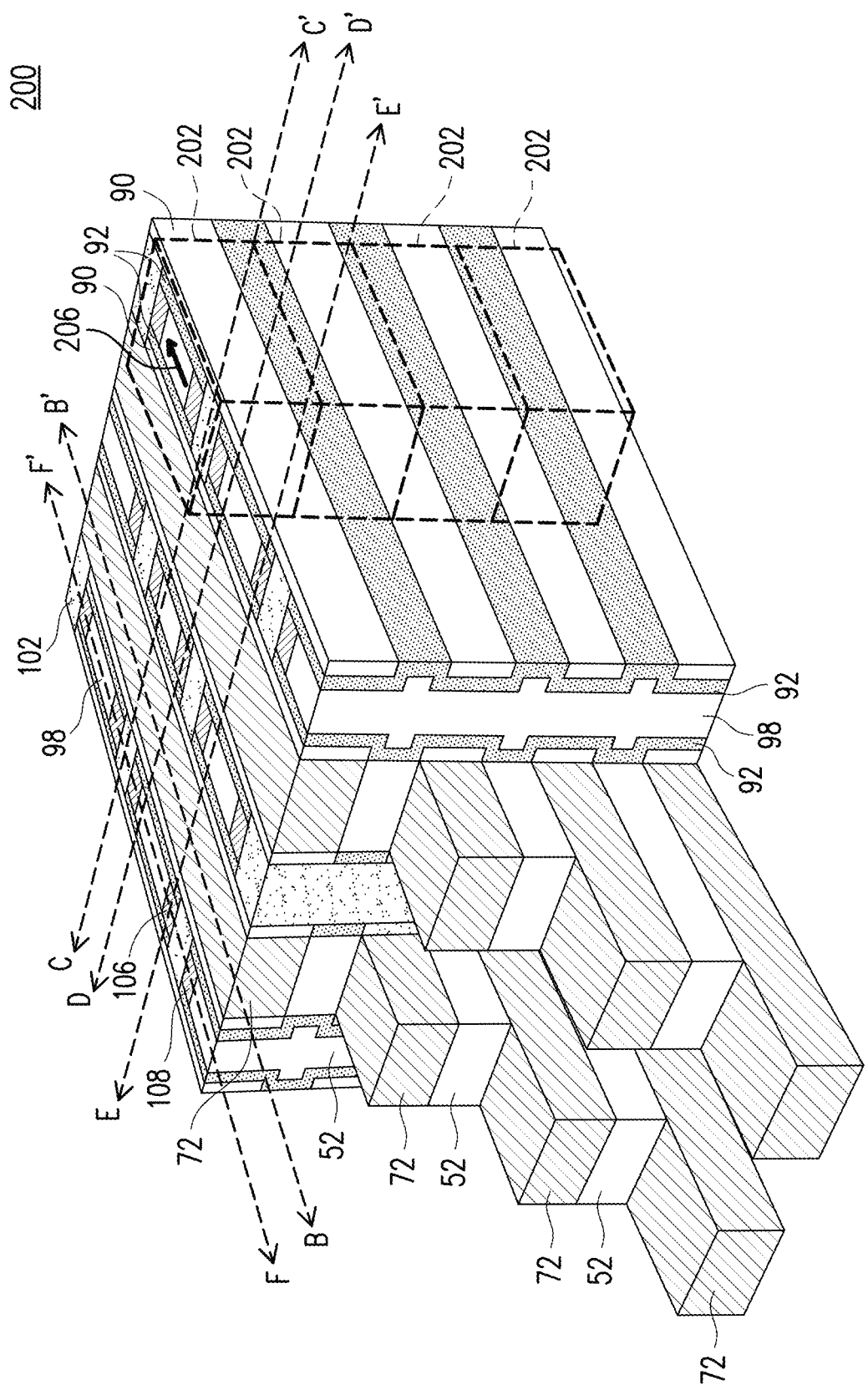
FIGS. 1A, 1B, and 1C illustrate a simplified perspective view, a circuit diagram, and a top down view of a ferroelectric memory device in accordance with some embodiments.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide a memory device such as a 3D memory array. In some embodiments, the 3D memory array is a ferroelectric field effect transistor (FeFET) memory circuit including a plurality of vertically stacked memory cells. In some embodiments, each memory cell is regarded as a FeFET that includes a word line region acting as a gate electrode, a bit line region acting as a first source/drain electrode, and a source line region acting as a second source/drain electrode, a ferroelectric material as a gate dielectric, and an oxide semiconductor (OS) as a channel region. In some embodiments, each memory cell is regarded as a thin film transistor (TFT).

Figure 1B:
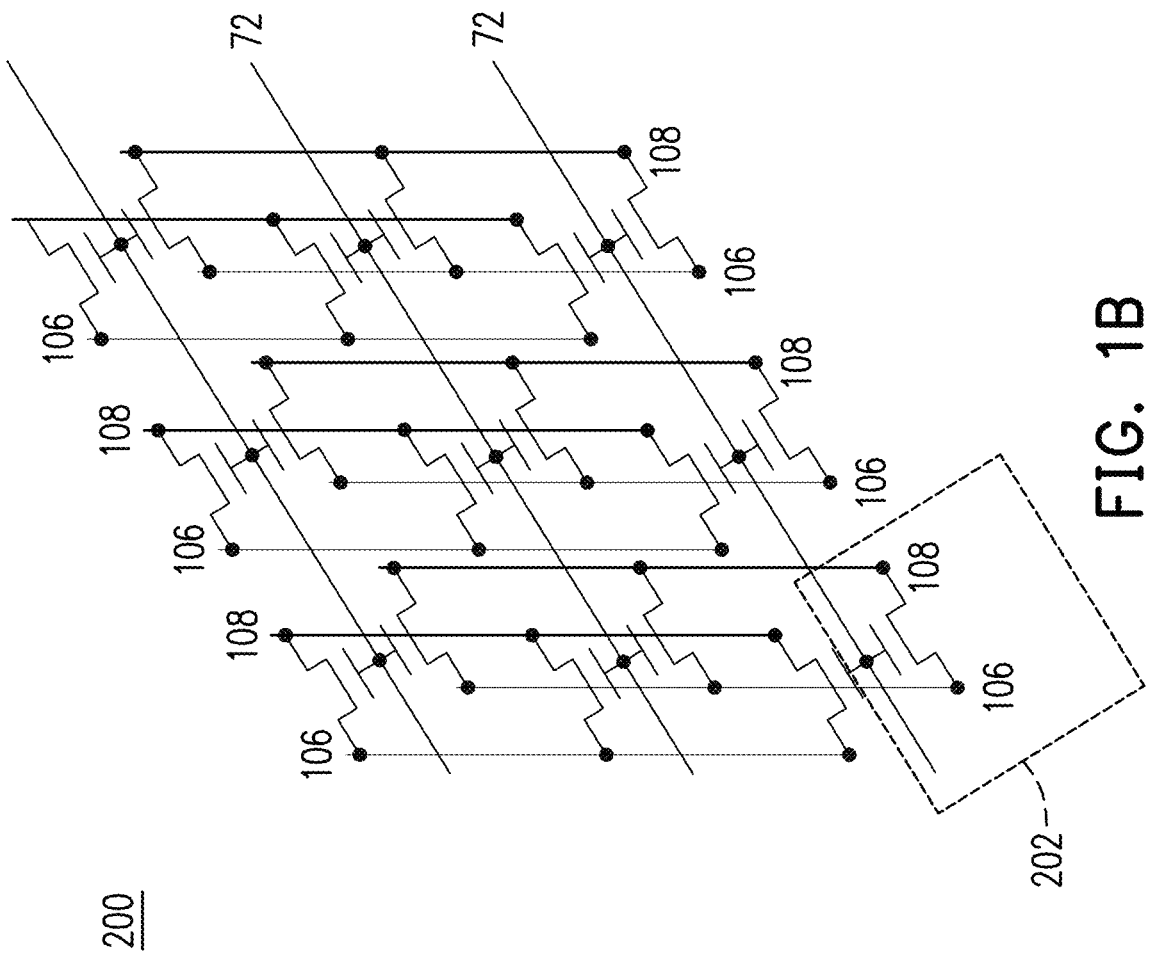
Figure 1C:
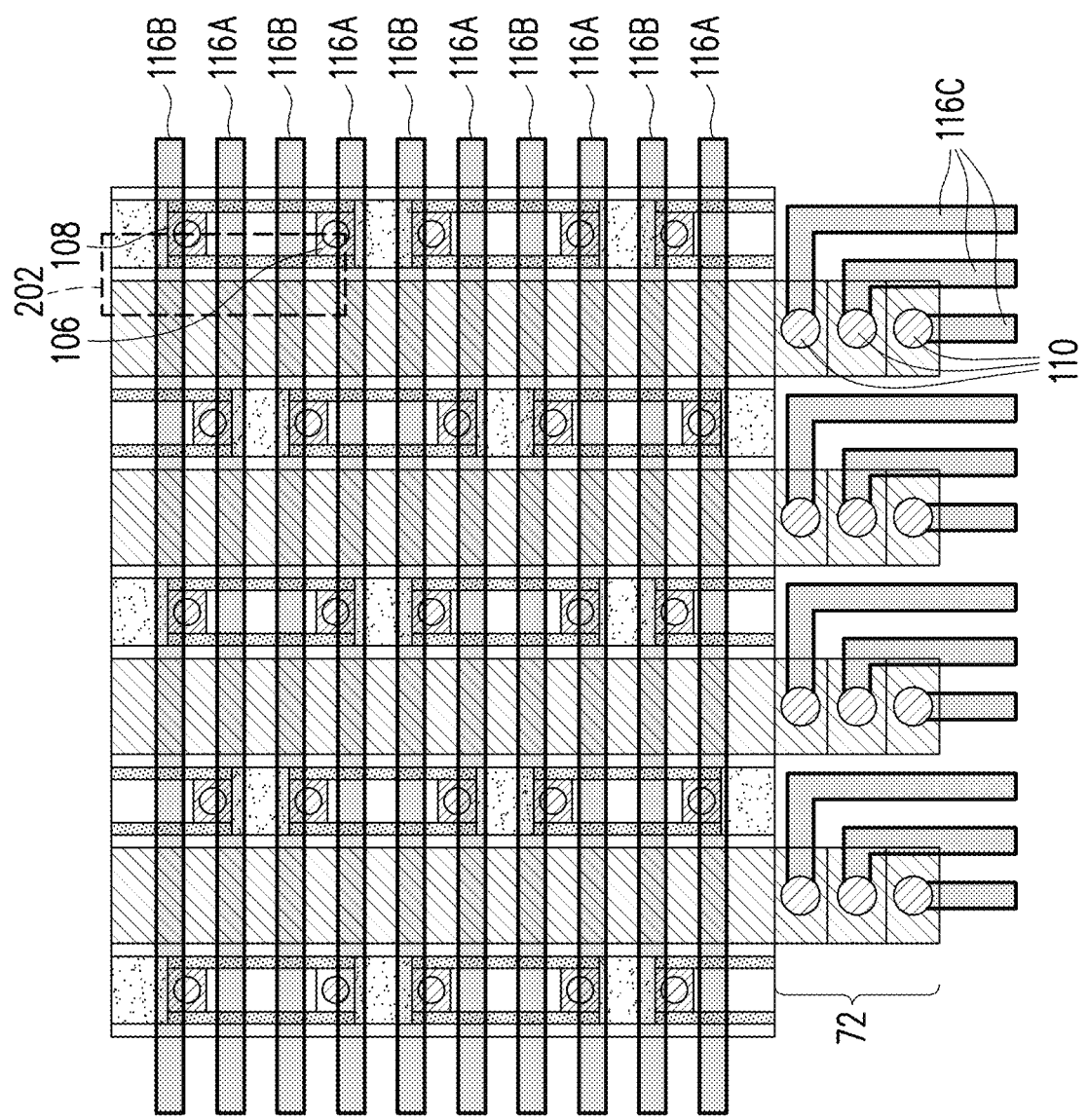

FIGS. 1A, 1B, and 1C illustrate examples of a memory array 200 according to some embodiments. FIG. 1A illustrates an example of a portion of a simplified memory array 200 in a partial three-dimensional view; FIG. 1B illustrates a circuit diagram of the memory array 200; and FIG. 1C illustrates a top down view of the memory array 200 in accordance with some embodiments. The memory array 200 includes a plurality of memory cells 202, which may be arranged in a grid of rows and columns. The memory cells 202 may further stacked vertically to provide a three dimensional memory array, thereby increasing device density. The memory array 200 may be disposed in the back end of line (BEOL) of a semiconductor die. For example, the memory array may be disposed in the interconnect layers of the semiconductor die, such as, above one or more active devices (e.g., transistors) formed on a semiconductor substrate.

In some embodiments, the memory array 200 is a flash memory array, such as a NOR flash memory array, or the like. In some embodiments, a gate of each memory cell 202 is electrically coupled to a respective word line (e.g., conductive line 72), a first source/drain region of each memory cell 202 is electrically coupled to a respective bit line (e.g., conductive line 116B), and a second source/drain region of each memory cell 202 is electrically coupled to a respective source line (e.g., conductive line 116A), which electrically couples the second source/drain region to ground. The memory cells 202 in a same horizontal row of the memory array 200 may share a common word line while the memory cells 202 in a same vertical column of the memory array 200 may share a common source line and a common bit line.

The memory array 200 includes a plurality of vertically stacked conductive lines 72 (e.g., word lines) with dielectric layers 52 disposed between adjacent ones of the conductive lines 72. The conductive lines 72 extend in a direction parallel to a major surface of an underlying substrate (not explicitly illustrated in FIGS. 1A and 1B). The conductive lines 72 may have a staircase configuration such that lower conductive lines 72 are longer than and extend laterally past endpoints of upper conductive lines 72. For example, in FIG. 1A, multiple, stacked layers of conductive lines 72 are illustrated with topmost conductive lines 72 being the shortest and bottommost conductive lines 72 being the longest. Respective lengths of the conductive lines 72 may increase in a direction towards the underlying substrate. In this manner, a portion of each of the conductive lines 72 may be accessible from above the memory array 200, and conductive contacts may be made to contact exposed portions of the conductive lines 72, respectively.

The memory array 200 further includes conductive pillars 106 (e.g., electrically connected to bit lines) and conductive pillars 108 (e.g., electrically connected to source lines) arranged alternately. The conductive pillars 106 and 108 may each extend in a direction perpendicular to the conductive lines 72. A dielectric material 98 is disposed between and isolates adjacent ones of the conductive pillars 106 and the conductive pillars 108.

Pairs of the conductive pillars 106 and 108 along with an intersecting conductive line 72 define boundaries of each memory cell 202, and an isolation pillar 102 is disposed between and isolates adjacent pairs of the conductive pillars 106 and 108. In some embodiments, the conductive pillars 108 are electrically coupled to ground. Although FIG. 1A illustrates a particular placement of the conductive pillars 106 relative the conductive pillars 108, it should be appreciated that the placement of the conductive pillars 106 and 108 may be exchanged in other embodiments.

In some embodiments, the memory array 200 may also include an oxide semiconductor (OS) material as a channel layer 92. The channel layer 92 may provide channel regions for the memory cells 202. For example, when an appropriate voltage (e.g., higher than a respective threshold voltage ($V_{th}$) of a corresponding memory cell 202) is applied through a corresponding conductive line 72, a region of the channel layer 92 that intersects the conductive line 72 may allow current to flow from the conductive pillars 106 to the conductive pillars 108 (e.g., in the direction indicated by arrow 206).

In some embodiments, the memory array 200 may also include ferroelectric portions 90 that are discretely disposed on sidewall surfaces of the conductive lines 72. For example, the ferroelectric portions 90 may comprise a first ferroelectric portion disposed on a sidewall surface of a first conductive line and a second ferroelectric portion disposed on a sidewall surface of a second conductive line and separated from the first ferroelectric portion. Because the conductive lines 72 are configured to act as gate electrodes, the ferroelectric portions 90 may serve as gate dielectrics for the memory cells 202. In some embodiments, the ferroelectric portions 90 include a ferroelectric material, such as a hafnium oxide, hafnium zirconium oxide, silicon-doped hafnium oxide, or the like. In some embodiments, respective ones of the ferroelectric portions 90 may have a substantially constant width over a height of the portion. In some additional embodiments, respective ones of the ferroelectric portions may comprise a mixed crystalline-amorphous state having a substantially uniform percentage of crystalline structure (e.g., a substantially constant ratio of crystalline state to amorphous state). In some additional embodiments, respective ones of the ferroelectric portions may have a crystalline structure with an orthorhombic phase of more than 70 mol %, more than 80 mol % (e.g., between approximately 80 mol % and approximately 99 mol %). Having an orthorhombic phase of greater than 70 mol % improves a ferroelectricity of the ferroelectric portions 90 and accordingly improves performance (e.g., a read window) of corresponding memory devices.

In some embodiments, adjacent ones of the ferroelectric portions 90 may be separated from one another by the channel layer 92. In some such embodiments, the channel layer 92 may continuously extend from a sidewall surface of a first ferroelectric portion to a sidewall surface of a second ferroelectric portion. In some embodiments, the channel layer 92 may line sidewall surfaces and horizontally extending surfaces of the ferroelectric portions 90, so as to define the channel layer 92 to have an uneven and wavy sidewall profile. In some embodiments, the channel layer 92 has a sidewall profile that defines recesses within a side of the channel layer 92 between adjacent ones of the ferroelectric portions 90. In some embodiments, the dielectric material 98 may extend to within the recesses. In some embodiments, the channel layer may contact the dielectric layer 52 disposed between adjacent conductive lines.

The ferroelectric portions 90 may respectively be polarized in one of two different directions, and the polarization direction may be changed by applying an appropriate voltage differential across the ferroelectric portions 90 and generating an appropriate electric field. The polarization may be relatively localized (e.g., generally contained within each boundaries of the memory cells 202). Depending on a polarization direction of a particular region of the ferroelectric portions 90, a threshold voltage of a corresponding memory cell 202 varies, and a digital value (e.g., 0 or 1) can be stored. For example, when a region of the ferroelectric portions 90 has a first electrical polarization direction, the corresponding memory cell 202 may have a relatively low threshold voltage, and when the region of the ferroelectric portions 90 has a second electrical polarization direction, the corresponding memory cell 202 may have a relatively high threshold voltage. The difference between the two threshold voltages may be referred to as the threshold voltage shift. A larger threshold voltage shift makes it easier (e.g., less error prone) to read the digital value stored in the corresponding memory cell 202.

To perform a write operation on a memory cell 202 in such embodiments, a write voltage is applied across a portion of the ferroelectric portions 90 corresponding to the memory cell 202. In some embodiments, the write voltage is applied, for example, by applying appropriate voltages to a corresponding conductive line 72 (e.g., the word line) and the corresponding conductive pillars 106/108 (e.g., the bit line/source line). In such embodiments, the conductive line 72 is configured to act as a gate electrode layer and the conductive pillars 106/108 are configured to act as source/drain regions. By applying the write voltage across the portion of the ferroelectric portions 90, a polarization direction of the region of the ferroelectric portions 90 may be changed. As a result, the corresponding threshold voltage of the corresponding memory cell 202 may also be switched from a low threshold voltage to a high threshold voltage or vice versa, and a digital value may be stored in the memory cell 202. Because the conductive lines 72 intersect the conductive pillars 106 and 108, individual memory cells 202 may be selected for the write operation.

To perform a read operation on the memory cell 202 in such embodiments, a read voltage (a voltage between the low and high threshold voltages) is applied to the corresponding conductive line 72 (e.g., the world line). Depending on the polarization direction of the corresponding ferroelectric portion 90, the memory cell 202 may or may not be turned on. As a result, the conductive pillar 106 may or may not be discharged through the conductive pillar 108 (e.g., a source line that is coupled to ground), and the digital value stored in the memory cell 202 can be determined. Because the conductive lines 72 intersect the conductive pillars 106 and 108, individual memory cells 202 may be selected for the read operation.

FIG. 1A further illustrates reference cross-sections of the memory array 200 that are used in later figures. Cross-section B-B' is along a longitudinal axis of conductive lines 72 and in a direction, for example, parallel to the direction of current flow of the memory cells 202. Cross-section C-C' is perpendicular to cross-section B-B' and extends through the dielectric materials 98 and the isolation pillars 102. Cross-section D-D' is perpendicular to cross-section B-B' and extends through the dielectric materials 98 and the conductive pillars 106. Cross-section E-E' is perpendicular to cross-section B-B' and extends through the dielectric materials 98 and the conductive pillars 106. Cross-section F-F' is parallel to cross-section B-B' and extends through the dielectric materials 98, the conductive pillars 106, the isolation pillars 102 and the conductive pillars 108. Subsequent figures refer to these reference cross-sections for clarity.

Figure 2:
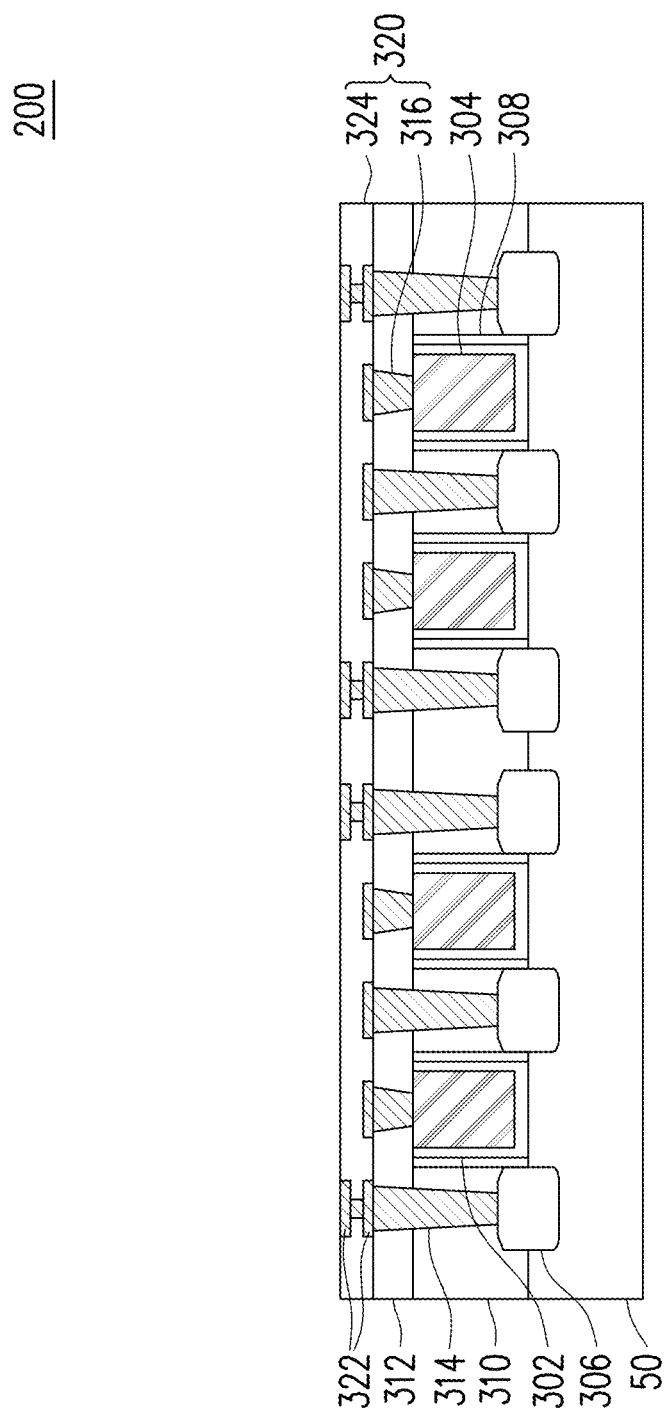

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be an integrated circuit die, such as a logic die, a memory die, an ASIC die, or the like. The substrate 50 may be a complementary metal oxide semiconductor (CMOS) die and may be referred to as a CMOS under array (CUA). The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

FIG. 2 further illustrates circuits that may be formed over the substrate 50. The circuits include transistors at a top surface of the substrate 50. The transistors may include gate dielectric layers 302 over top surfaces of the substrate 50 and gate electrodes 304 over the gate dielectric layers 302. Source/drain regions 306 are disposed in the substrate 50 on opposite sides of the gate dielectric layers 302 and the gate electrodes 304. Gate spacers 308 are formed along sidewalls of the gate dielectric layers 302 and separate the source/drain regions 306 from the gate electrodes 304 by appropriate lateral distances. The transistors may include fin field effect transistors (FinFETs), nanostructure (e.g., nanosheet, nanowire, gate-all-around, or the like) FETs (nano-FETs), planar FETs, the like, or combinations thereof, and may be formed by gate-first processes or gate-last processes.

A first inter-layer dielectric (ILD) 310 surrounds and isolates the source/drain regions 306, the gate dielectric layers 302, and the gate electrodes 304. A second ILD 312 is over the first ILD 310. Source/drain contacts 314 extend through the second ILD 312 and the first ILD 310 and are electrically coupled to the source/drain regions 306. Gate contacts 316 extend through the second ILD 312 and are electrically coupled to the gate electrodes 304. An interconnect structure 320 is over the second ILD 312, the source/drain contacts 314, and the gate contacts 316. The interconnect structure 320 includes one or more stacked dielectric layers 324 and conductive features 322 formed in the one or more dielectric layers 324, for example. The interconnect structure 320 may be electrically connected to the gate contacts 316 and the source/drain contacts 314 to form functional circuits. In some embodiments, the functional circuits formed by the interconnect structure 320 may include logic circuits, memory circuits, sense amplifiers, controllers, input/output circuits, image sensor circuits, the like, or combinations thereof. Although FIG. 2 discusses transistors formed over the substrate 50, other active devices (e.g., diodes or the like) and/or passive devices (e.g., capacitors, resistors, or the like) may also be formed as part of the functional circuits.

Figure 3:
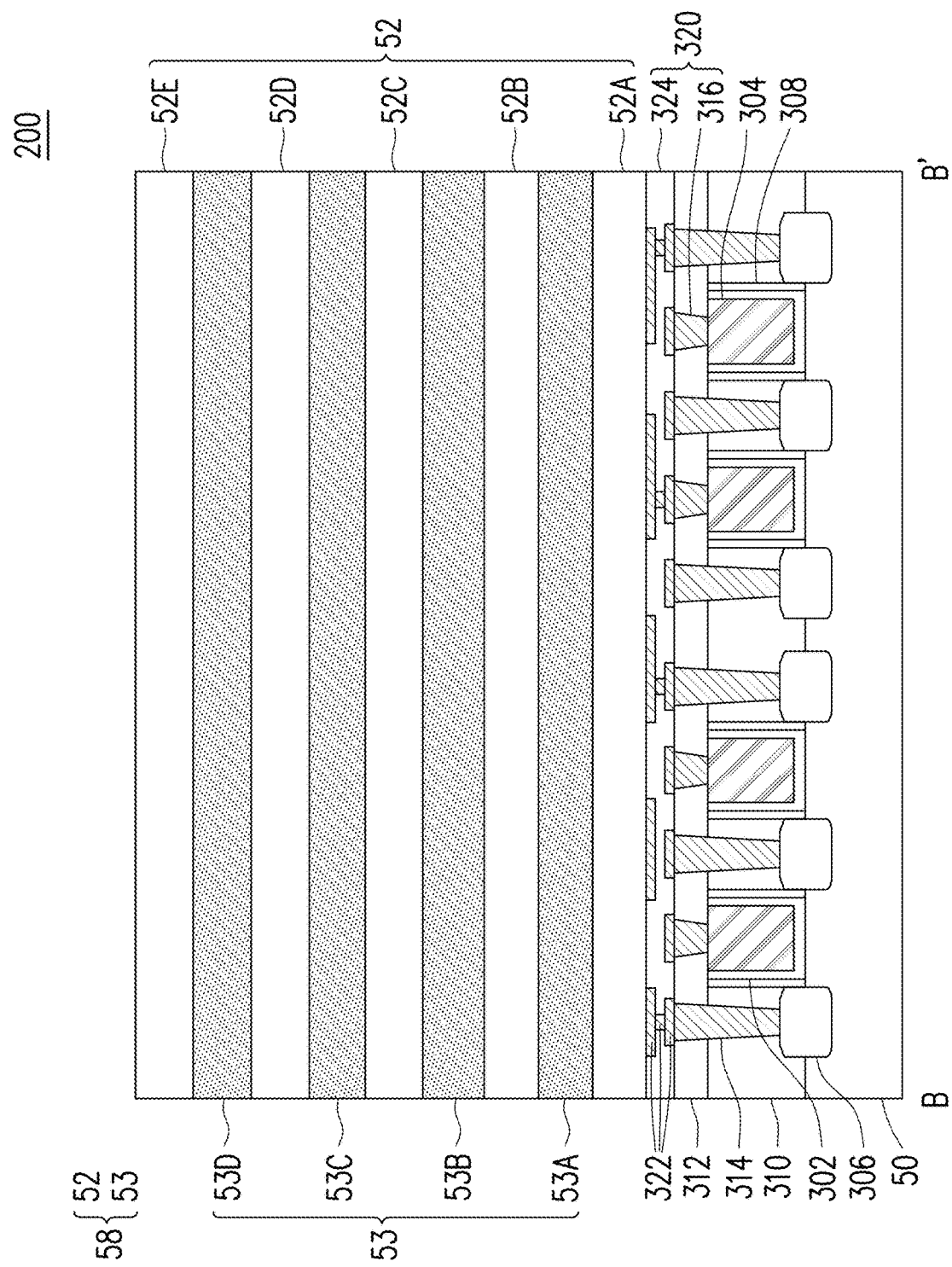

In FIG. 3, a multi-layer stack 58 is formed over the structure of FIG. 2. The substrate 50, the transistors, the ILDs 310 and 312, and the interconnect structure 320 may be omitted from subsequent drawings for the purposes of simplicity and clarity. Although the multi-layer stack 58 is illustrated as contacting the dielectric layers 324 of the interconnect structure 320, any number of intermediate layers may be disposed between the substrate 50 and the multi-layer stack 58. For example, one or more interconnect layers including conductive features in insulting layers (e.g., low-k dielectric layers) may be disposed between the substrate 50 and the multi-layer stack 58. In some embodiments, the conductive features may be patterned to provide power, ground, and/or signal lines for the active devices on the substrate 50 and/or the memory array 200 (see FIGS. 1A and 1B). In some embodiments, one or more interconnect layers including conductive features in insulting layers (e.g., low-k dielectric layers) may be disposed over the multi-layer stack 58.

In FIG. 3, the multi-layer stack 58 includes alternating layers of sacrificial layers 53A-53D (collectively referred to as sacrificial layers 53) and dielectric layers 52A-52E (collectively referred to as dielectric layers 52). The sacrificial layers 53 may be patterned and replaced in subsequent steps to define conductive lines 72 (e.g., the word lines). The sacrificial layers 53 may include dielectric materials, such as silicon oxide, silicon nitride, silicon oxynitride, combinations thereof, or the like. The dielectric layers 52 may include insulating materials, such as aluminum oxide, silicon oxide, silicon nitride, silicon oxynitride, combinations thereof, or the like. The sacrificial layers 53 and the dielectric layers 52 include different materials with different etching selectivities. In some embodiments, the sacrificial layers 53 include silicon nitride, and the dielectric layers 52 include aluminum oxide or silicon oxide. Each of the sacrificial layers 53 and the dielectric layers 52 may be formed using, for example, chemical vapor deposition (CVD), atomic layer deposition (ALD), physical vapor deposition (PVD), plasma enhanced CVD (PECVD), or the like.

Although FIG. 3 illustrates a particular number of the sacrificial layers 53 and the dielectric layers 52, other embodiments may include different numbers of the sacrificial layers 53 and the dielectric layers 52. Besides, although the multi-layer stack 58 is illustrated as having dielectric layers as topmost and bottommost layers, the disclosure is not limited thereto. In some embodiments, at least one of the topmost and bottommost layers of the multi-layer stack 58 is a sacrificial layer.

FIGS. 4 through 12 are views of intermediate stages in the manufacturing a staircase structure of the memory array 200, in accordance with some embodiments. FIGS. 4 through 12 are illustrated along reference cross-section B-B' illustrated in FIG. 1A.

Figure 4:
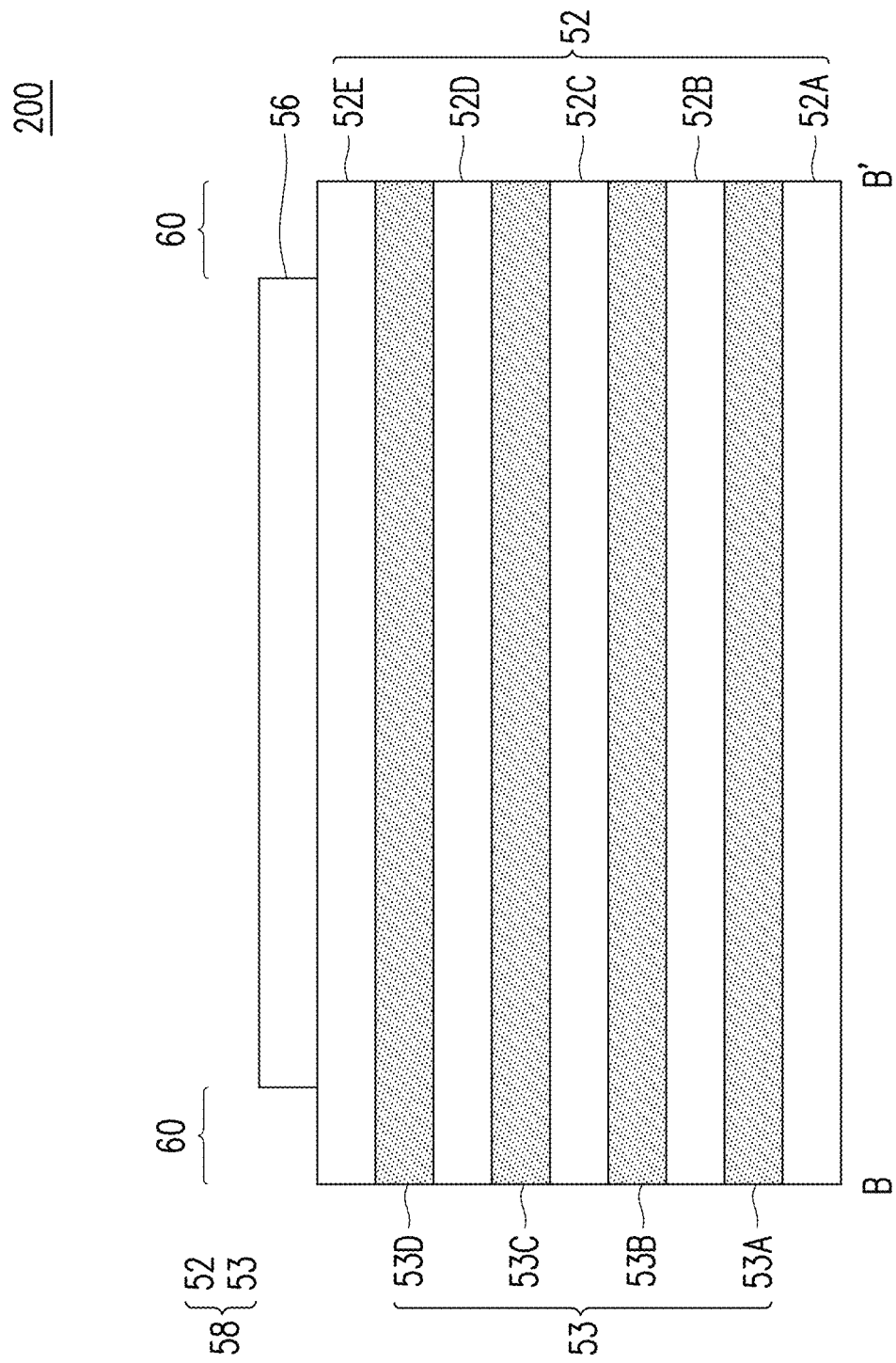

In FIG. 4, a photoresist 56 is formed over the multi-layer stack 58. In some embodiments, the photoresist 56 is formed by a spin-on technique and patterned by an acceptable photolithography technique. Patterning the photoresist 56 may expose the multi-layer stack 58 in regions 60, while masking remaining portions of the multi-layer stack 58. For example, a topmost layer of the multi-layer stack 58 (e.g., the dielectric layer 52E) may be exposed in the regions 60.

Figure 5:
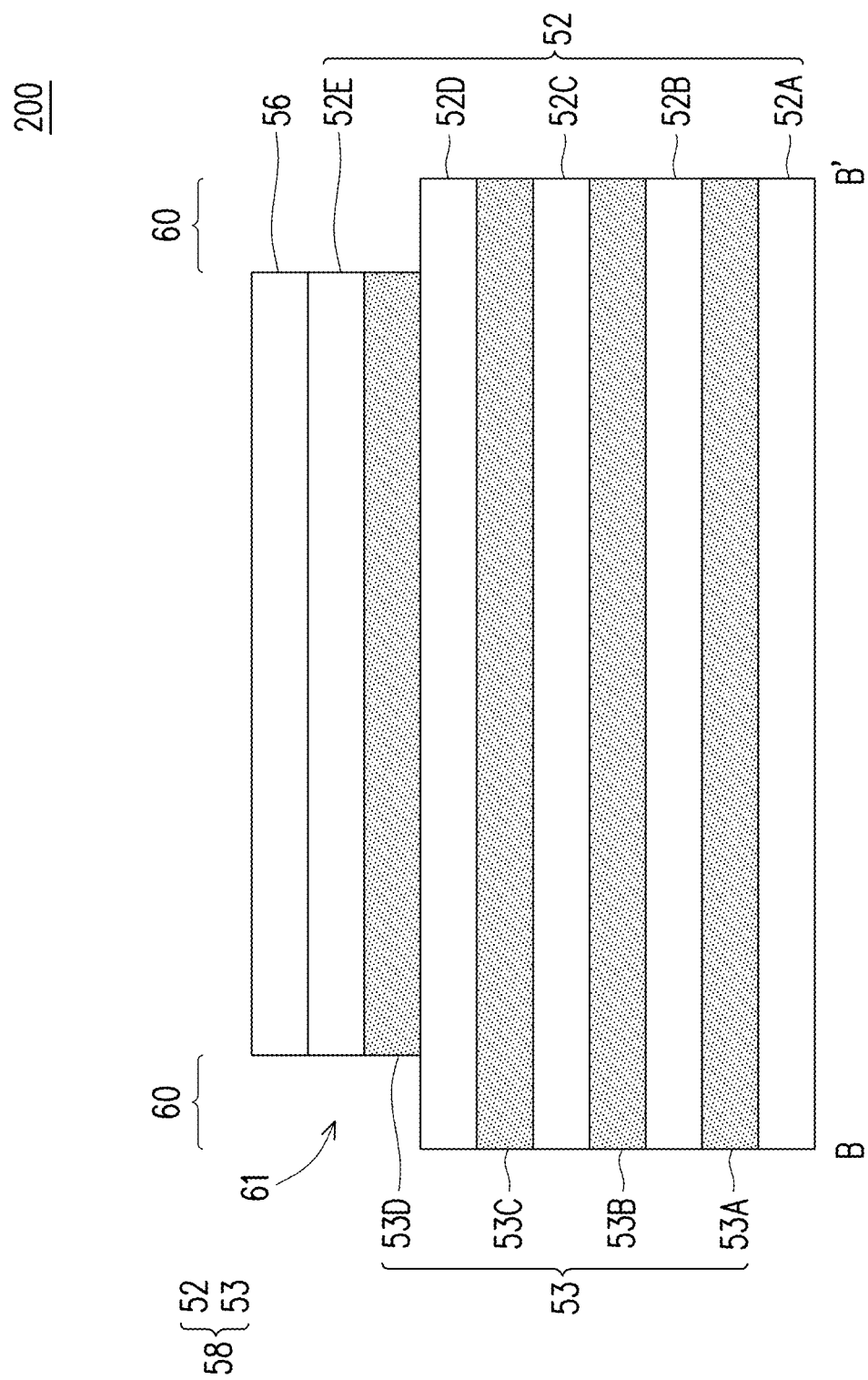

In FIG. 5, the exposed portions of the multi-layer stack 58 in the regions 60 are etched using the photoresist 56 as a mask. The etching may be any acceptable etching process, such as a dry etch (e.g., a reactive ion etch (RIE), a neutral beam etch (NBE), or the like), a wet etch, the like, or a combination thereof. The etching may be anisotropic. The etching may remove portions of the dielectric layer 52E and the sacrificial layer 53D in the regions 60 and define openings 61. Because the dielectric layer 52E and the sacrificial layer 53D have different material compositions, etchants used to remove exposed portions of these layers may be different. In some embodiments, the sacrificial layer 53D acts as an etch stop layer while etching the dielectric layer 52E, and the dielectric layer 52D acts as an etch stop layer while etching sacrificial layer 53D. As a result, the portions of the dielectric layer 52E and the sacrificial layer 53D may be selectively removed without removing remaining layers of the multi-layer stack 58, and the openings 61 may be extended to a desired depth. Alternatively, a time-mode etching process may be used to stop the etching of the openings 61 after the openings 61 reach a desired depth. In the resulting structure, the dielectric layer 52D is exposed in the regions 60.

Figure 6:
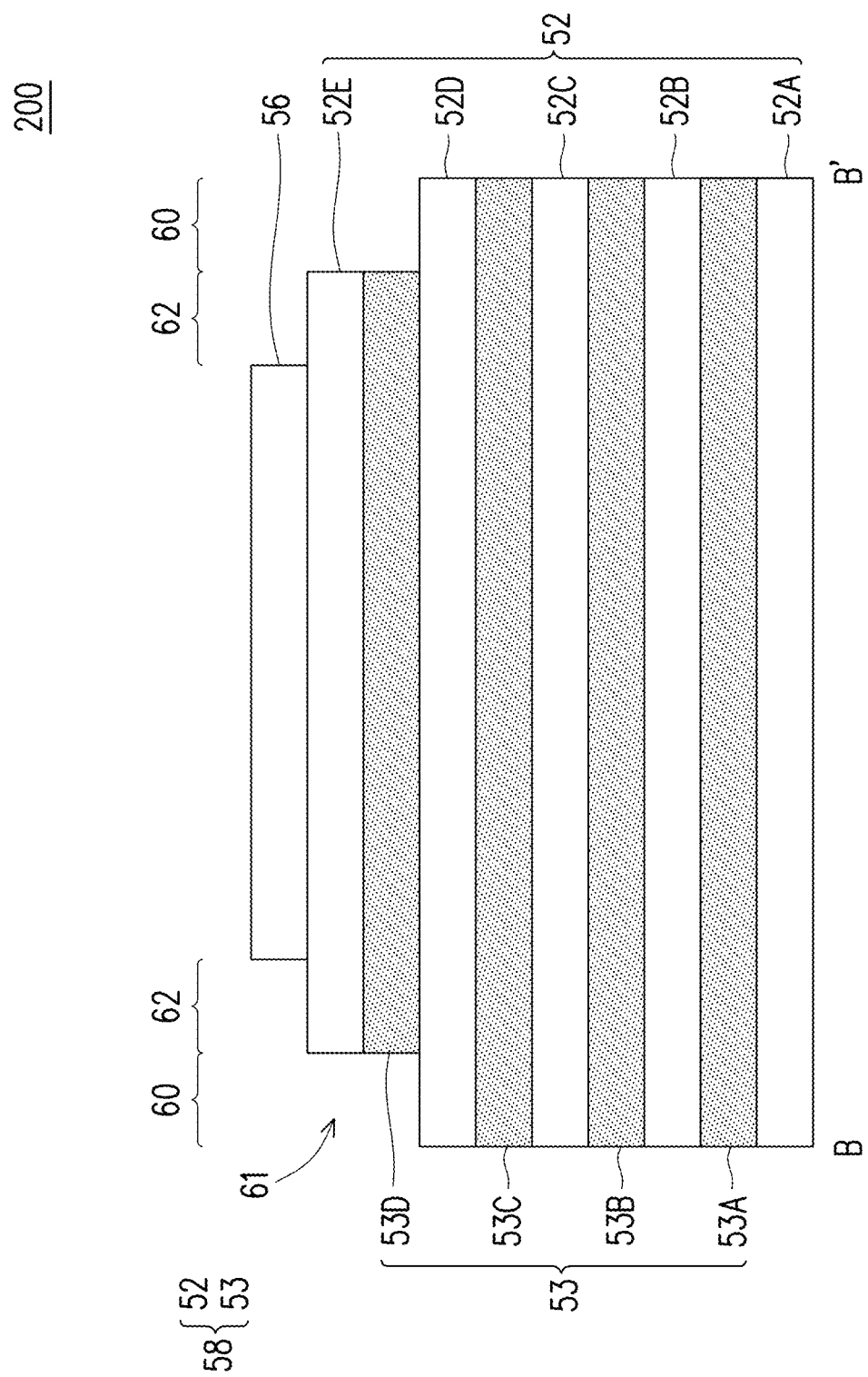

In FIG. 6, the photoresist 56 is trimmed to expose additional portions of the multi-layer stack 58. In some embodiments, the photoresist 56 is trimmed by using an acceptable removing technique such as a lateral etching. As a result of the trimming, a width of the photoresist 56 is reduced and portions the multi-layer stack 58 in the regions 60 and regions 62 may be exposed. For example, top surfaces of the dielectric layer 52D may be exposed in the regions 60, and top surfaces of the dielectric layer 52E may be exposed in the regions 62.

Figure 7:
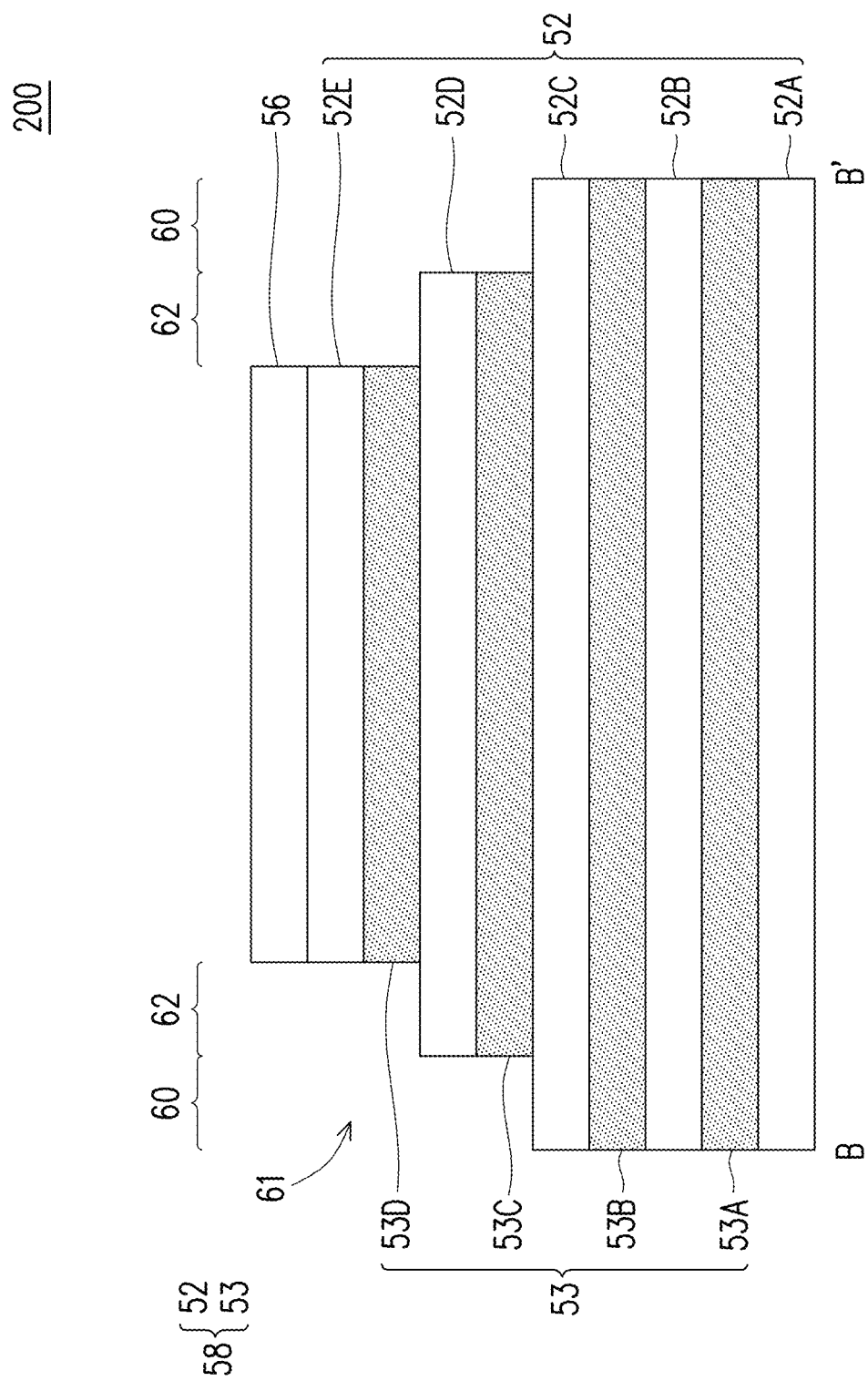

In FIG. 7, portions of the dielectric layer 52E, the sacrificial layer 53D, the dielectric layer 52D, and the sacrificial layer 53C in the regions 60 and the regions 62 are removed by acceptable etching processes using the photoresist 56 as a mask. The etching may be any acceptable etching process, such as a dry etch (e.g., RIE, NBE, or the like), a wet etch, the like, or a combination thereof. The etching may be anisotropic. The etching may extend the openings 61 further into the multi-layer stack 58. Because the sacrificial layers 53D and 53C and the dielectric layers 52E and 52D have different material compositions, etchants used to remove exposed portions of these layers may be different. In some embodiments, portions of the dielectric layers 52E and 52D in the regions 62 and 60 are removed by using the photoresist 56 as a mask and using the underlying sacrificial layers 53D and 53C as etch stop layers. Thereafter, the exposed portions of the sacrificial layers 53D and 53C in the regions 62 and 60 are removed by using the photoresist 56 as a mask and using the underlying dielectric layers 52D and 52C as etching stop layers. In the resulting structure, the dielectric layer 52C is exposed in the regions 60, and the dielectric layer 52D is exposed in the regions 62.

Figure 8:
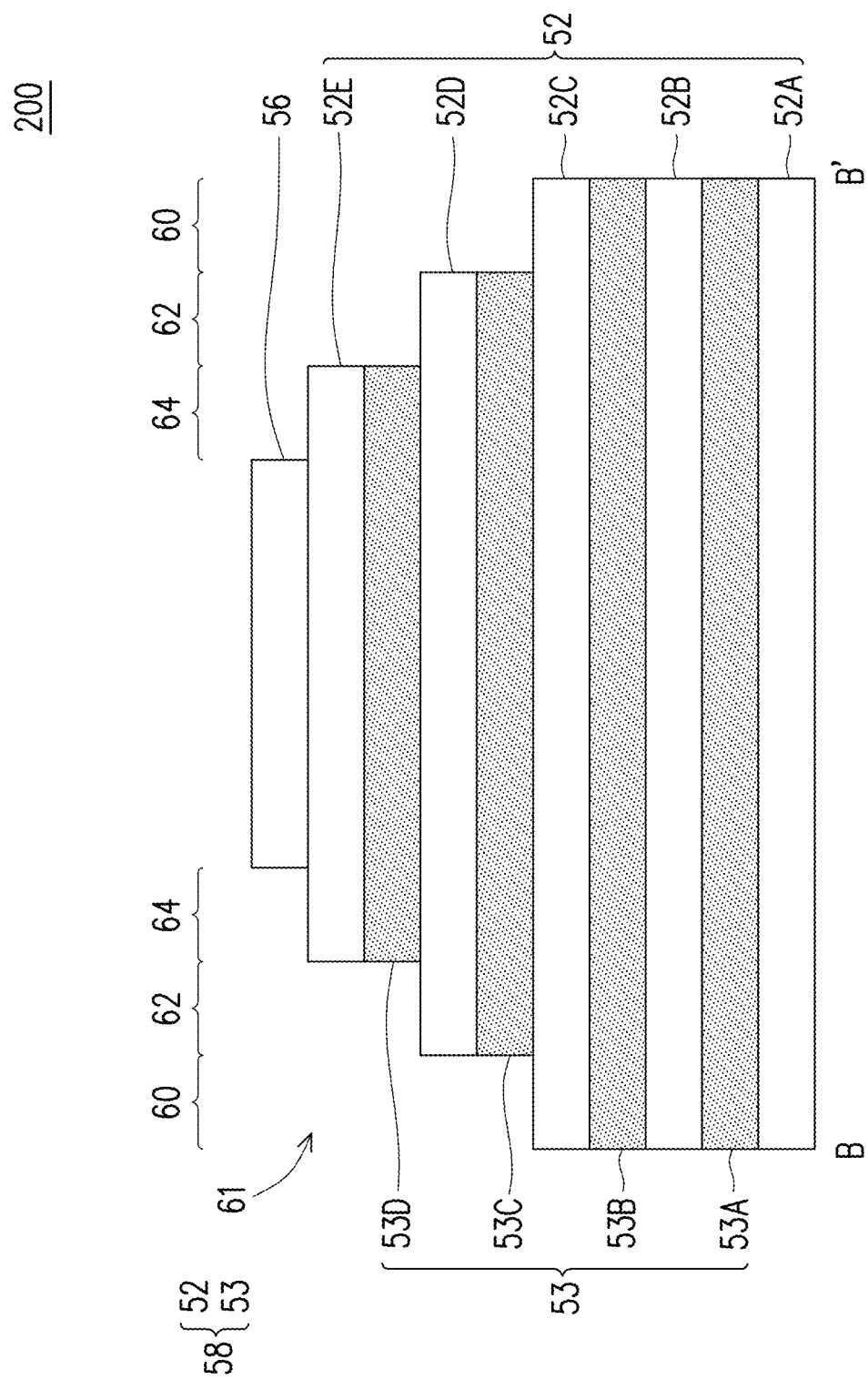

In FIG. 8, the photoresist 56 is trimmed to expose additional portions of the multi-layer stack 58. In some embodiments, the photoresist 56 is trimmed by using an acceptable removing technique such as a lateral etching. As a result of the trimming, a width of the photoresist 56 is reduced, and portions the multi-layer stack 58 in the regions 60, the regions 62, and regions 64 may be exposed. For example, top surfaces of the dielectric layer 52C may be exposed in the regions 60; top surfaces of the dielectric layer 52D may be exposed in the regions 62; and top surfaces of the dielectric layer 52E may be exposed in the regions 64.

Figure 9:
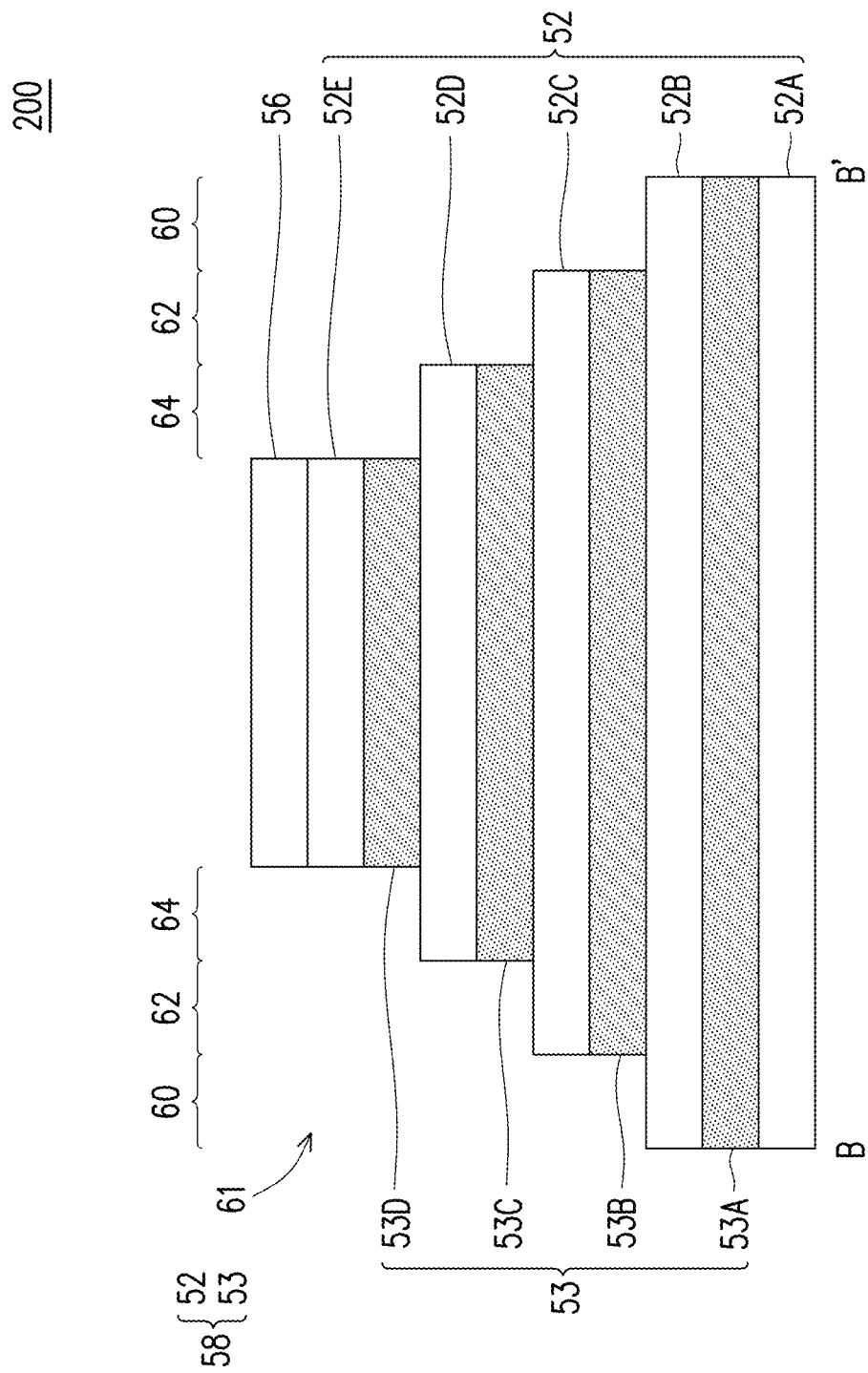

In FIG. 9, portions of the dielectric layers 52E, 52D, and 52C and the sacrificial layers 53D, 53C, and 53B in the regions 60, the regions 62, and the regions 64 are removed by acceptable etching processes using the photoresist 56 as a mask. The etching may be any acceptable etching process, such as a dry etch (e.g., RIE, NBE, or the like), a wet etch, the like, or a combination thereof. The etching may be anisotropic. The etching may extend the openings 61 further into the multi-layer stack 58. Because the dielectric layers 52C-52E and the sacrificial layers 53B-53D have different material compositions, etchants used to remove exposed portions of these layers may be different. In some embodiments, portions of the dielectric layers 52E, 52D and 52C in the regions 64, 62 and 60 are removed by using the photoresist 56 as a mask and using the underlying sacrificial layers 53D, 53C and 53B as etch stop layers. Thereafter, the exposed portions of the sacrificial layers 53D, 53C and 53B in the regions 64, 62 and 60 are removed by using the photoresist 56 as a mask and using the underlying dielectric layers 52D, 52C and 52B as etching stop layers. In the resulting structure, the dielectric layer 52B is exposed in the regions 60; the dielectric layer 52C is exposed in the regions 62; and the dielectric layer 52D is exposed in the regions 64.

Figure 10:
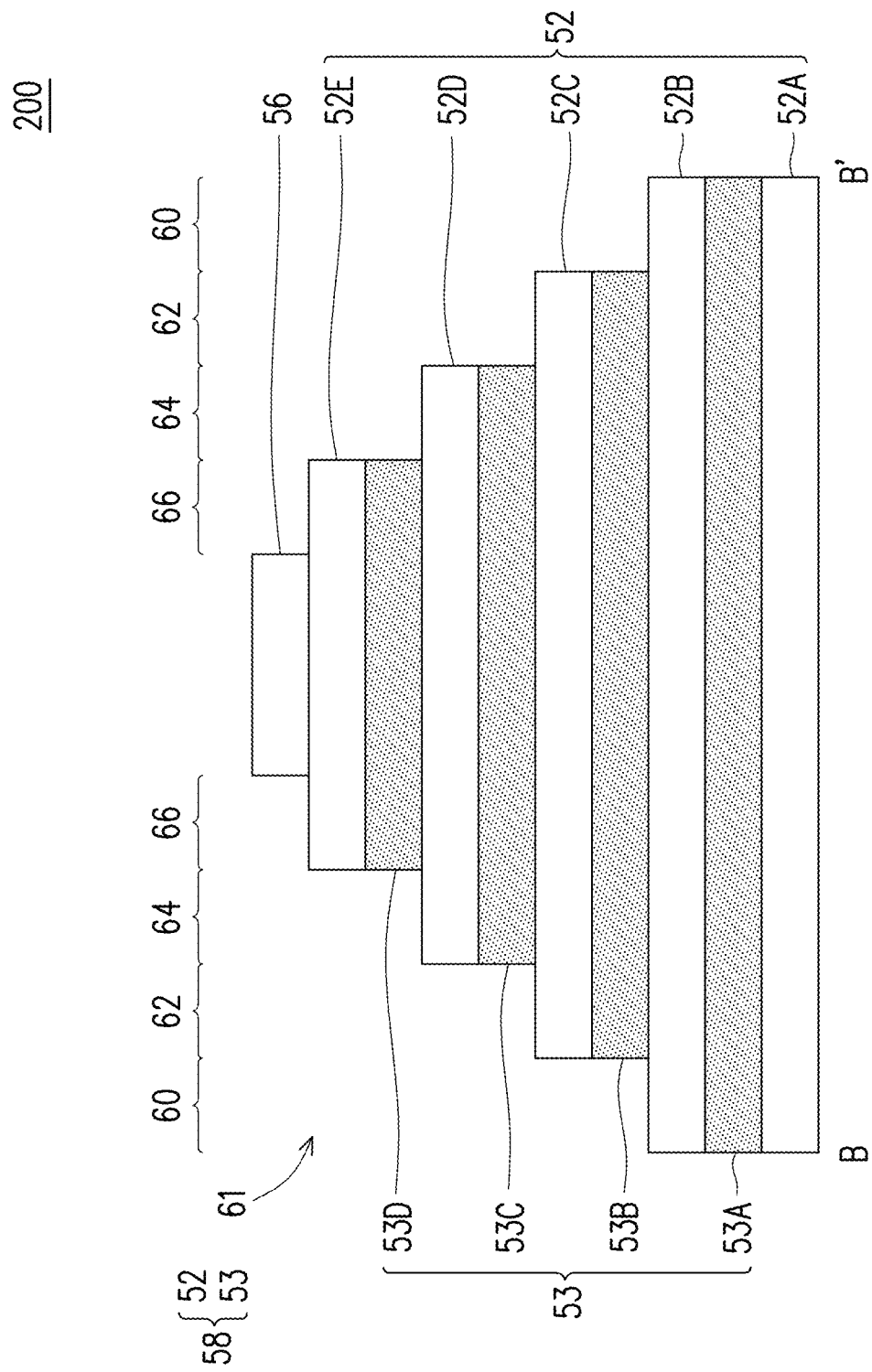

In FIG. 10, the photoresist 56 is trimmed to expose additional portions of the multi-layer stack 58. In some embodiments, the photoresist 56 is trimmed by using an acceptable removing technique such as a lateral etching. As a result of the trimming, a width of the photoresist 56 is reduced, and portions the multi-layer stack 58 in the regions 60, the regions 62, the regions 64, and regions 66 may be exposed. For example, top surfaces of the dielectric layer 52B may be exposed in the regions 60; top surfaces of the dielectric layer 52C may be exposed in the regions 62; and top surfaces of the dielectric layer 52D may be exposed in the regions 64; and top surfaces of the dielectric layer 52E may be exposed in the regions 66.

Figure 11:
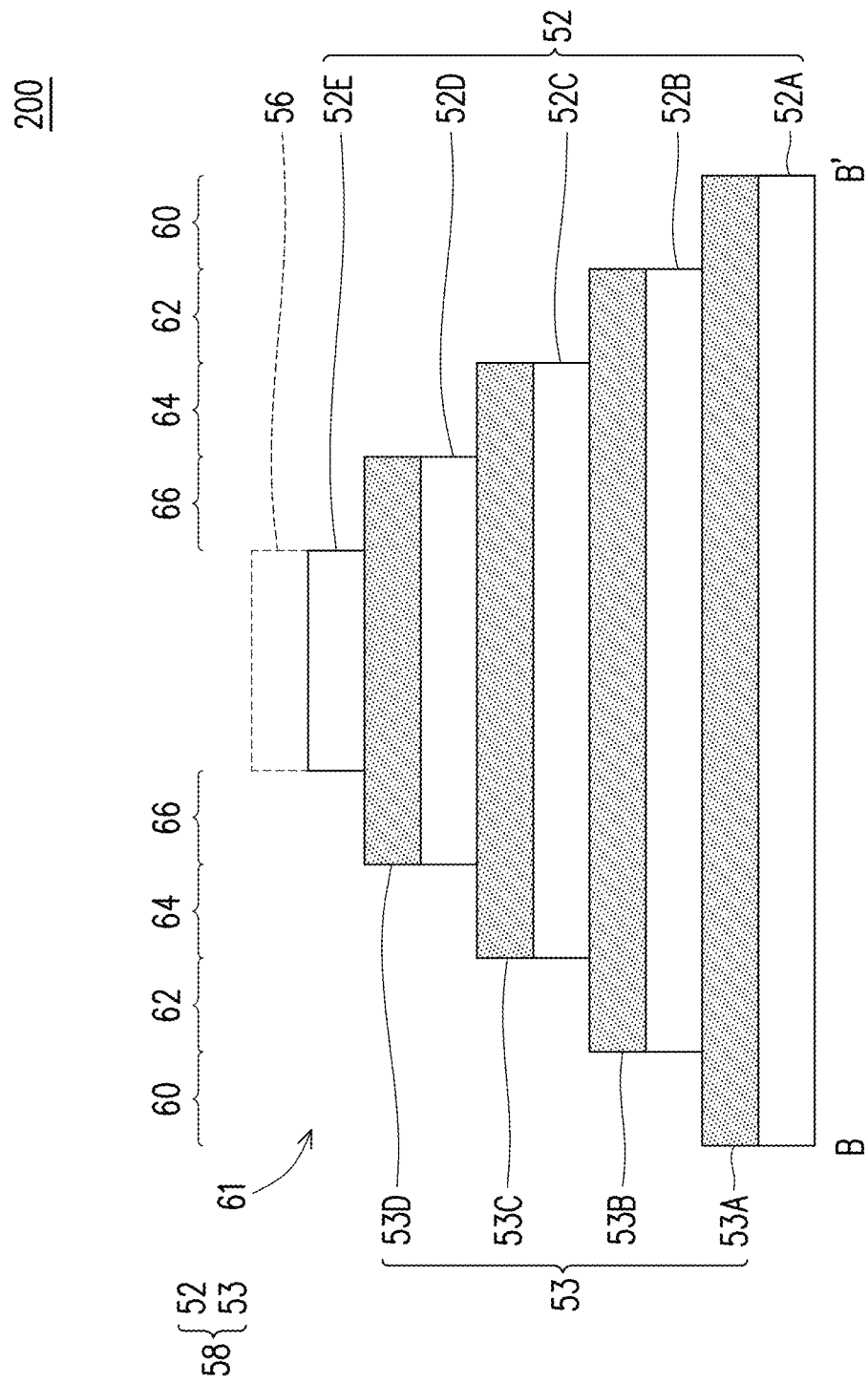

In FIG. 11, portions of the dielectric layers 52E, 52D, 52C, and 52B in the regions 60, the regions 62, the regions 64, and the regions 66 are removed by acceptable etching processes using the photoresist 56 as a mask. The etching may be any acceptable etching process, such as a dry etch (e.g., RIE, NBE, or the like), a wet etch, the like, or a combination thereof. The etching may be anisotropic. The etching may extend the openings 61 further into the multi-layer stack 58. In some embodiments, portions of the dielectric layers 52E, 52D, 52C and 52B in the regions 66, 64, 62 and 60 are removed by using the photoresist 56 as a mask and using the underlying sacrificial layers 53D, 53C, 53B and 53A as etch stop layers. In the resulting structure, the sacrificial layer 53A is exposed in the regions 60; the sacrificial layer 53B is exposed in the regions 62; the sacrificial layer 53C is exposed in the regions 64; and the sacrificial layer 53D is exposed in the regions 66. Thereafter, the photoresist 56 may be removed by an acceptable ashing or wet strip process.

Figure 12:
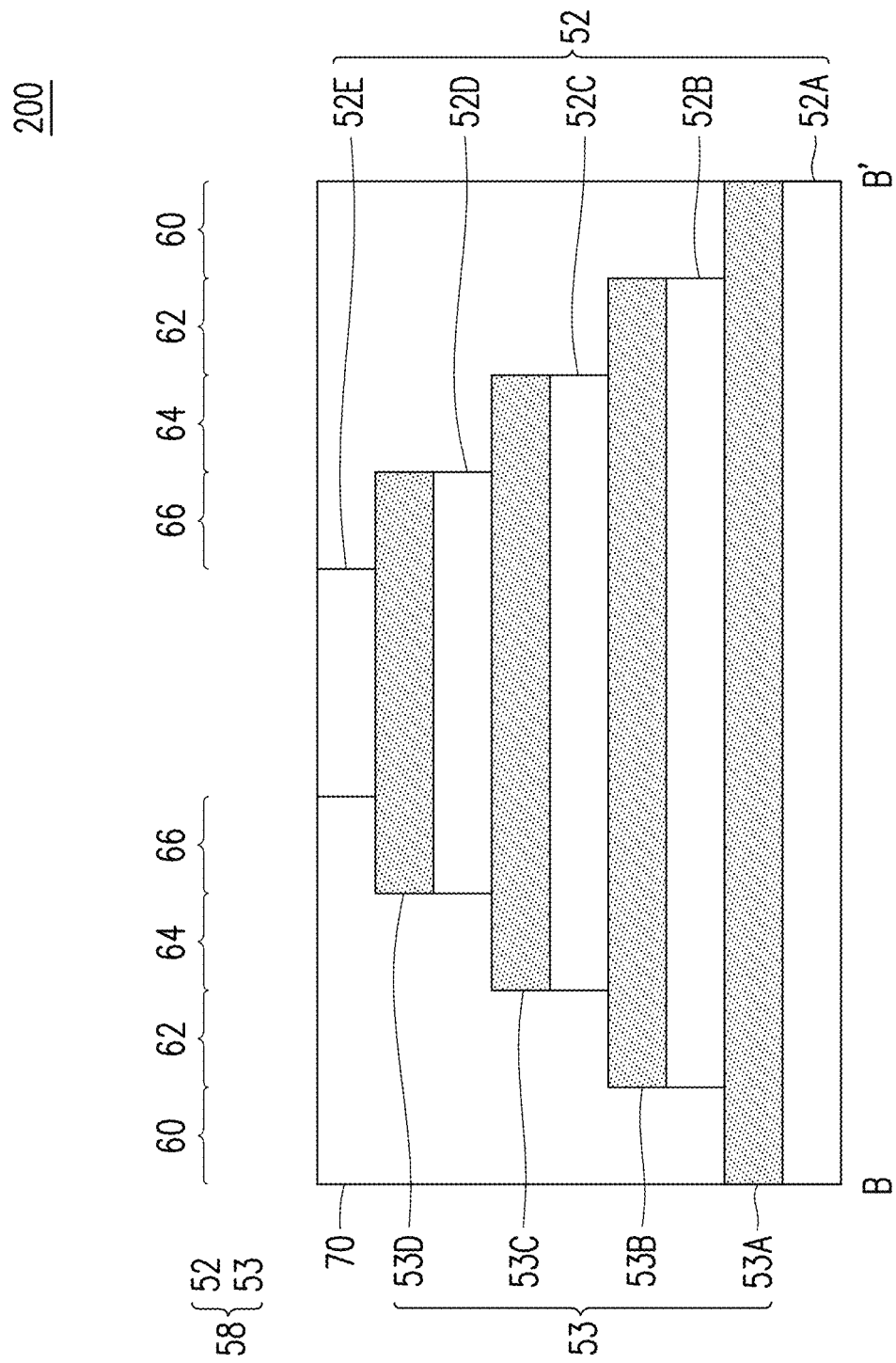

In FIG. 12, an inter-metal dielectric (IMD) 70 is formed over the multi-layer stack 58. The IMD 70 may be formed of a dielectric material, and may be deposited by any suitable method, such as CVD, PECVD, flowable CVD (FCVD), or the like. The dielectric materials may include phospho-silicate glass (PSG), boro-silicate glass (BSG), boron-doped phospho-silicate glass (BPSG), undoped silicate glass (USG), or the like. In some embodiments, the IMD 70 may include an oxide (e.g., silicon oxide or the like), a nitride (e.g., silicon nitride or the like), a combination thereof or the like. Other dielectric materials formed by any acceptable process may be used. Thereafter, a removal process is performed to remove excess dielectric material over the multi-layer stack 58. In some embodiments, the removal process may be a planarization process, such as a chemical mechanical polish (CMP), an etch-back process, combinations thereof, or the like. The planarization process exposes the multi-layer stack 58 such that top surfaces of the multi-layer stack 58 and IMD 70 are level after the planarization process is completed. The IMD 70 extends along sidewalls of the sacrificial layers 53B-53D and sidewalls of the dielectric layers 52B-52E. Further, the IMD 70 may contact top surfaces of the sacrificial layers 53A-53D and the dielectric layer 52E.

As shown in FIG. 12, an intermediate and bulk staircase structure is thus formed. The intermediate staircase structure includes alternating layers of sacrificial layers 53 and dielectric layers 52. The sacrificial layers 53 are subsequently replaced with conductive lines 72, which will be described in details in FIGS. 16A and 16B. Lower conductive lines 72 are longer and extend laterally past upper conductive lines 72, and a width of each of the conductive lines 72 increases in a direction towards the substrate 50 (see FIGS. 1A and 30E).

FIGS. 13 through 16B are views of intermediate stages in the manufacturing of a memory region of the memory array 200, in accordance with some embodiments. In FIGS. 13 through 16B, the bulk multi-layer stack 58 is patterned to form trenches 86 therethrough, and the sacrificial layers 53 are replaced with conductive materials to define the conductive lines 72. The conductive lines 72 may correspond to word lines in the memory array 200, and the conductive lines 72 may further provide gate electrodes for the resulting memory cells of the memory array 200. FIGS. 13, 14, 15B and 16B are illustrated along reference cross-section C-C' illustrated in FIG. 1A. FIGS. 15A and 16A are illustrated in a partial three-dimensional view.

Figure 13:
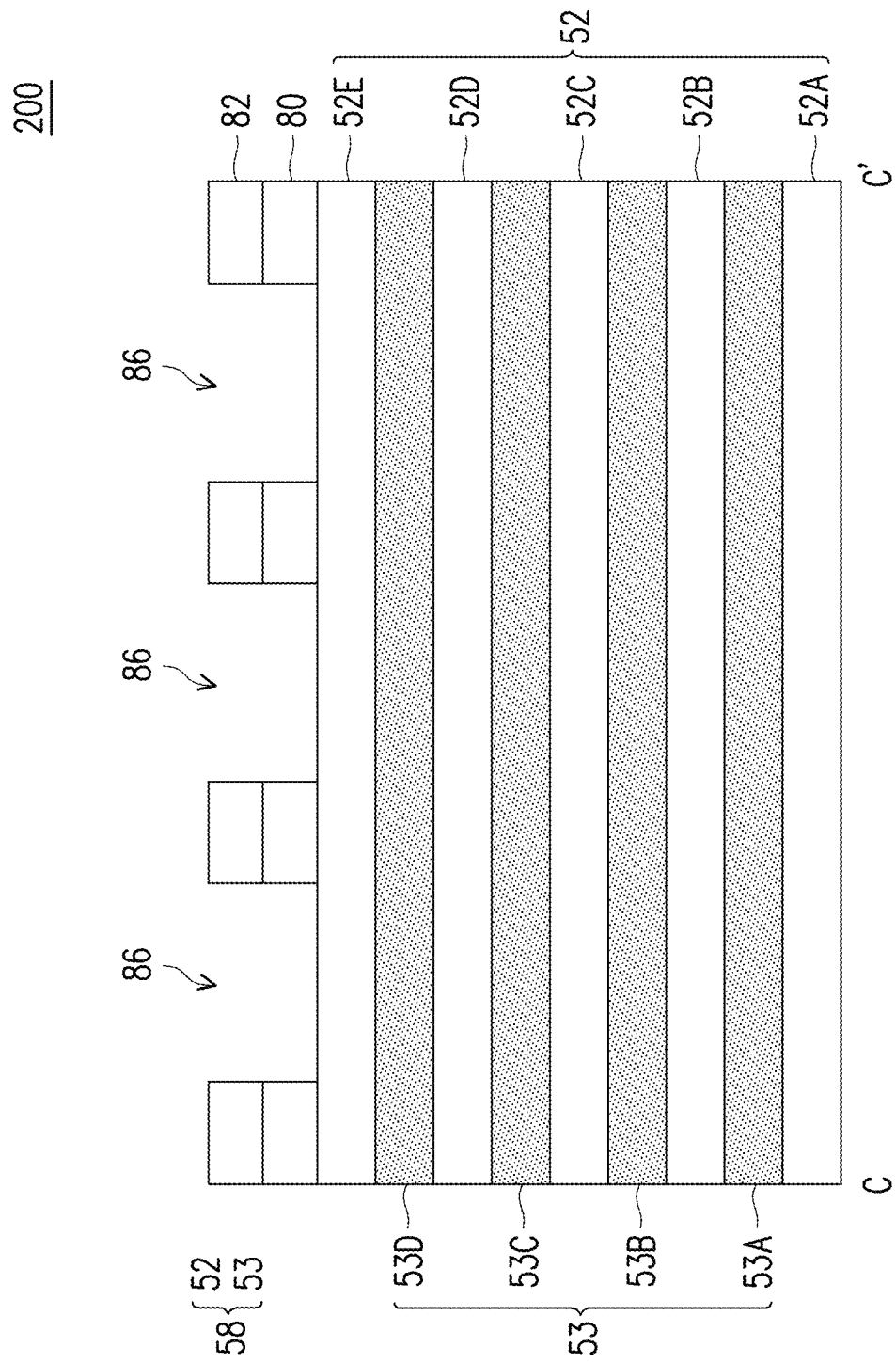

In FIG. 13, photoresist patterns 82 and underlying hard mask patterns 80 are formed over the multi-layer stack 58. In some embodiments, a hard mask layer and a photoresist layer are sequentially formed over the multi-layer stack 58. The hard mask layer may include, for example, silicon nitride, silicon oxynitride, or the like, which may be deposited by CVD, PVD, ALD, PECVD, or the like. The photoresist layer is formed by a spin-on technique, for example.

Thereafter, the photoresist layer is patterned to form photoresist patterns 82 and trenches 86 between the photoresist patterns 82. The photoresist is patterned by an acceptable photolithography technique, for example. The patterns of the photoresist patterns 82 are then transferred to the hard mask layer to form hard mask patterns 80 by using an acceptable etching process, such as by a dry etch (e.g., RIE, NBE, or the like), a wet etch, the like, or a combination thereof. The etching may be anisotropic. Thus, trenches 86 are formed extending through the hard mask layer. Thereafter, the photoresist patterns 82 may be optionally removed by an ashing process, for example.

Figure 15A:
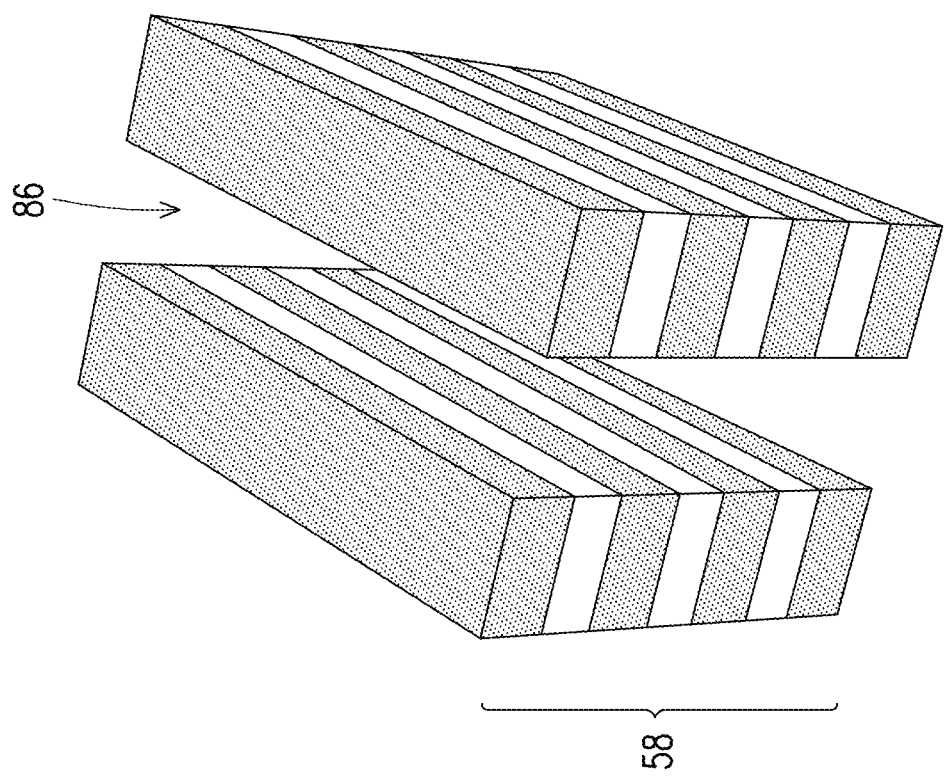
Figure 15B:
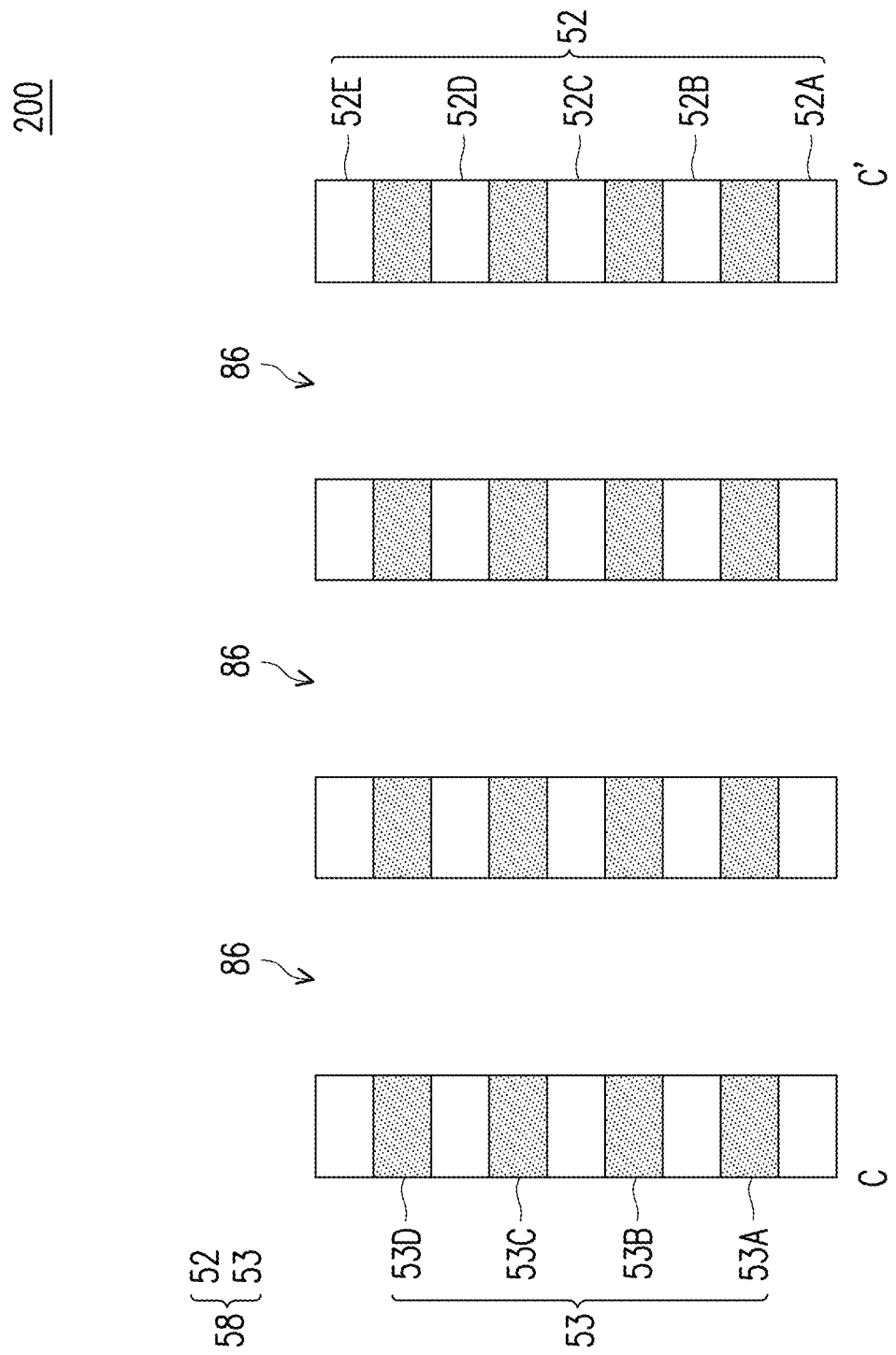

In FIGS. 14, 15A and 15B, the patterns of the hard mask patterns 80 are transferred to the multi-layer stack 58 using one or more acceptable etching processes, such as by a dry etch (e.g., RIE, NBE, or the like), a wet etch, the like, or a combination thereof. The etching processes may be anisotropic. Thus, the trenches 86 extend through the bulk multi-layer stack 58, and strip-shaped sacrificial layers 53 and strip-shaped dielectric layers 52 are accordingly defined. In some embodiments, the trenches 86 extend through the bulk staircase structure, and strip-shaped staircase structures are accordingly defined. The hard mask patterns 80 may be then removed by an acceptable process, such as a wet etching process, a dry etching process, a planarization process, combinations thereof, or the like.

In FIGS. 15A, 15B, 16A and 16B, the sacrificial layers 53A-53D (collectively referred to as sacrificial layers 53) are replaced with conductive lines 72A-72D (collectively referred to as conductive lines 72). In some embodiments, the sacrificial layers 53 are removed by an acceptable process, such as a wet etching process, a dry etching process or both. Thereafter, conductive lines 72 are filled into the space between two adjacent dielectric layers 52. As shown in the local enlarged view, each conductive line 72 includes two barrier layers 71 and 75 and a metal layer 73 between the barrier layers 71 and 75. Specifically, the barrier layer 71 or 75 is disposed between the metal layer 73 and the adjacent dielectric layer 52. The barrier layers 71 and 75 may prevent the metal layer from diffusion to the adjacent dielectric layers 52. The barrier layers 71 and 75 may also provide the function of increasing the adhesion between the metal layer 73 and the adjacent dielectric layers 52, and may be referred to as glue layers in some examples. In some embodiments, both barrier layers and glue layers with different materials are provided as needed. The barrier layers 71 and 75 are formed of a first conductive material, such as a metal nitride, such as titanium nitride, tantalum nitride, molybdenum nitride, zirconium nitride, hafnium nitride, or the like. The metal layer 73 may be formed of a second conductive material, such as a metal, such as tungsten, ruthenium, molybdenum, cobalt, aluminum, nickel, copper, silver, gold, alloys thereof, or the like. The barrier layers 71, 75, and metal layer 73 may each be formed by an acceptable deposition process such as CVD, PVD, ALD, PECVD, or the like. The first conductive material of the barrier layers 71, and 75, and the second conductive material of the metal layer 73 are further deposited on the sidewalls of the multi-layer stack 58 and fill in the trenches 86. Thereafter, the first conductive material of the barrier layers 71, and 75, and the second conductive material of the metal layer 73 in the trenches 86 are removed by an etching back process. An acceptable etch back process may be performed to remove excess materials from the sidewalls of the dielectric layers 52 and the bottom surfaces of the trenches 86. The acceptable etch back process includes a dry etch (e.g., RIE, NBE, the like), a wet etch, the like, or a combination thereof. The acceptable etch back process may be anisotropic.

In some embodiments, upon the replacement process, the sacrificial layers 53 of the strip-shaped staircase structures are subsequently replaced with conductive lines 72 (see FIG. 1A).

Figure 17A:
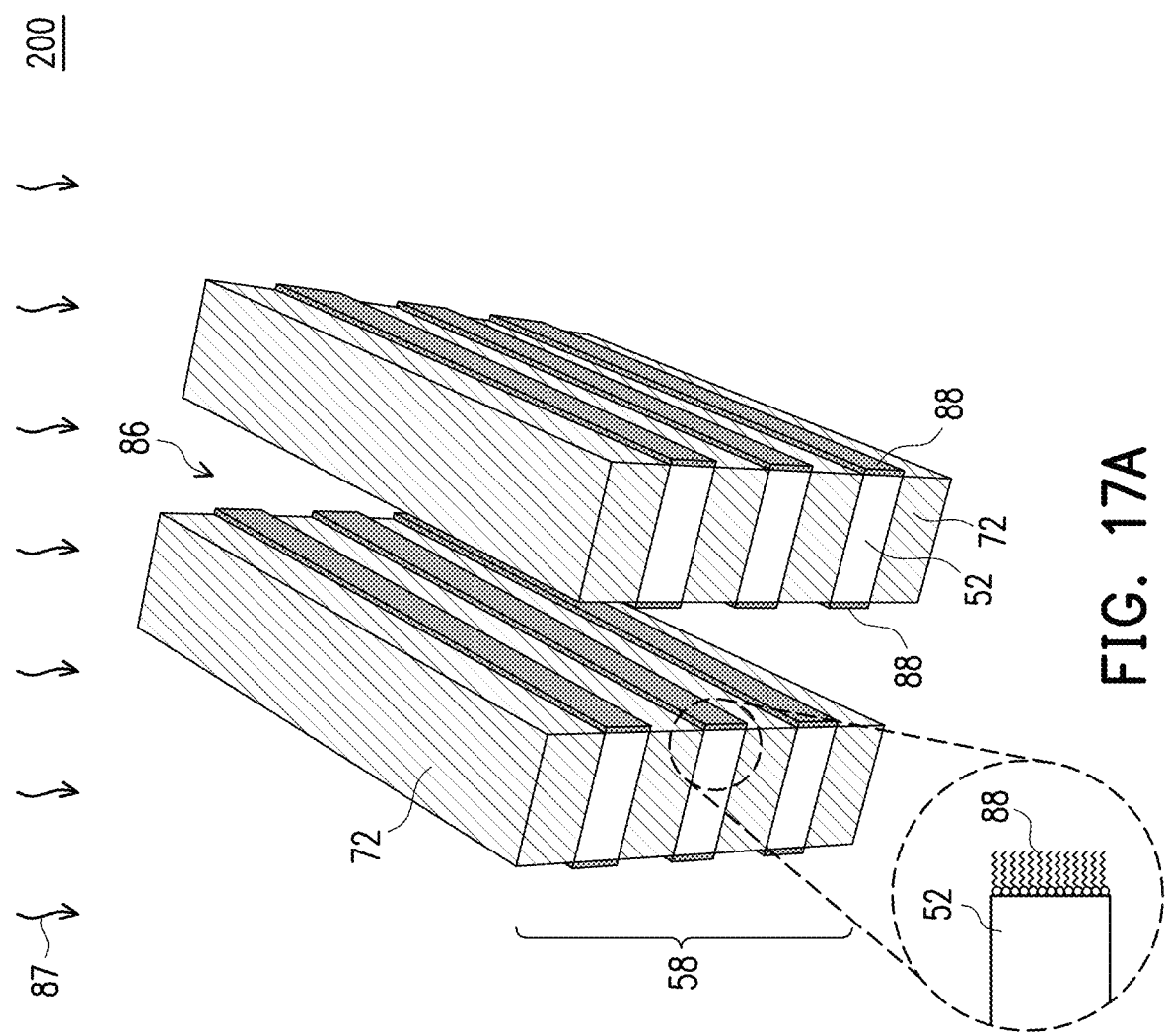

FIGS. 17A through 19B illustrate selectively forming ferroelectric portions 90 in the trenches 86. FIGS. 17A, 18A, and 19A are illustrated in a partial three-dimensional view.

Figure 17B:
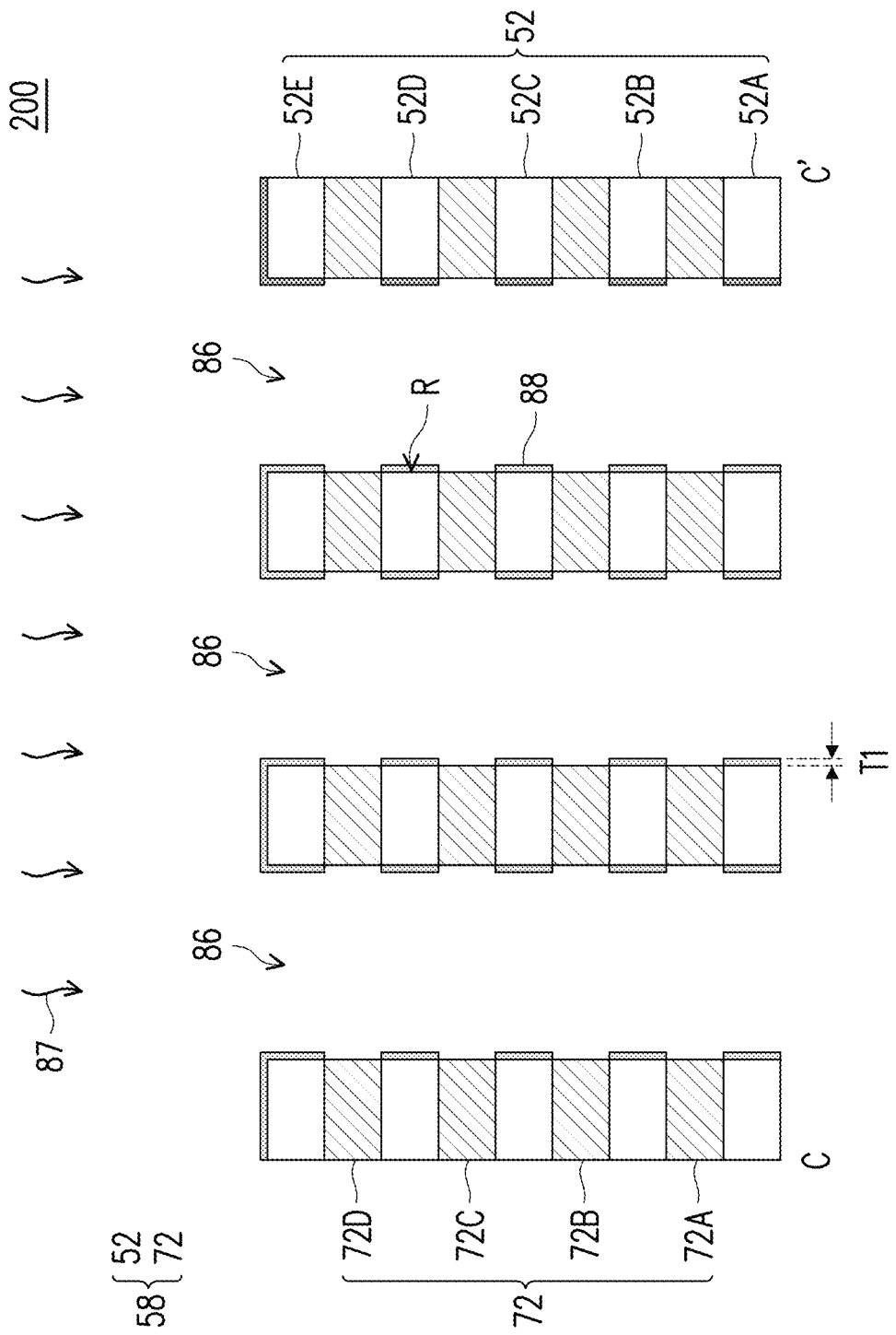
Figure 18A:
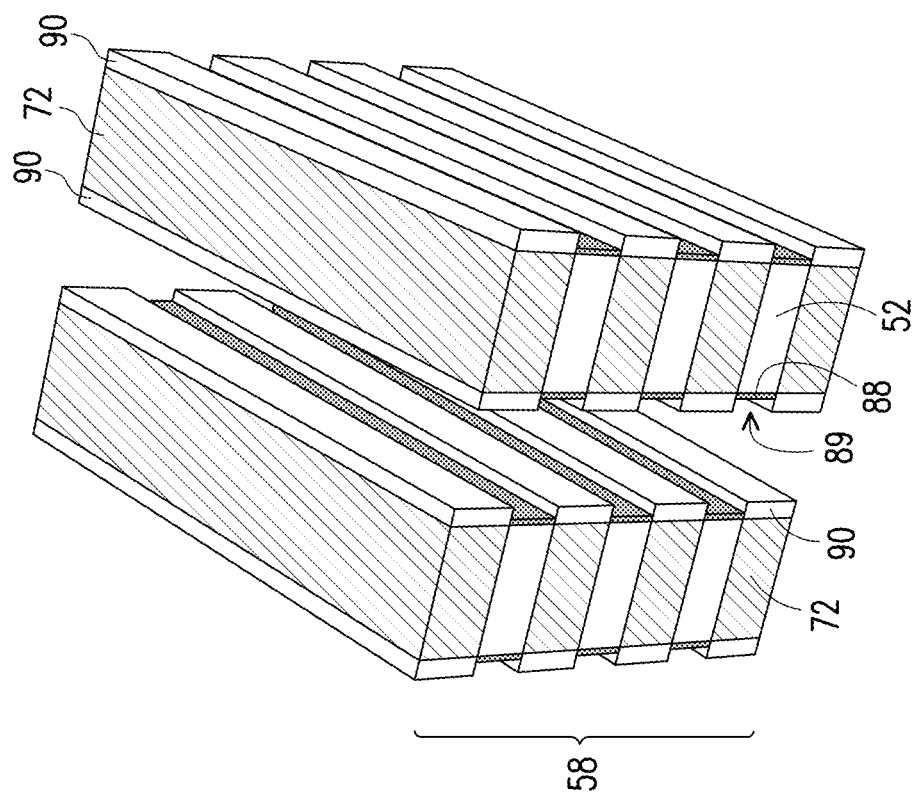
Figure 18B:
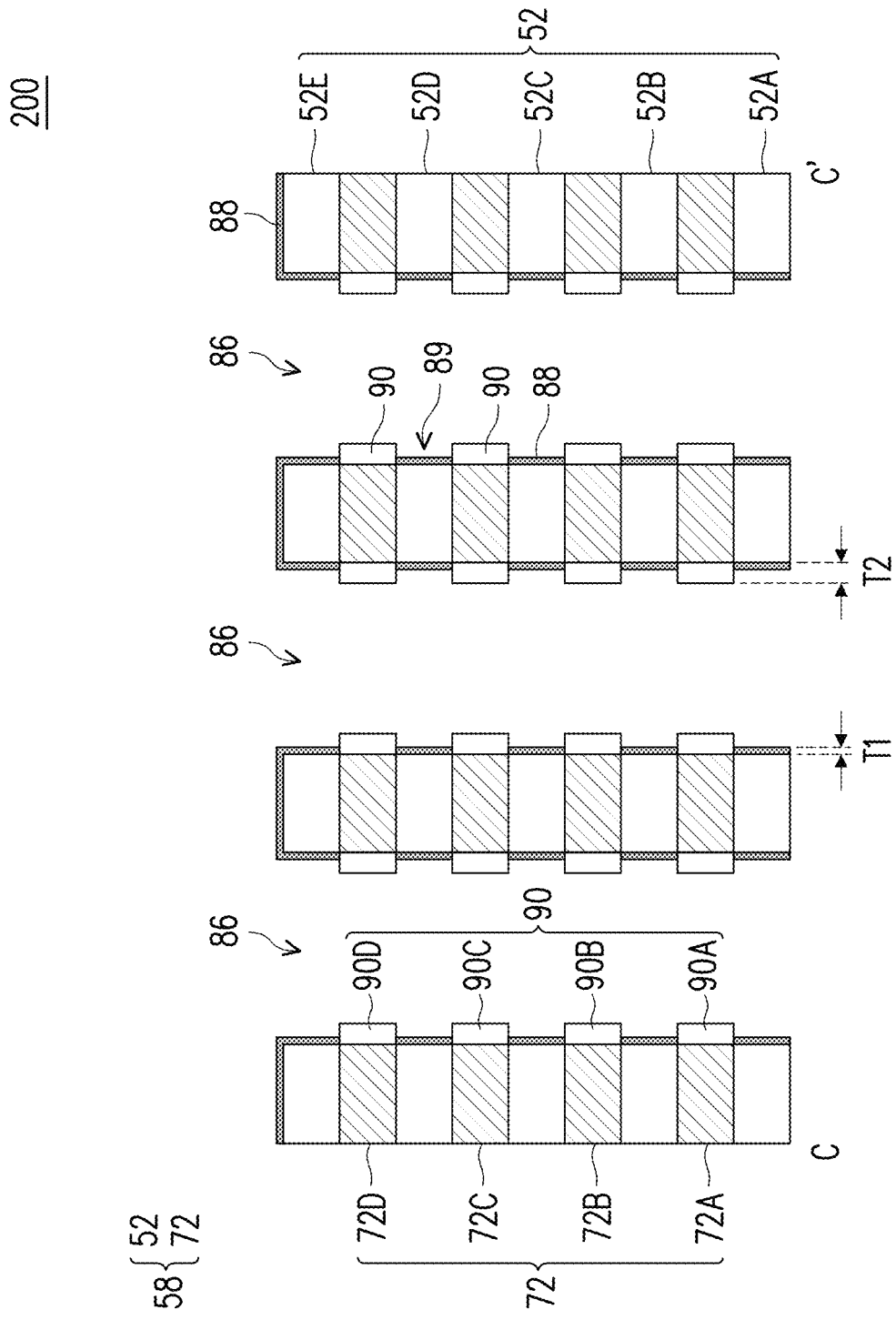
Figure 19A:
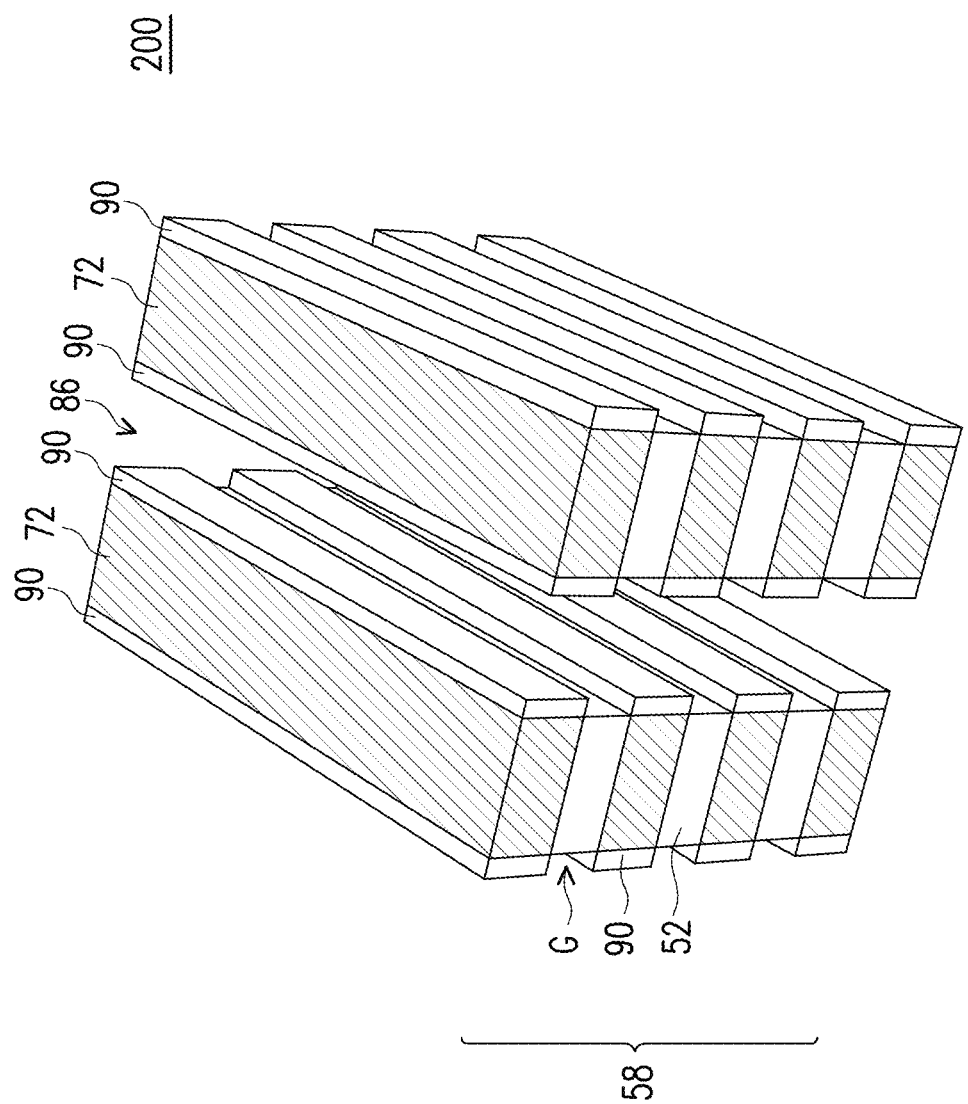

In FIGS. 17B, 18B, and 19B, cross-sectional views are provided along line C-C' of FIG. 1A.

In FIGS. 17A and 17B, a surface treatment 87 is performed on regions 89 between the conductive lines 72 to selectively modify top surfaces of the dielectric layers 52 to increase the difference in surface energy between the regions 89 and conductive lines 72. In some embodiments, the surface treatment 87 is performed to provide surfaces of the regions 89 having hydrophobicity or superhydrophobicity with high wettability and low surface energy. For example, the surface treatment 87 may be performed by a method described as follows.

Inhibitor portions 88 are selectively formed on the surfaces of the dielectric layers 52 within the regions 89. The inhibitor portions 88 may be referred to as blocking layers that block the surfaces of the dielectric layers 52 to prevent the subsequently formed ferroelectric portions 90 from being deposited on the surfaces of the dielectric layers 52 within the regions 89. In an embodiment in which the dielectric layers 52 are formed of oxide, the inhibitor portions 88 are formed of an organic material which may be reacted with or adsorbed on oxide surfaces of the dielectric layers 52. The organic material may a self-assembled monolayer (SAM) for surface modification of the dielectric layers 52, for example. The SAM may be a molecular assembly organized into ordered domains on the exposed oxide surfaces of the dielectric layers 52. Each molecule of the SAM may include a head group and a tail, where the head group anchors the molecule to the oxide surfaces of the dielectric layers 52 and the tail prevents the ferroelectric portions 90 from being deposited on the oxide surfaces of the dielectric layers 52.

In some embodiments, the inhibitor portions 88 are formed of a molecule containing a head group. The head group is a metallophilic head group that anchors to the oxide surfaces of the dielectric layers 52. In an embodiment, the metallophilic head group of the molecule comprises phosphorous atom (P), sulfur atom (S), or the like.

According to embodiments of the disclosure, the tail of the molecule that forms the inhibitor portions 88 is a metallophobic alkyl tail. The metallophobic alkyl tail has, for example, alkyl chain with a large molecular size or a long carbon chain to prevent the ferroelectric portions 90 from being deposed on surface thereof. In some embodiments, the tail of the molecule is formed of at least 12 backbone atoms, such as 12 carbons. In an embodiment, the tail of the molecule, is formed of approximately 18 backbone atoms. The large molecular structure of the SAM may prevent the ferroelectric portions 90 from be deposited on its surface.

For example, the inhibitor portions 88 may be formed of molecules selected from, but not limited to, an alkanethiol such as 1-octadecanethiol (ODT), or an alkanephophonic acid such as octadecylphophonic acid (ODPA). In an embodiment, the inhibitor portions 88 is formed of ODT or ODPA, which attaches to the dielectric layers 52 formed of oxide. The inhibitor portions 88 may have a thickness T1 of approximately 0.1 nm to 2 nm.

The inhibitor portions 88 may be deposited by a solution-phase process or vapor-phase epitaxy. For example, the inhibitor portions 88 may be deposited by a solution-phase process under a proper processing environment, such as a balance of acid concentration, solution temperature, and passivation time. In an embodiment, a balanced processing environment includes ODPA, or ODT with a concentration between 1 mM to 20 mM, a solution temperature between room temperature to 150° C., and/or a passivation time between 0.5 to 2 hours.

In FIGS. 18A and 18B, ferroelectric portions 90 are formed in the trenches 86 over the conductive lines 72. The ferroelectric portions 90 may comprise ferroelectric portions 90A, 90B, 90C, and 90D discretely disposed on sidewall surfaces of the conductive lines 72a, 72B, 72C, and 72D, respectively. In some embodiments, the ferroelectric portions 90 are not deposited onto the inhibitor portions 88 so that the regions 89 between the conductive lines 72 are free of the ferroelectric portions. In some additional embodiments, the ferroelectric portions are and not deposited on the IMD 70 at bottom of the trenches 86. It has been appreciated that the ferroelectric material of the ferroelectric portions 90 may form to different thicknesses, different crystalline structures, and/or different phases on different material (e.g., on the conductive lines 72 and the dielectric layers 52). Such differences in the ferroelectric material can lead to differences in operation of different memory devices. By utilizing the inhibitor portions 88 to prevent the ferroelectric material from forming on the dielectric layer 52, the discrete ferroelectric portions 90 can be formed to have a uniform (i.e., constant) thickness, crystalline structure, and/or phase through the ferroelectric portions, thereby improving memory performance.

The ferroelectric portions 90 may include a material that is capable of switching between two different polarization directions by applying an appropriate voltage differential across the ferroelectric portions 90. For example, the ferroelectric portions 90 include a high-k dielectric material, such as a hafnium (Hf) based dielectric materials or the like. In some embodiments, the ferroelectric portions 90 include hafnium oxide, hafnium zirconium oxide, silicon-doped hafnium oxide, or the like.

In some embodiments, the ferroelectric portions 90 may include barium titanium oxide ($BaTiO_3$), lead titanium oxide ($PbTiO_3$), lead zirconium oxide ($PbZrO_3$), lithium niobium oxide ($LiNbO_3$), sodium niobium oxide ($NaNbO_3$), potassium niobium oxide ($KNbO_3$), potassium tantalum oxide ($KTaO_3$), bismuth scandium oxide ($BiScO_3$), bismuth iron oxide ($BiFeO_3$), hafnium erbium oxide ($Hf_{1-x}Er_xO$), hafnium lanthanum oxide ($Hf_{1-x}La_xO$), hafnium yttrium oxide ($Hf_{1-x}Y_xO$), hafnium gadolinium oxide ($Hf_{1-x}Gd_xO$), hafnium aluminum oxide ($Hf_{1-x}Al_xO$), hafnium zirconium oxide ($Hf_{1-x}Zr_xO$, HZO), hafnium titanium oxide ($Hf_{1-x}Ti_xO$), hafnium tantalum oxide ($Hf_{1-x}Ta_xO$), or a combination thereof, or the like. In some embodiments, the ferroelectric portions 90 may include different ferroelectric materials or different types of memory materials. In some embodiments, the method of forming the ferroelectric portions 90 include performing a suitable deposition technique, such as CVD, PECVD, metal oxide chemical vapor deposition (MOCVD), ALD, RPALD, PEALD, MBD or the like.

In some embodiments in which the inhibitor portion 88 is formed of an organic material such as SAM, in order to prevent the inhibitor portions 88 from being broken due to thermal decomposition, the ferroelectric portions 90 are deposited by a low temperature deposition process. In an embodiment in which the SAM decomposition temperature is between room temperature to 200° C., and the ferroelectric portions 90 are deposited at a temperature lower than room temperature to 200° C. to reduce the rate of SAM decomposition without significantly damaging the inhibitor portions 88. Thereby, during the period of depositing the ferroelectric portions 90, the inhibitor portions 88 may maintain blocking capabilities.

The ferroelectric portion 90 has a thickness T2 equal to or greater than the thickness T1 of the inhibitor portion 88. In some embodiments, the ferroelectric portion 90 has the thickness T2 of about 1-20 nm, such as 5-10 nm. Other thickness ranges (e.g., more than 20 nm or 5-15 nm) may be applicable. In some embodiments, the ferroelectric portion 90 is formed in a fully amorphous state. In alternative embodiments, the ferroelectric portion 90 is formed in a partially crystalline state; that is, the ferroelectric portion 90 is formed in a mixed crystalline-amorphous state and having some degree of structural order. In yet alternative embodiments, the ferroelectric portion 90 is formed in a fully crystalline state. In some embodiments, the ferroelectric portion 90 is a single layer. In alternative embodiments, the ferroelectric portion 90 is a multi-layer structure.

An annealing process is performed on the ferroelectric portions 90 and the inhibitor portions 88. The temperature range of the annealing process ranges from about 100° C. to about 400° C., so that the ferroelectric portions 90 may achieve a desired crystalline lattice structure, and the inhibitor portions 88 may be decomposed. In some embodiments, upon the annealing process, the ferroelectric portion 90 is transformed from an amorphous state to a partially or fully crystalline sate. In alternative embodiments, upon the annealing the ferroelectric portions 90 are transformed from a partially crystalline state to a fully crystalline state. By this way, the ferroelectric portions 90 may have an orthorhombic crystal phase. In some embodiments, the orthorhombic crystal phase in the ferroelectric portions 90 is greater than 70 mol % (i.e., 70%). In some embodiments, the orthorhombic crystal phase in the ferroelectric portion 90 is greater than 80 mol %. For example, the orthorhombic crystal phase in the ferroelectric portions 90 is between 80 mol % and 99 mol %. After the inhibitor portions 88 are decomposed, sidewall surfaces of the dielectric layers 52 in regions 89 are exposed, and two adjacent ferroelectric portions 90 and the dielectric layer 52 therebetween form a lateral groove G.

Figure 20A:
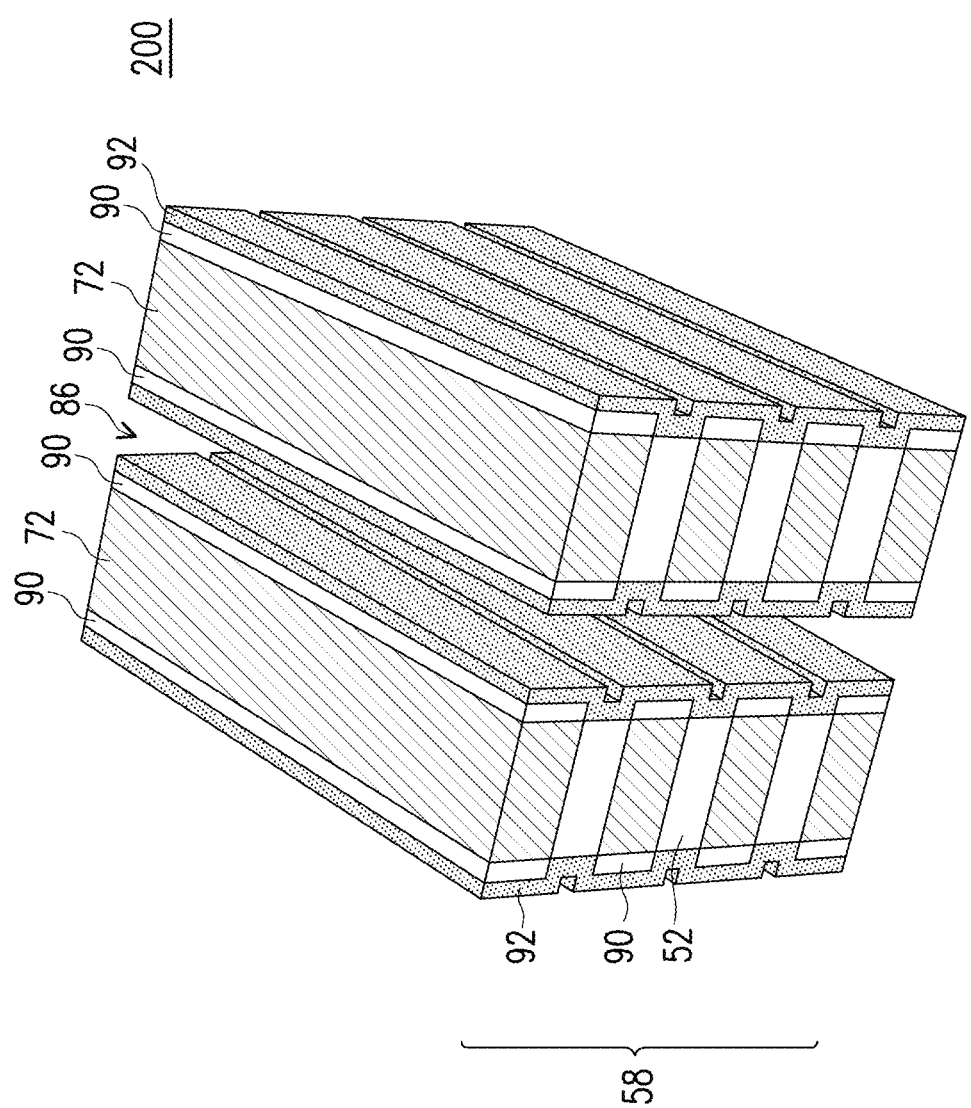
Figure 20B:
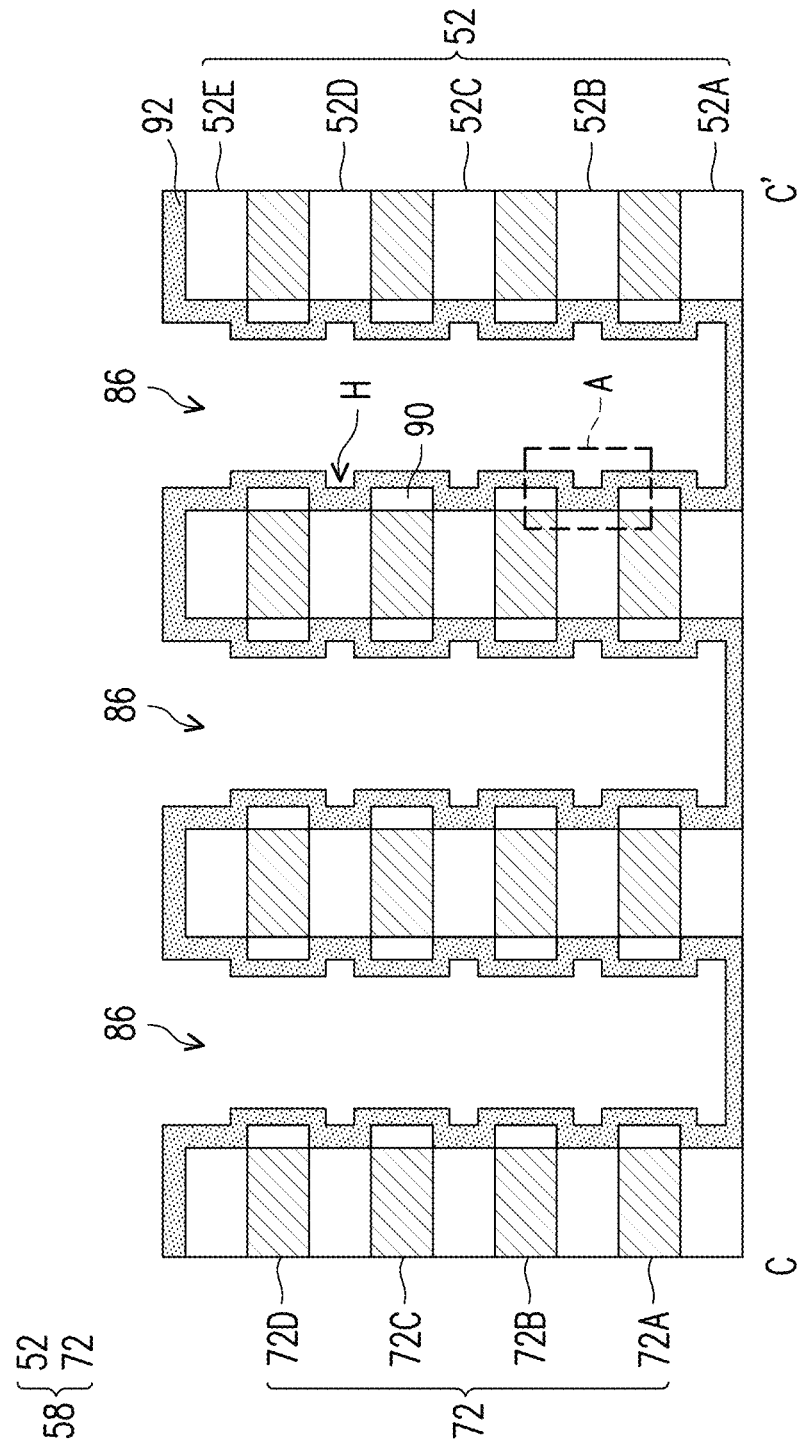

FIG. 20A through 20F illustrate selectively forming a channel layer 92 over the ferroelectric portions 90 and the dielectric layers 52. FIG. 20A is illustrated in a partial three-dimensional view. In FIG. 20B, a cross-sectional view is provided along line C-C' of FIG. 1A. FIGS. 20C, 20D, 20E and 20F illustrate local enlarged views in a region A of FIG. 20B.

In FIGS. 20A and 20B, a channel layer 92 is deposited in the trenches 86 and lateral grooves G. The channel layer 92 includes materials suitable for providing channel regions for the memory cells 202 (see FIG. 1A). For example, the channel layer 92 includes an oxide semiconductor (OS) such as zinc oxide (ZnO), indium tungsten oxide (InWO), indium gallium zinc oxide (InGaZnO, IGZO), indium zinc oxide (InZnO), indium tin oxide (ITO), combinations thereof, or the like. In some embodiments, channel layer 92 includes polycrystalline silicon (poly-Si), amorphous silicon (a-Si), or the like. The channel layer 92 may be deposited by CVD, PVD, ALD, PECVD, or the like.

Figure 20C:
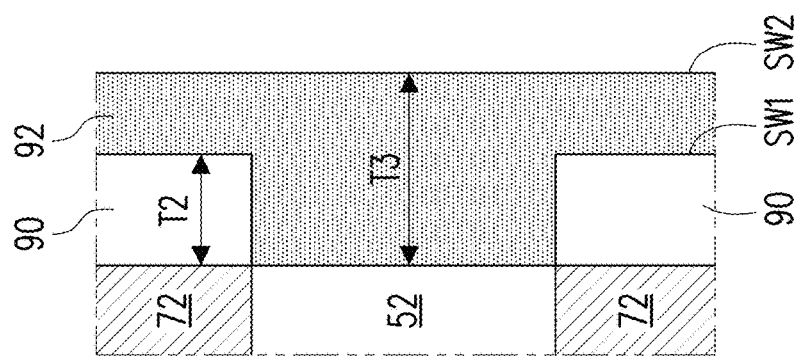
Figure 20D:
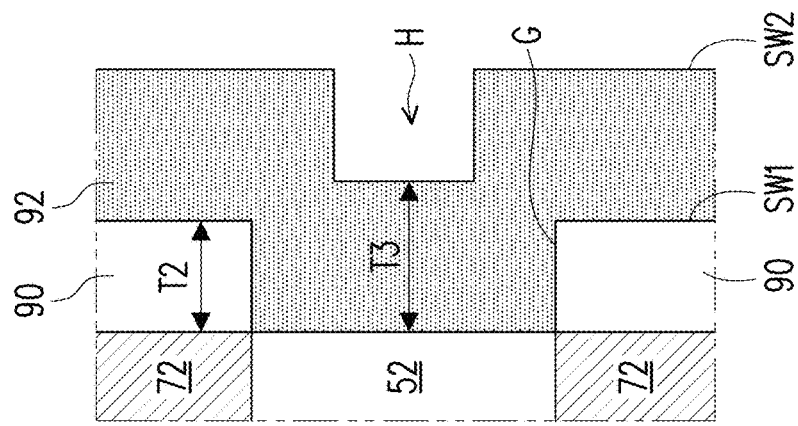
Figure 20E:
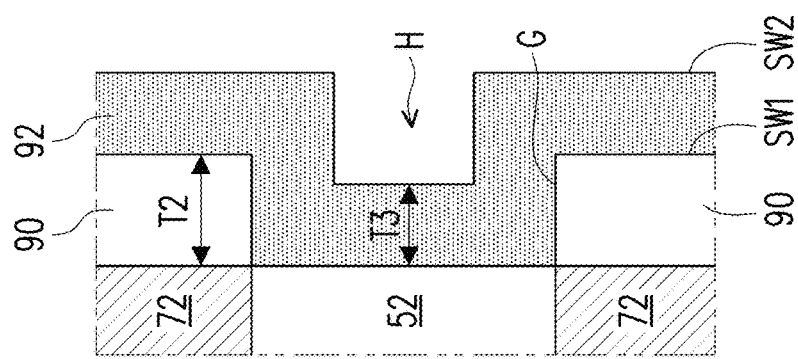
Figure 20F:
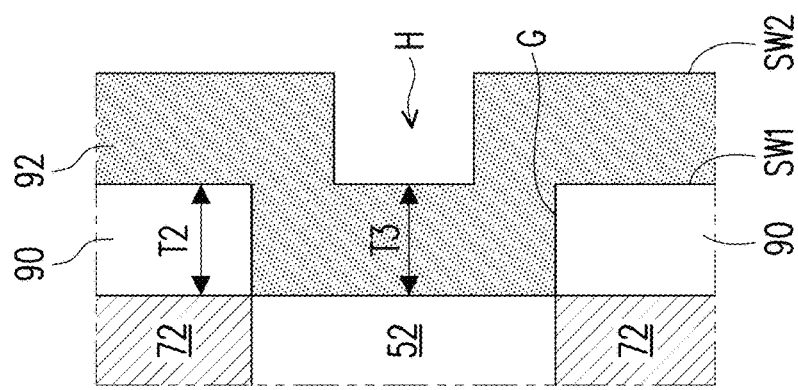

The channel layer 92 may extend along sidewalls and bottom surfaces of the trenches 86 and along top surfaces, sidewalls and bottoms of the lateral grooves G over the ferroelectric portions 90 and dielectric layers 52. In some embodiments, the channel layer 92 may be further deposited on the IMD 70 and along the sidewall of each step of the staircase structure in the staircase region. The channel layer 92 is in contact with top surface. sidewall surfaces and bottom surfaces of the ferroelectric portions 90, and sidewall surfaces of the dielectric layers 52. In some embodiments, the channel layer 92 is conformally deposited on the ferroelectric portions 90 and the dielectric layers 52, and therefore, the channel layer 92 has an uneven and wavy sidewall profile. In some embodiments, both two sidewalls SW1 and SW2 of the channel layer 92 are wavy. The sidewall SW2 of the channel layer 92 has lateral grooves H at levels of the dielectric layers 52, as shown in FIGS. 20C, 20D and 20E. The lateral grooves H are recessed toward the dielectric layers 52. In alternative embodiments, a sidewall SW1 of the channel layer 92 in contact with the ferroelectric portions 90 and the dielectric layer 52 is wavy while a sidewall SW2 of the channel layer 92 not in contact with the ferroelectric portions 90 and the dielectric layer 52 is substantially straight, as shown in FIG. 20F.

In some embodiments, the channel layer 92 in the lateral groove G has a thickness T3 equal to the thickness T2 of the ferroelectric portion 90, as shown in FIG. 20C. In alternative embodiments, the channel layer 92 in the lateral groove G has the thickness T3 less than the thickness T2 of the ferroelectric portion 90, as shown in FIG. 20D. In alternative embodiments, the channel layer 92 in the lateral groove G has the thickness T3 less than the thickness T2 of the ferroelectric portion 90, as shown in FIG. 20D. In yet alternative embodiments, the channel layer 92 in the lateral groove G has the thickness T3 greater than the thickness T2 of the ferroelectric portion 90, as shown in FIGS. 20E and 20F.

After the channel layer 92 is deposited, an annealing process (e.g., at a temperature range of about 300° C. to about 450° C.) in oxygen-containing ambient may be performed to activate the charge carriers of the channel layer 92.

FIGS. 21 through 24B illustrate forming dielectric material 98 and patterning channel layer 92 for the memory cells 202 (see FIG. 1A) in the trenches 86. FIG. 24A is illustrated in a partial three-dimensional view. In FIGS. 21, 22, 23, and 24B cross-sectional views are provided along line C-C' of FIG. 1A.

Figure 21:
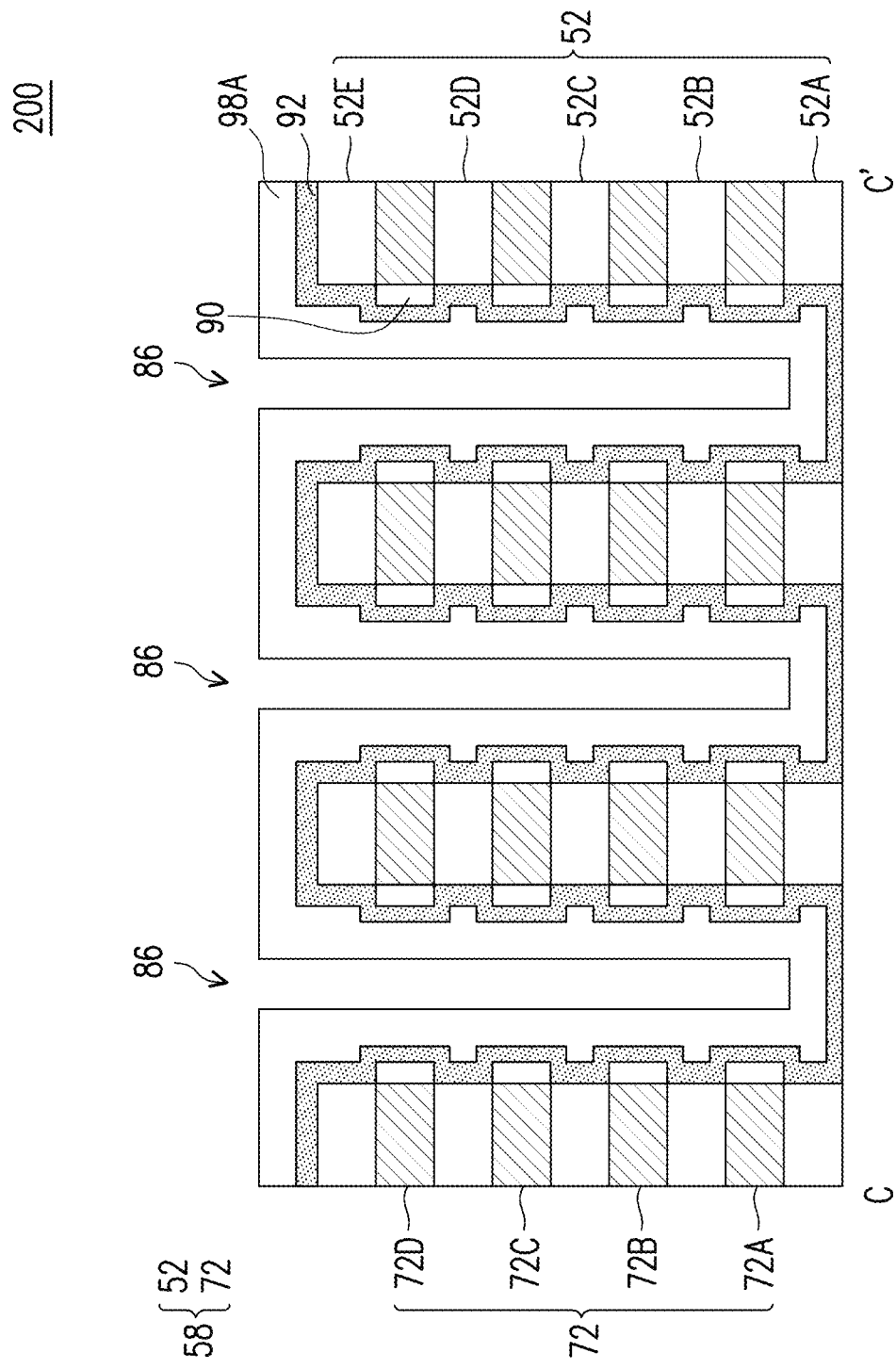

In FIG. 21, a dielectric material 98A is deposited in the trenches 86 and the lateral grooves H over the channel layer 92. In some embodiments, the dielectric material 98A includes silicon oxide, silicon nitride, silicon oxynitride, or the like, which may be deposited by CVD, PVD, ALD, PECVD, or the like. The dielectric material 98A may extend along sidewalls and bottom surfaces of the trenches 86 over the channel layer 92. In some embodiments, the dielectric material 98A is optional and may be omitted as needed.

Figure 22:
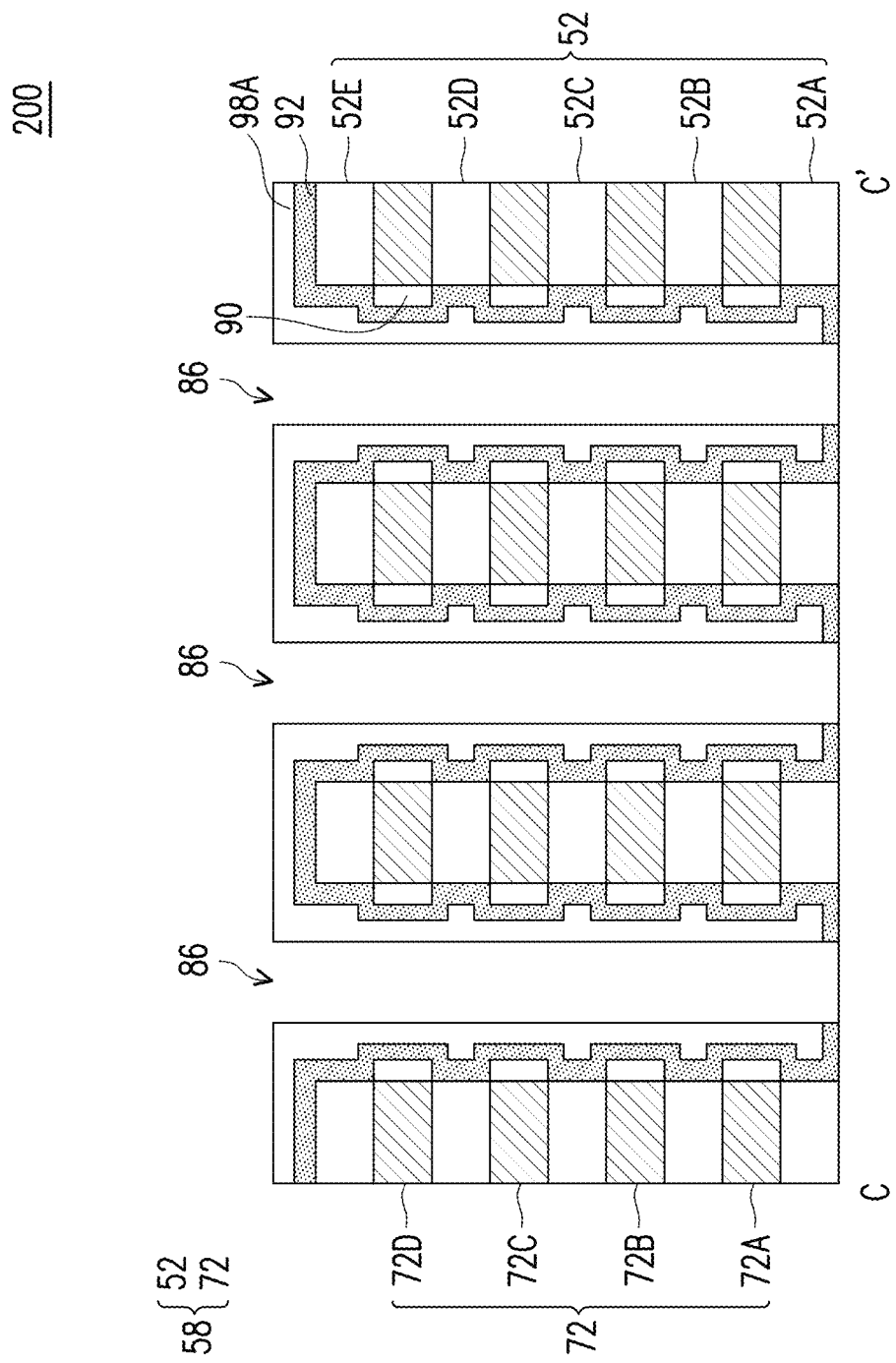

In FIG. 22, bottom portions of the dielectric material 98A and the channel layer 92 are removed in the trenches 86. The removal process includes an acceptable etching process, such as a dry etch (e.g., RIE, NBE, the like), a wet etch, the like, or a combination thereof. The etching may be anisotropic. In some embodiments, the top portions of the dielectric material 98A and the channel layer 92 are removed from the multi-layer stack 58. In some embodiments, removal process includes a combination of photolithography and etching.

Accordingly, the remaining dielectric material 98A and the channel layer 92 may expose portions of the ferroelectric portion 90 on bottom surfaces of the trenches 86. Thus, portions of the channel layer 92 on opposing sidewalls of the trenches 86 may be separated from each other, which improves isolation between the memory cells 202 of the memory array 200 (see FIG. 1A).

Figure 23:
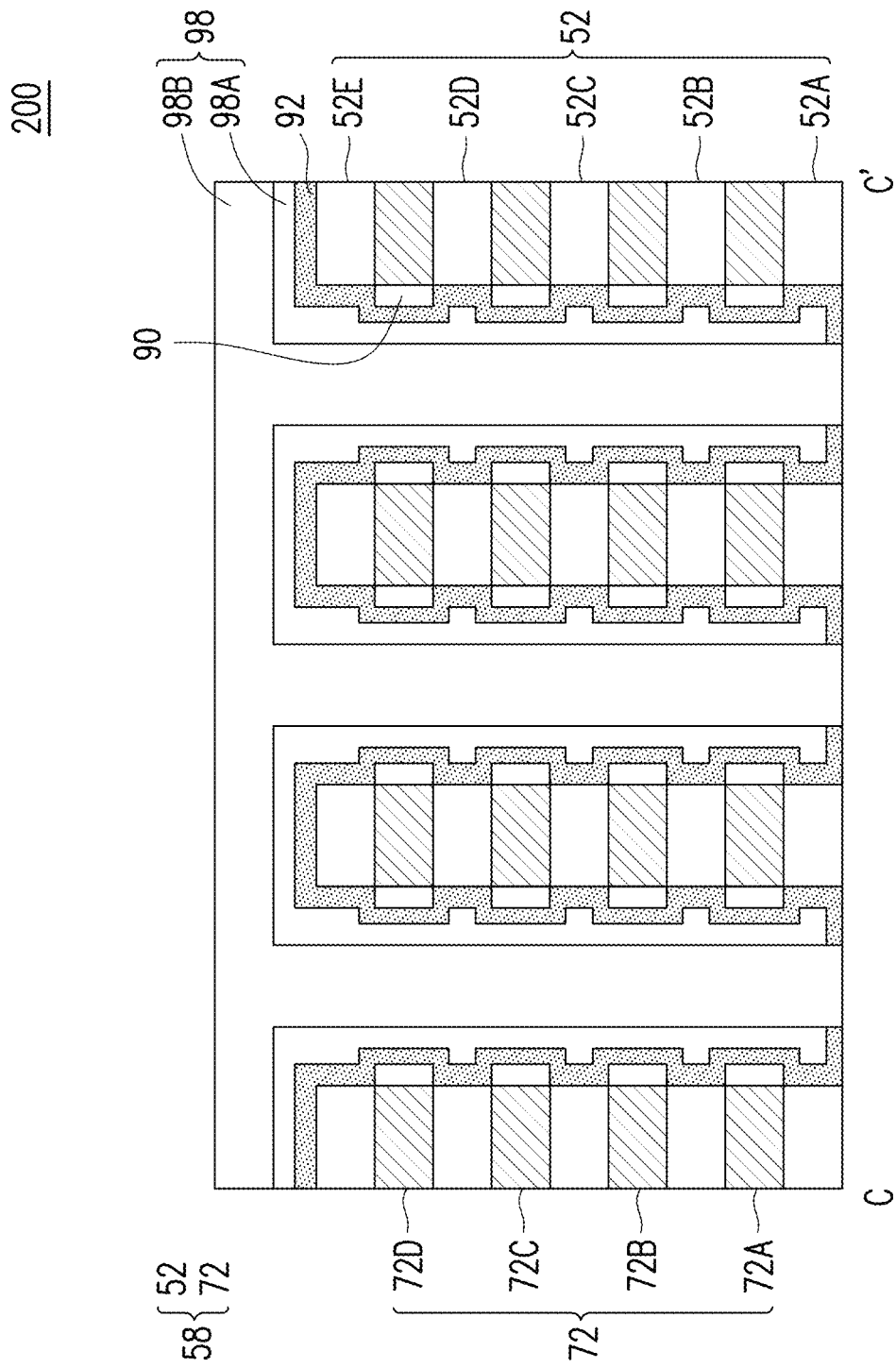

In FIG. 23, a dielectric material 98B is deposited to completely fill the trenches 86. The dielectric material 98B may be formed of one or more materials and by processes the same as or similar to those of the dielectric material 98A. In some embodiments, the dielectric material 98B and the dielectric material 98A include different materials. The dielectric materials 98A and 98B are collectively referred to as a dielectric material 98. The dielectric material 98 has an uneven and wavy sidewall profile.

Figure 24A:
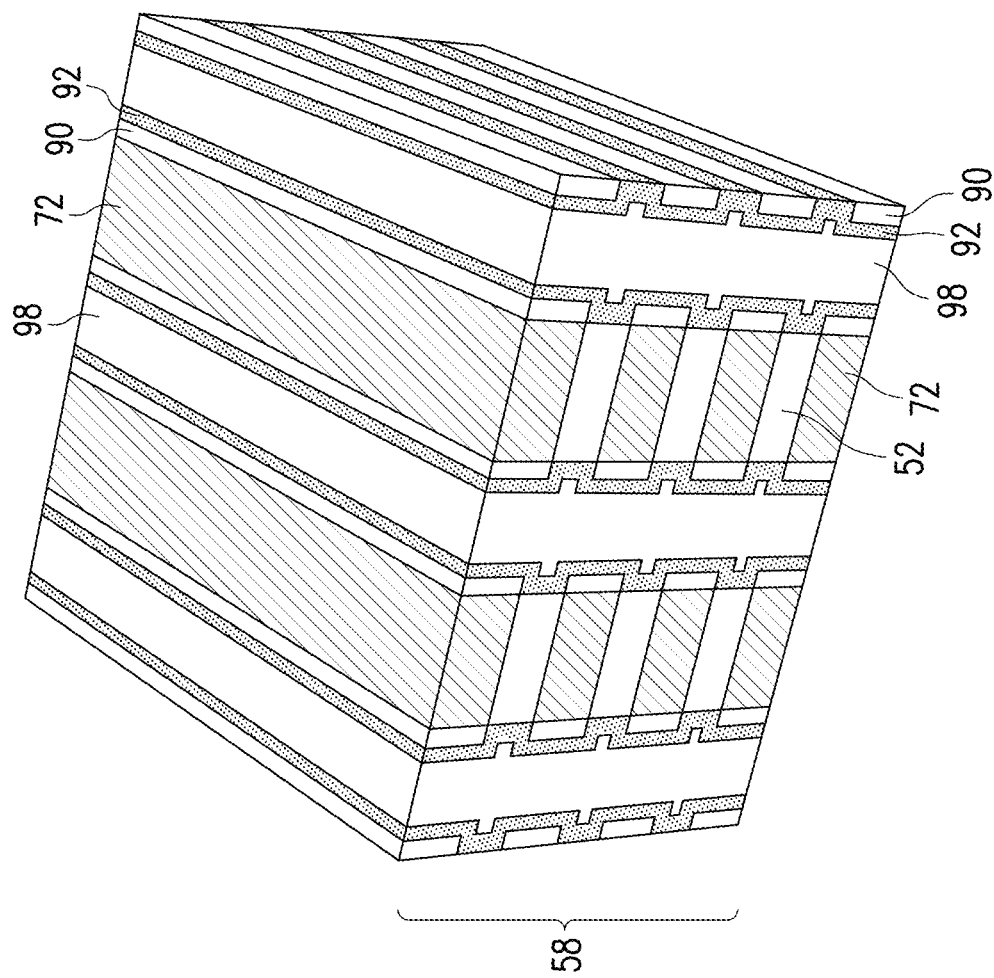
Figure 24B:
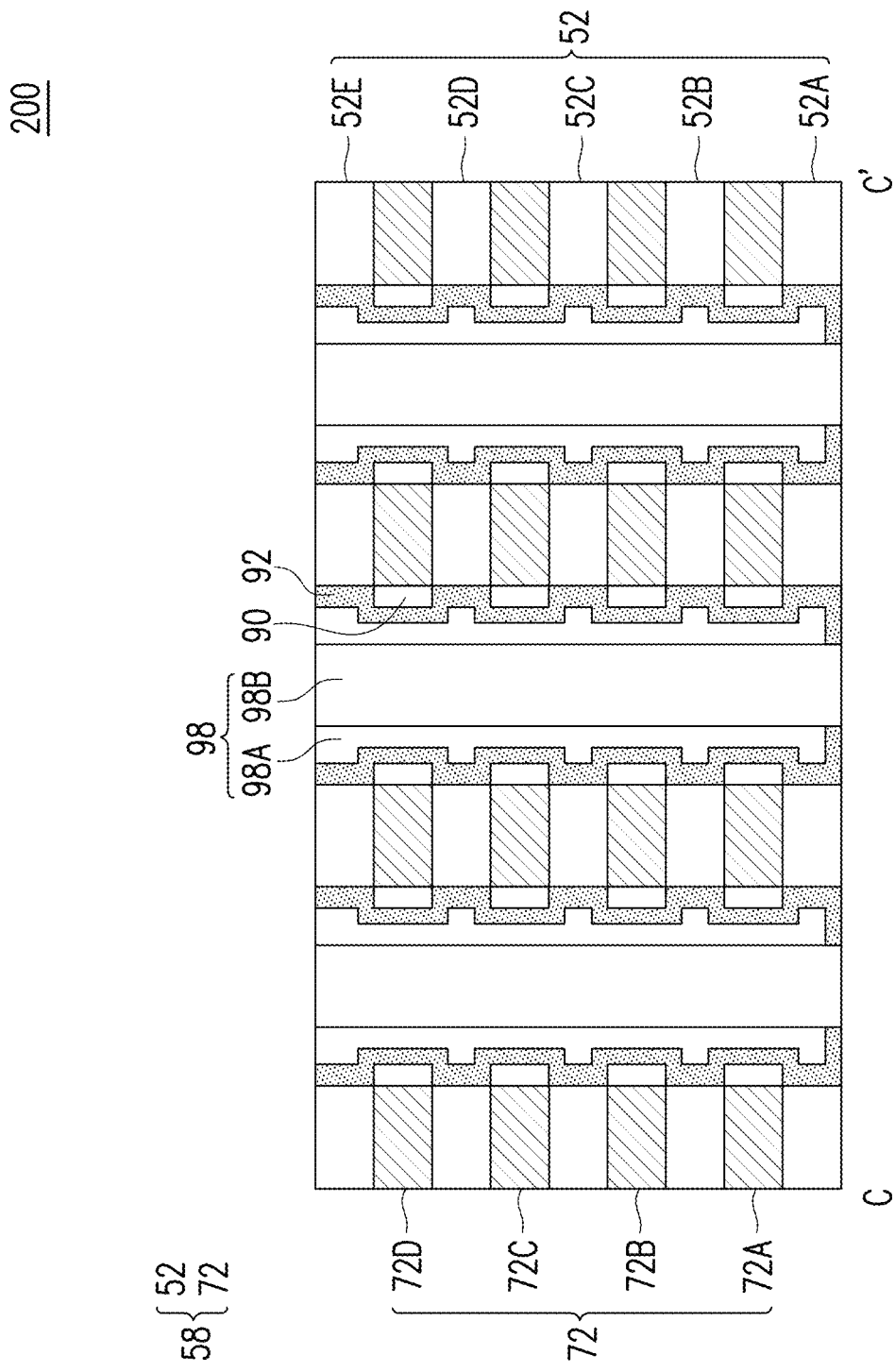

In FIGS. 24A and 24B, a removal process is applied to the dielectric materials 98A/98B, the channel layer 92, and the ferroelectric portion 90 to remove excess materials over the multi-layer stack 58. In some embodiments, a planarization process such as a CMP, an etch-back process, combinations thereof, or the like may be utilized. The planarization process exposes the multi-layer stack 58 such that top surfaces of the multi-layer stack 58 (e.g., the dielectric layer 52E), the ferroelectric portions 90, the channel layer 92, the dielectric material 98, and the IMD 70 are level after the planarization process is complete.

Figure 26A:
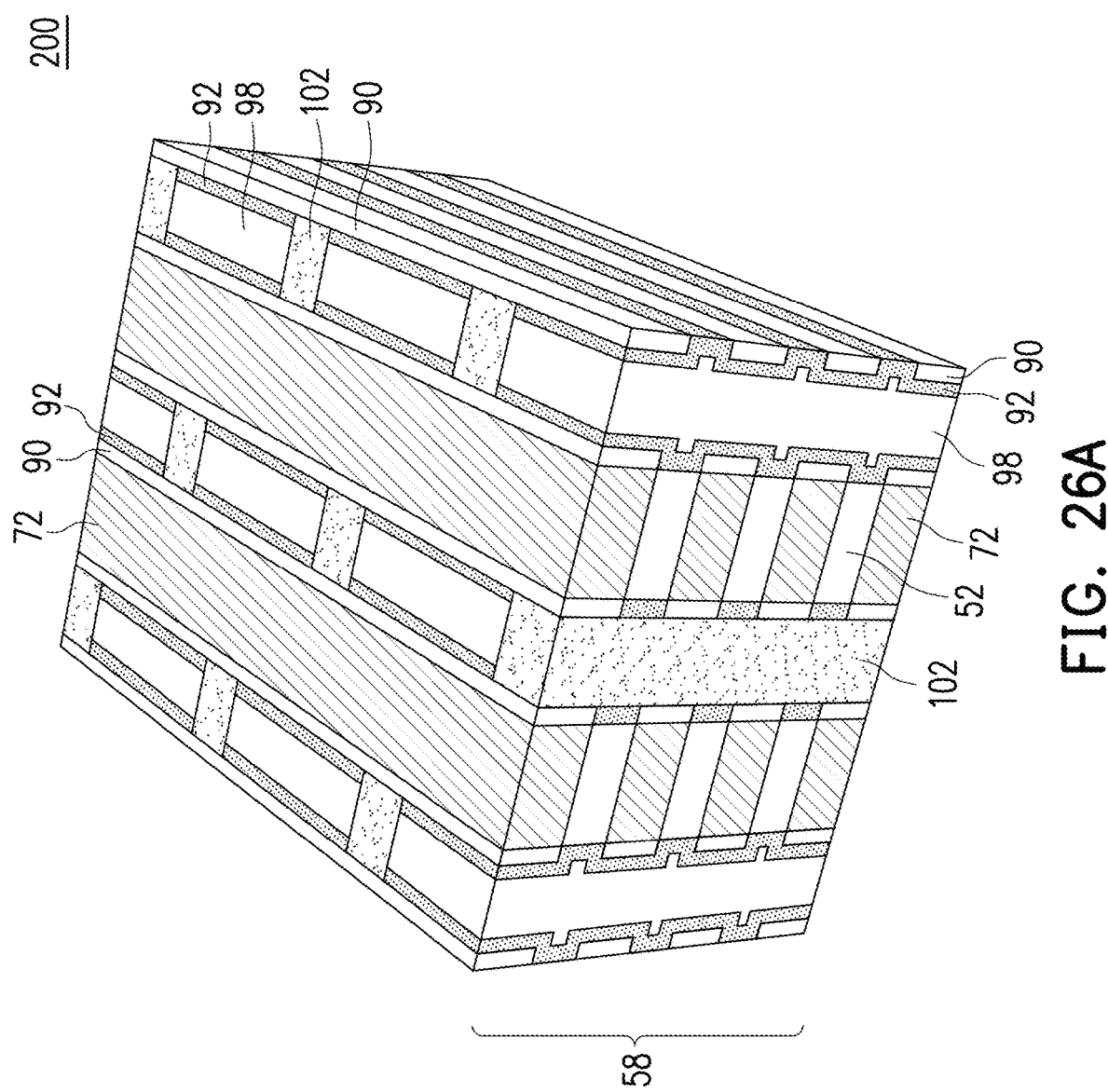
Figure 26B:
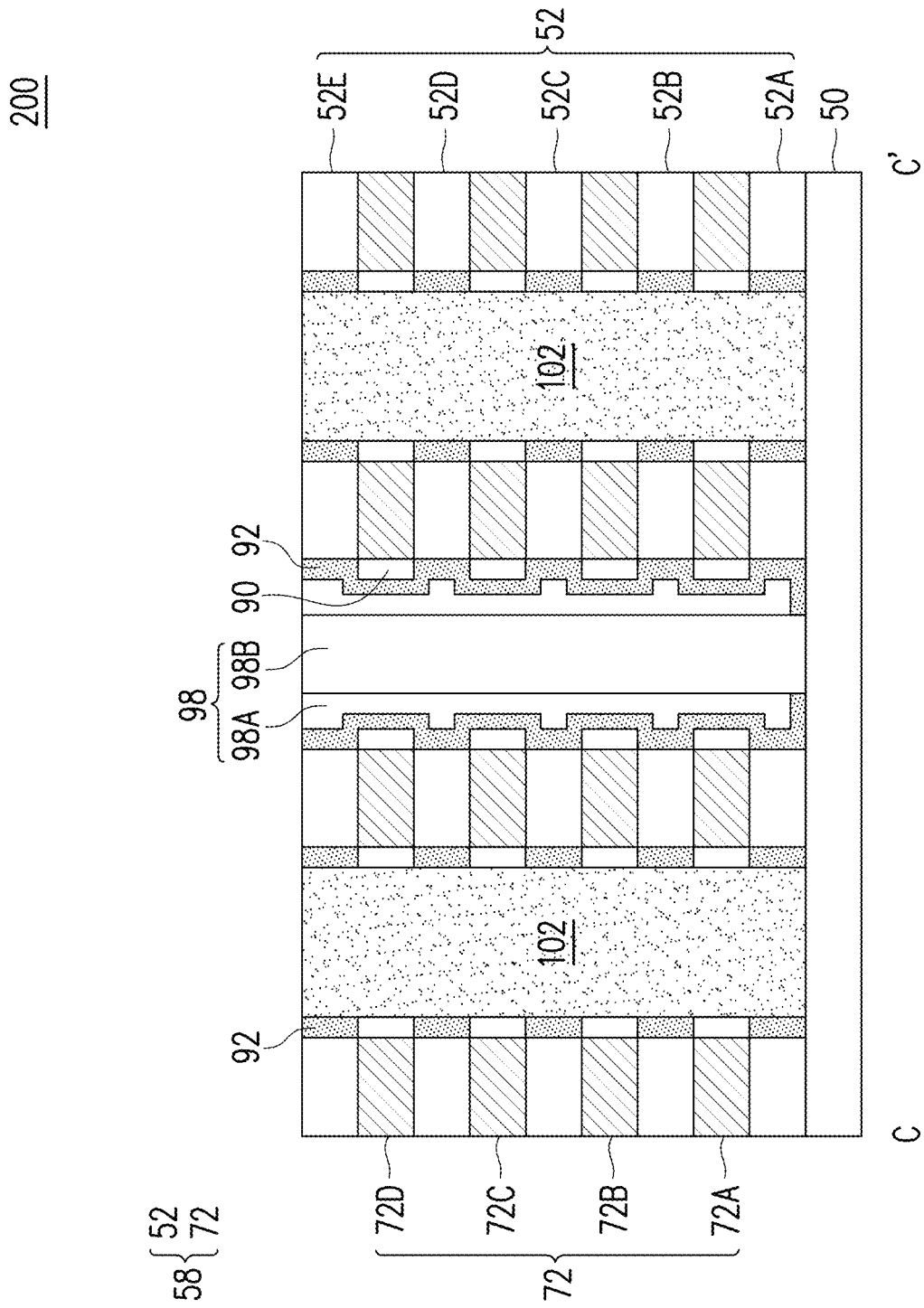
Figure 27A:
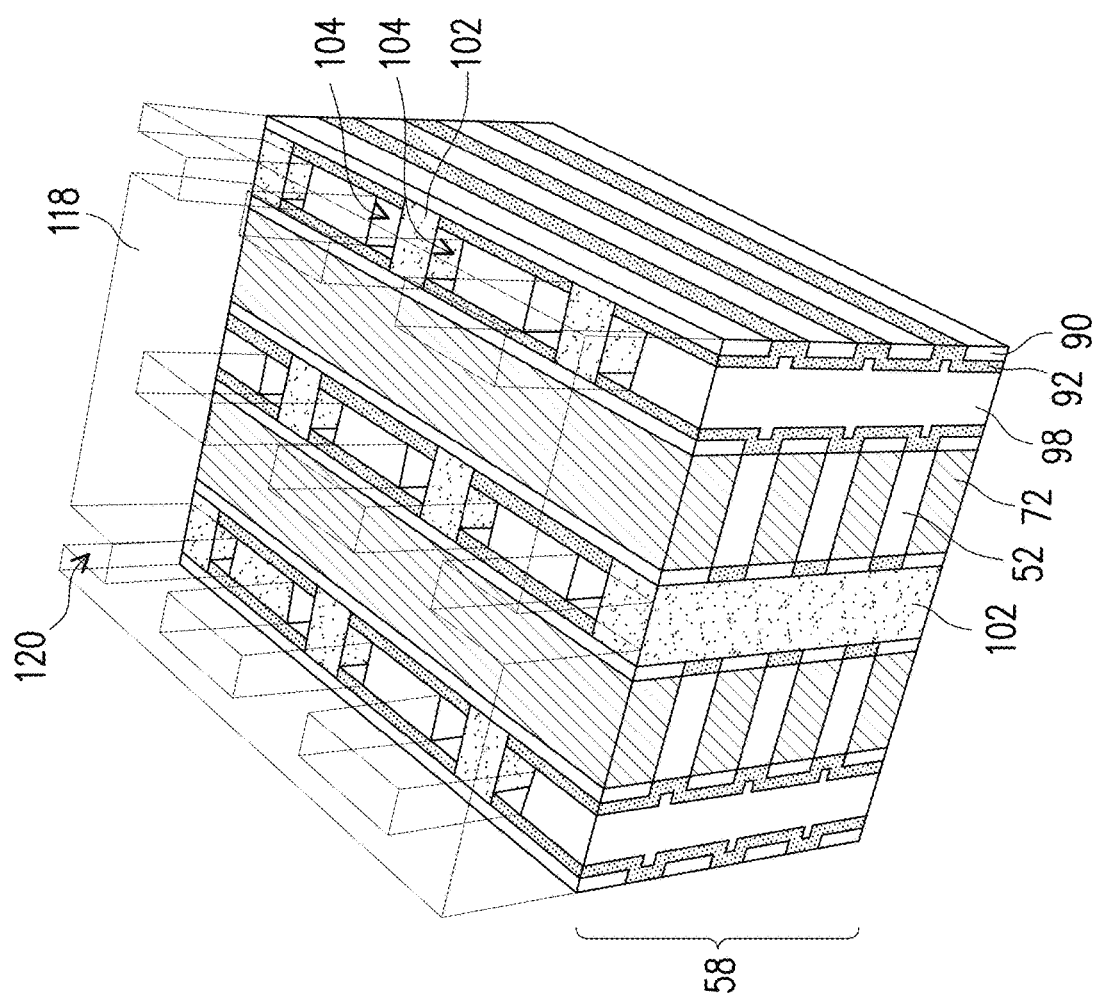
Figure 27B:
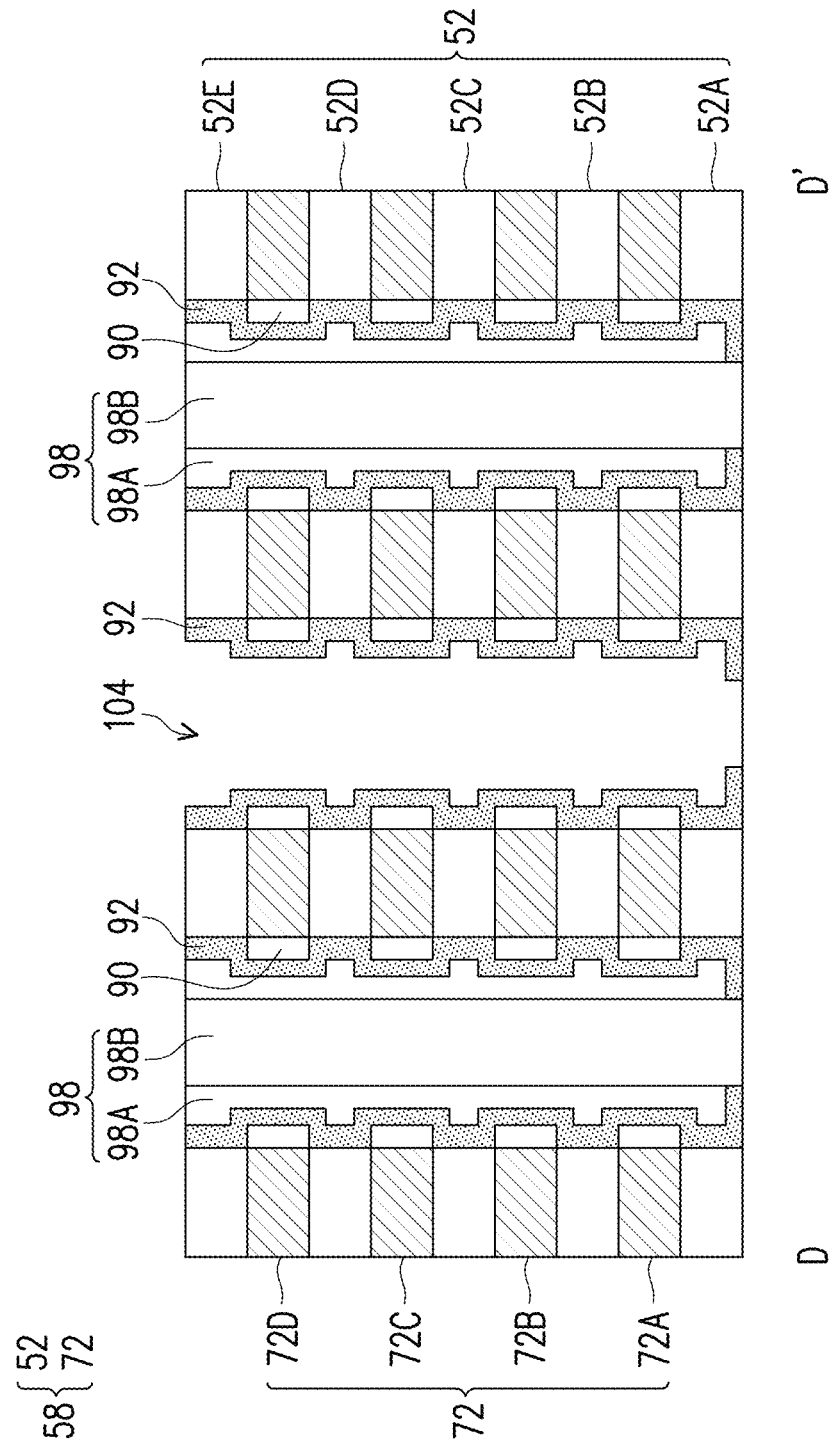
Figure 28A:
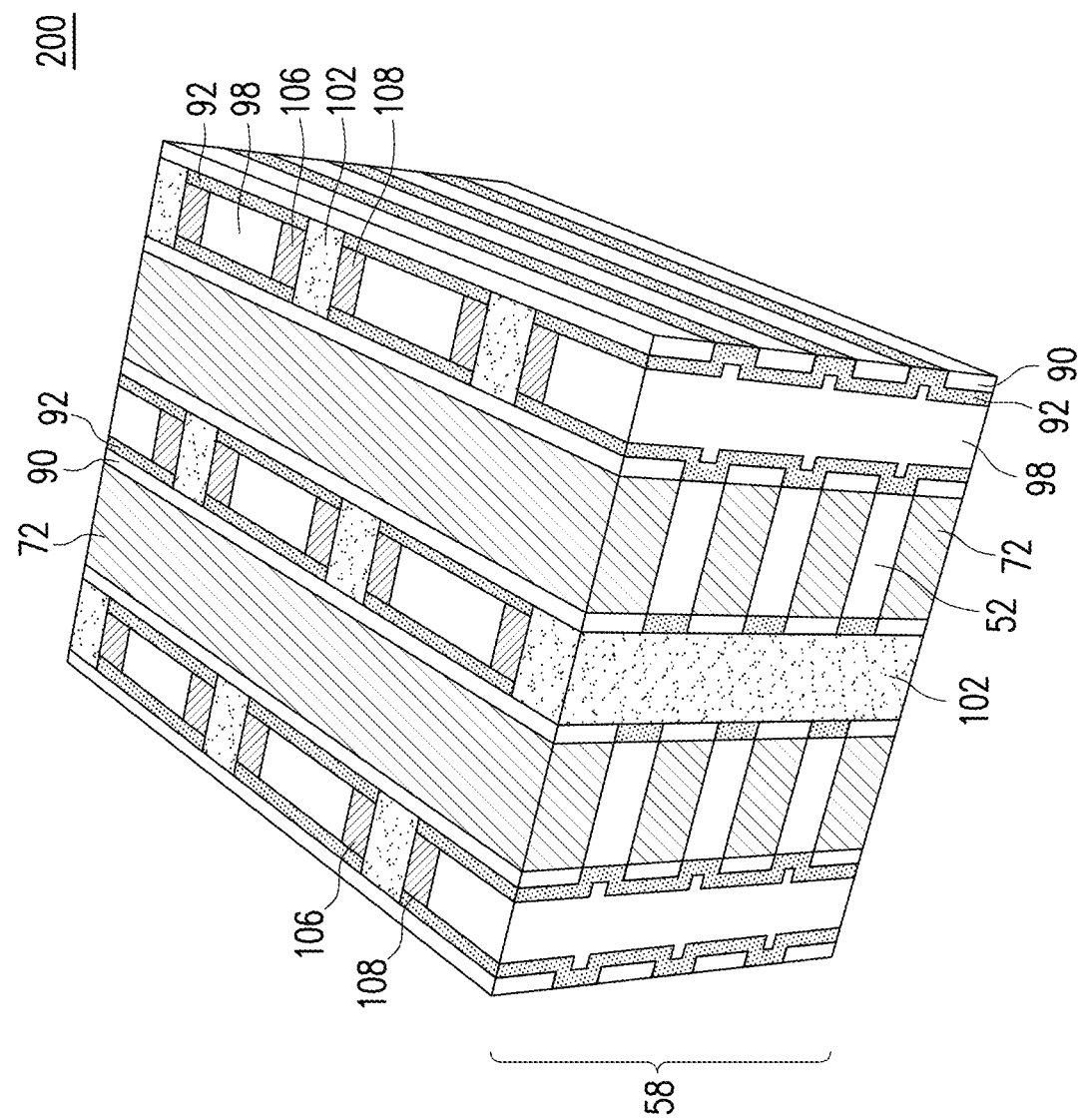
Figure 28B:
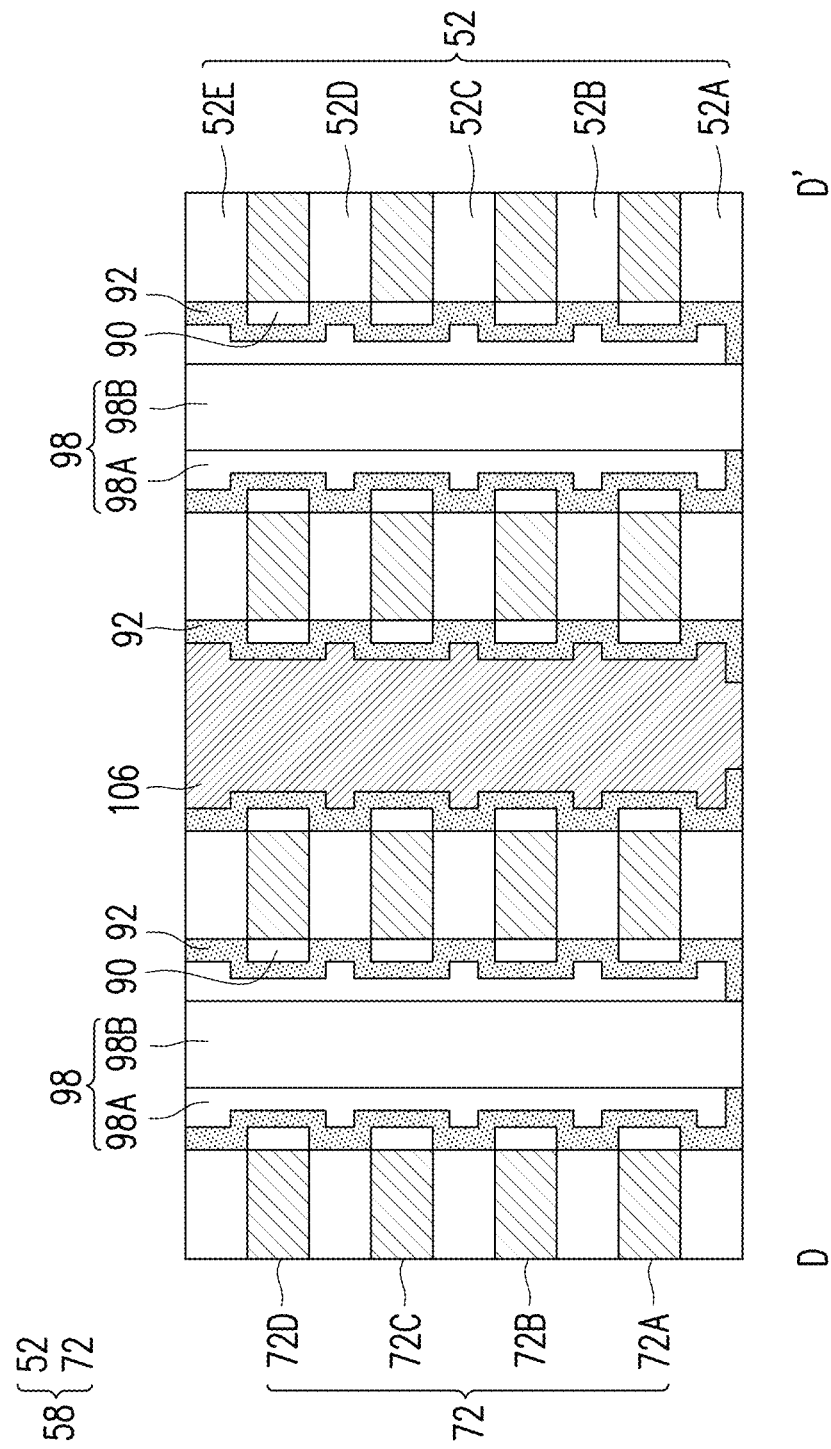

FIGS. 25A through 28D illustrate intermediate steps of manufacturing conductive pillars 106 and 108 (e.g., source/drain pillars) in the memory array 200. The conductive pillars 106 and 108 may extend along a direction perpendicular to the conductive lines 72 such that individual cells of the memory array 200 may be selected for read and write operations. FIGS. 25A, 26A, 27A, and 28A are illustrated in a partial three-dimensional view. In FIGS. 25B and 26B, cross-sectional views are provided along line C-C' of FIG. 1A. In FIGS. 27B and 28B, cross-sectional views are provided along line D-D' of FIG. 1A. In FIG. 28C, a cross-sectional view is provided along line E-E' of FIG. 1A. In FIG. 28D, a cross-sectional view is provided along line F-F' of FIG. 1A. In FIG. 28E, a top-down view of FIG. 1A is provided.

Figure 25A:
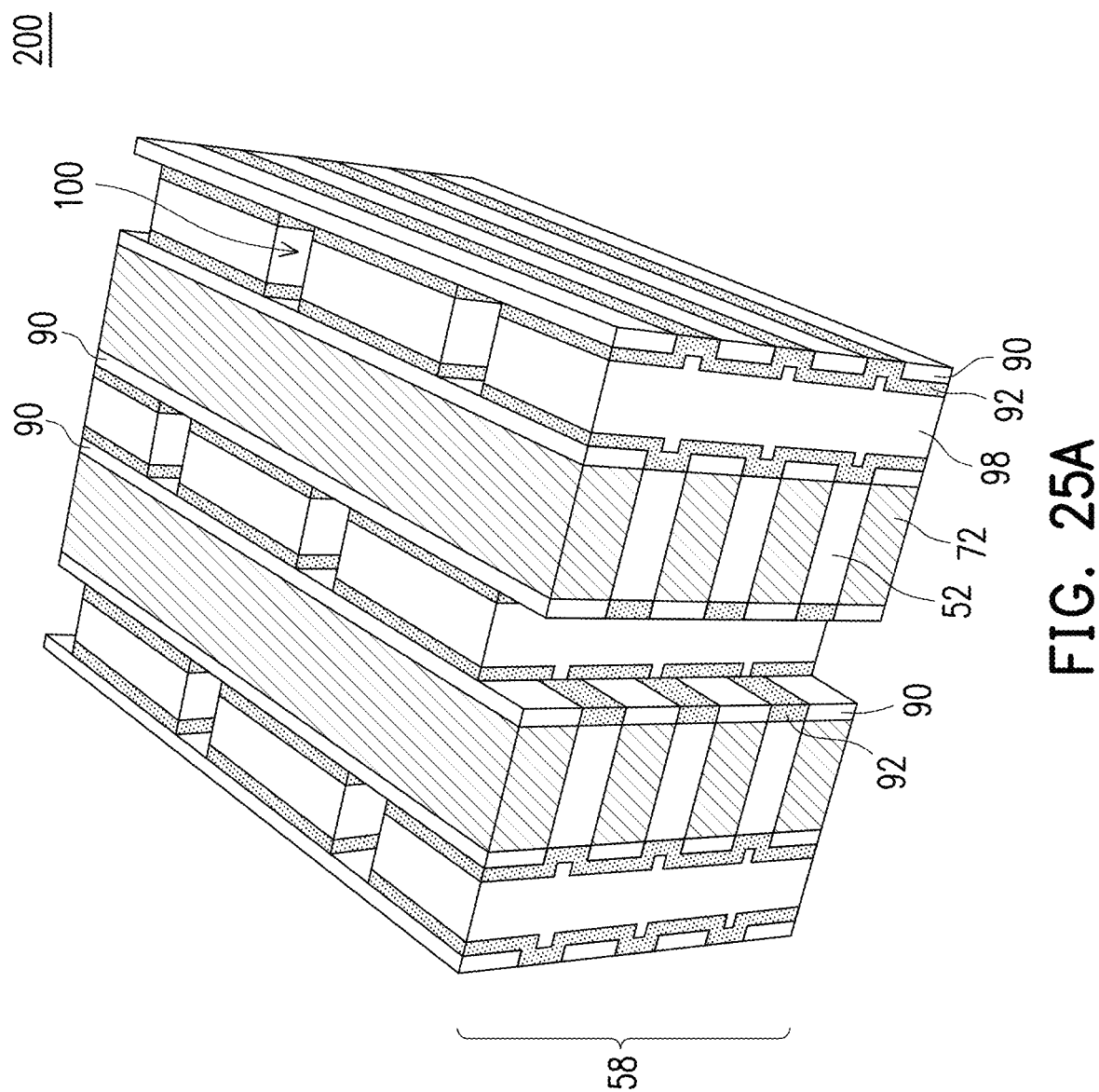
Figure 25B:
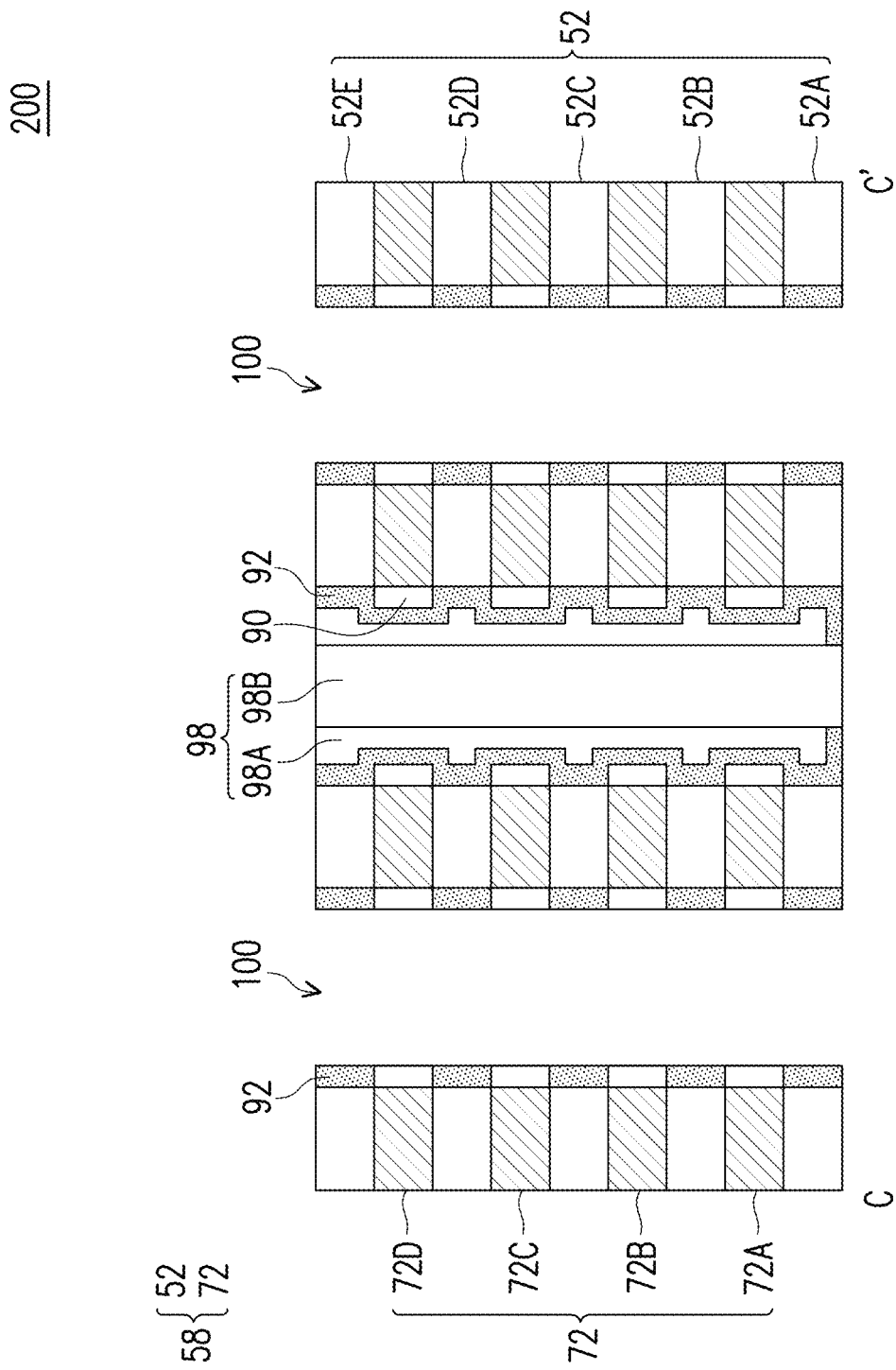

In FIGS. 25A and 25B, trenches 100 are formed through the channel layer 92 and the dielectric material 98. The trenches 100 may be formed through a combination of photolithography and etching, for example to remove portions of the dielectric material 98. The trenches 100 may be disposed between opposing sidewalls of the ferroelectric portions 90 and may physically separate adjacent stacks of memory cells in the memory array 200 (see FIG. 1A).

In FIGS. 26A and 26B, isolation pillars 102 are formed in the trenches 100. In some embodiments, an isolation layer is deposited over the multi-layer stack 58 filling in the trenches 100. The isolation layer may include, for example, silicon oxide, silicon nitride, silicon oxynitride, or the like, which may be deposited by CVD, PVD, ALD, PECVD, or the like. The isolation layer may extend along sidewalls and bottom surfaces of the trenches 100 over the channel layer 92. After deposition, a planarization process (e.g., a CMP, etch back, or the like) may be performed to remove excess portions of the isolation layer. In the resulting structure, top surfaces of the multi-layer stack 58 (e.g., dielectric layer 52E), the ferroelectric portions 90, the channel layer 92, and the isolation pillars 102 may be substantially level (e.g., within process variations). In some embodiments, materials of the dielectric material 98 and isolation pillars 102 may be selected so that they may be etched selectively relative each other. For example, in some embodiments, the dielectric material 98 include oxide and the isolation pillars 102 include nitride. In some embodiments, the dielectric material 98 include nitride and the isolation pillars 102 include oxide. Other materials are also possible.

In FIGS. 27A and 27B, trenches 104 are formed for the subsequently formed conductive pillars 106 and 108. The trenches 104 are formed by patterning the dielectric material 98 with a combination of photolithography and etching, for example. In some embodiments, as shown in FIG. 27A, a photoresist 118 is formed over the multi-layer stack 58, the dielectric material 98, the isolation pillars 102, the channel layer 92, and the ferroelectric portion 90. In some embodiments, the photoresist 118 is patterned by an acceptable photolithography technique to define openings 120. Each of the openings 120 may expose the corresponding isolation pillar 102 and two separate regions of the dielectric material 98 beside the isolation pillar 102. In this way, each of the openings 120 may define a pattern of a conductive pillar 106 and an adjacent conductive pillar 108 that are separated by the isolation pillars 102.

Subsequently, portions of the dielectric material 98 exposed by the openings 120 may be removed by an acceptable etching process, such as by a dry etch (e.g., RIE, NBE, or the like), a wet etch, the like, or a combination thereof. The etching may be anisotropic. The etching process may use an etchant that etches the dielectric material 98 without significantly etching the isolation pillars 102. As a result, even though the openings 120 expose the isolation pillars 102, the isolation pillars 102 may not be significantly removed. Patterns of the trenches 104 may correspond to the conductive pillars 106 and 108 (see FIGS. 28A and 28B). After the trenches 104 are patterned, the photoresist 118 may be removed by ashing, for example.

Figure 28C:
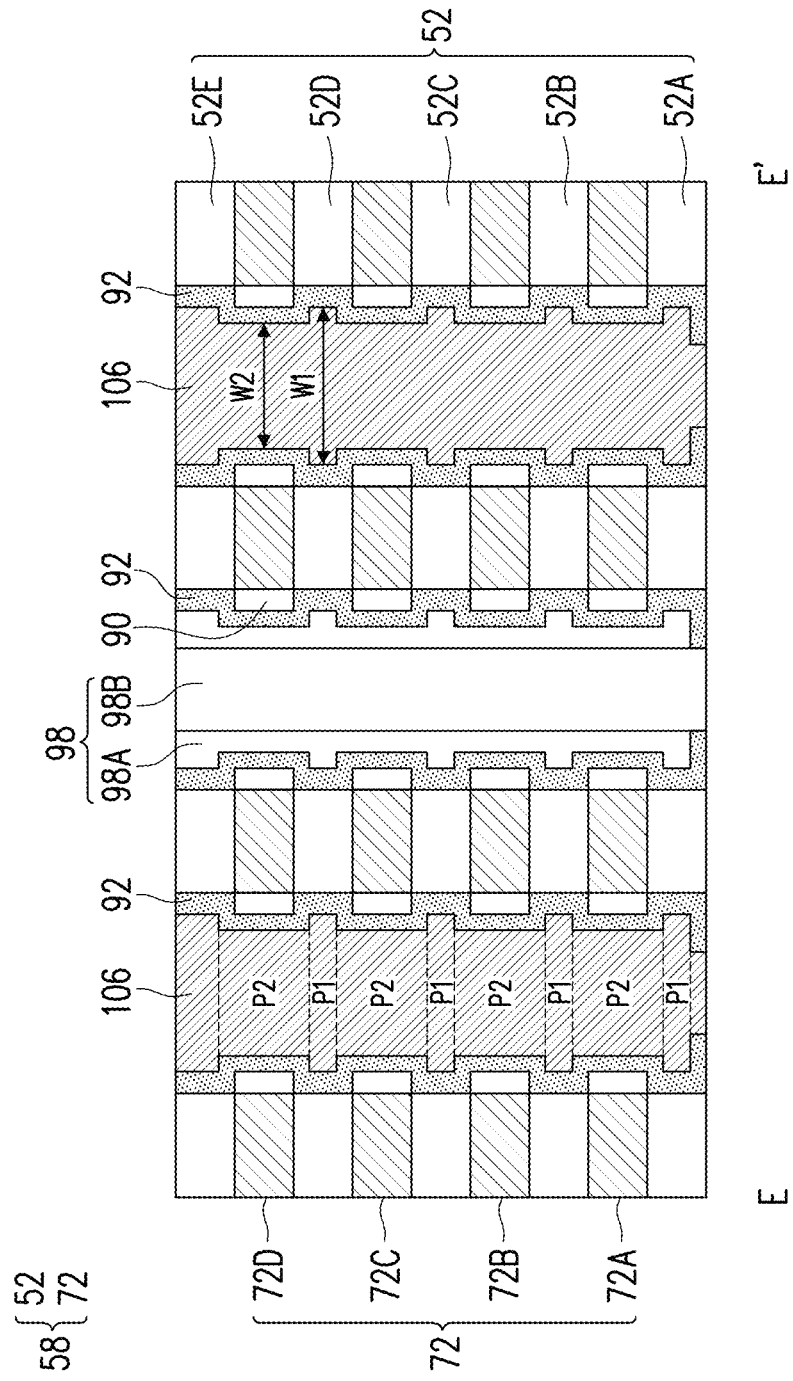
Figure 28E:
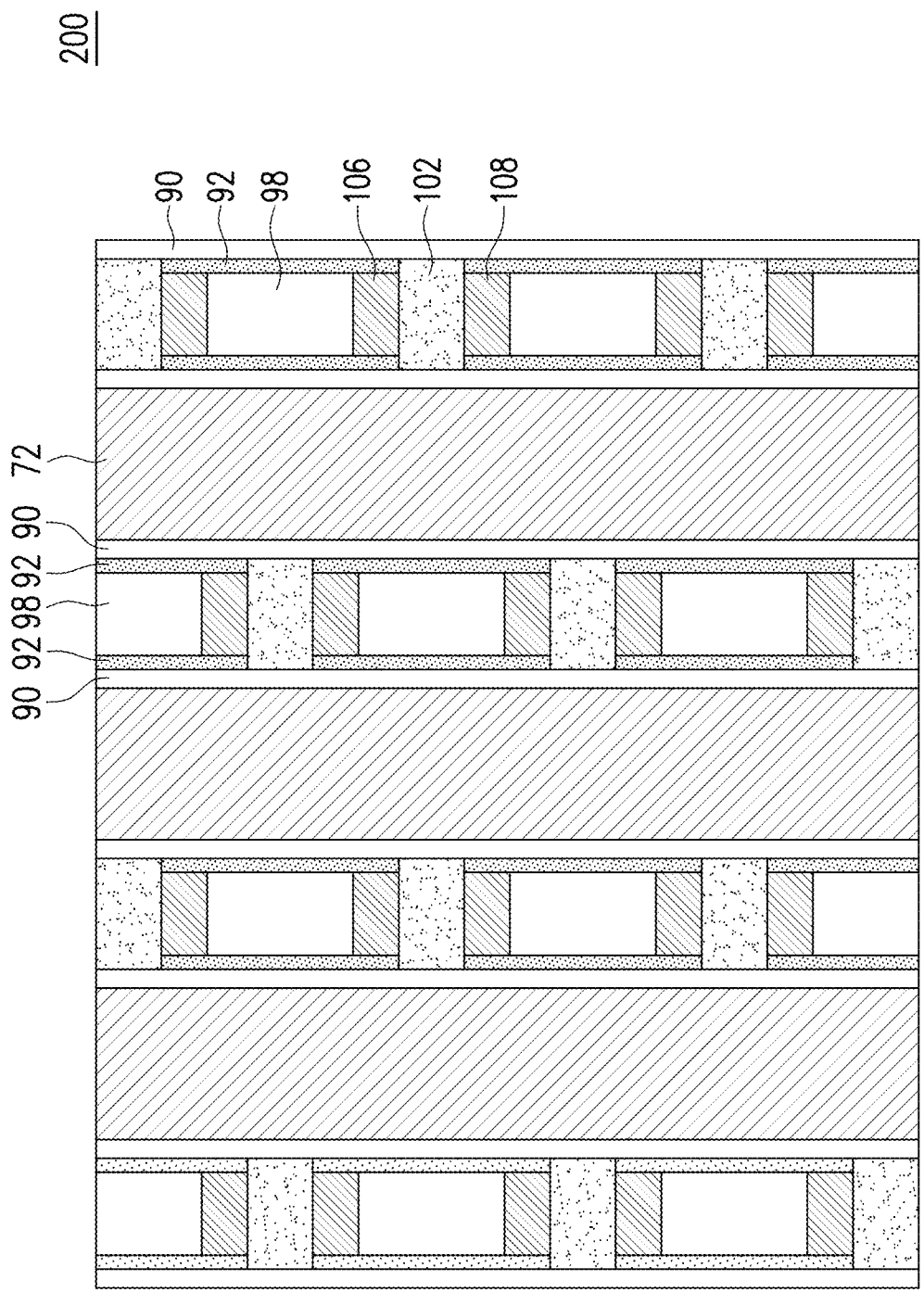

In FIGS. 28A and 28E, the trenches 104 are filled with a conductive material to form the conductive pillars 106 and 108. The conductive material may include copper, titanium, titanium nitride, tantalum, tantalum nitride, tungsten, ruthenium, aluminum, combinations thereof, or the like, which may be formed using, for example, CVD, ALD, PVD, PECVD, or the like. After the conductive material is deposited, a planarization (e.g., a CMP, etch back, or the like) may be performed to remove excess portions of the conductive material, thereby forming the conductive pillars 106 and 108. In the resulting structure, top surfaces of the multi-layer stack 58 (e.g., the dielectric layer 52E), the ferroelectric portions 90, the channel layer 92, the conductive pillars 106, and the conductive pillars 108 may be substantially level (e.g., within process variations). In some embodiments, the conductive pillars 106 correspond to and are electrically connected to the bit lines in the memory array, and the conductive pillars 108 correspond to correspond to and are electrically connected to the source lines in the memory array 200.

The conductive pillars 106 and 108 penetrate through the conductive lines 72 and the dielectric layers 52 of the multi-layer stack 58. In some embodiments, the conductive pillars 106 and 108 have uneven and wavy sidewall profiles. The conductive pillar 106 or 108 comprises first portions P1 and second portions P2 as shown in FIG. 28C. The first portions P1 are located at levels the same as the dielectric layers 52. The second portions P2 are located at levels the same as the conductive lines 72. The first portions P1 and the second portions P2 have different widths. In some embodiments, the first portion P1 has a first width W1 greater than a second width W2 of the second portion P2. The channel layer 92 is sandwiched between the first portions P1 and the dielectric layers 52 and, sandwiched between the second portions P2 and the ferroelectric portions 90. In some embodiments, the channel layer 92 is in contact with the first portions P1 and the dielectric layers 52 and, in contact with the second portions P2 and the ferroelectric portions 90.

Thus, stacked memory cells 202 may be formed in the memory array 200, as shown in FIG. 1A. Each memory cell 202 includes a gate electrode (e.g., a portion of a corresponding conductive line 72), a gate dielectric (e.g., a portion of a corresponding ferroelectric portion 90), a channel region (e.g., a portion of a corresponding channel layer 92), and source/drain pillars (e.g., portions of corresponding conductive pillars 106 and 108). The isolation pillars 102 isolates adjacent memory cells 202 in a same column and at a same vertical level. The memory cells 202 may be disposed in an array of vertically stacked rows and columns.

Figure 29A:
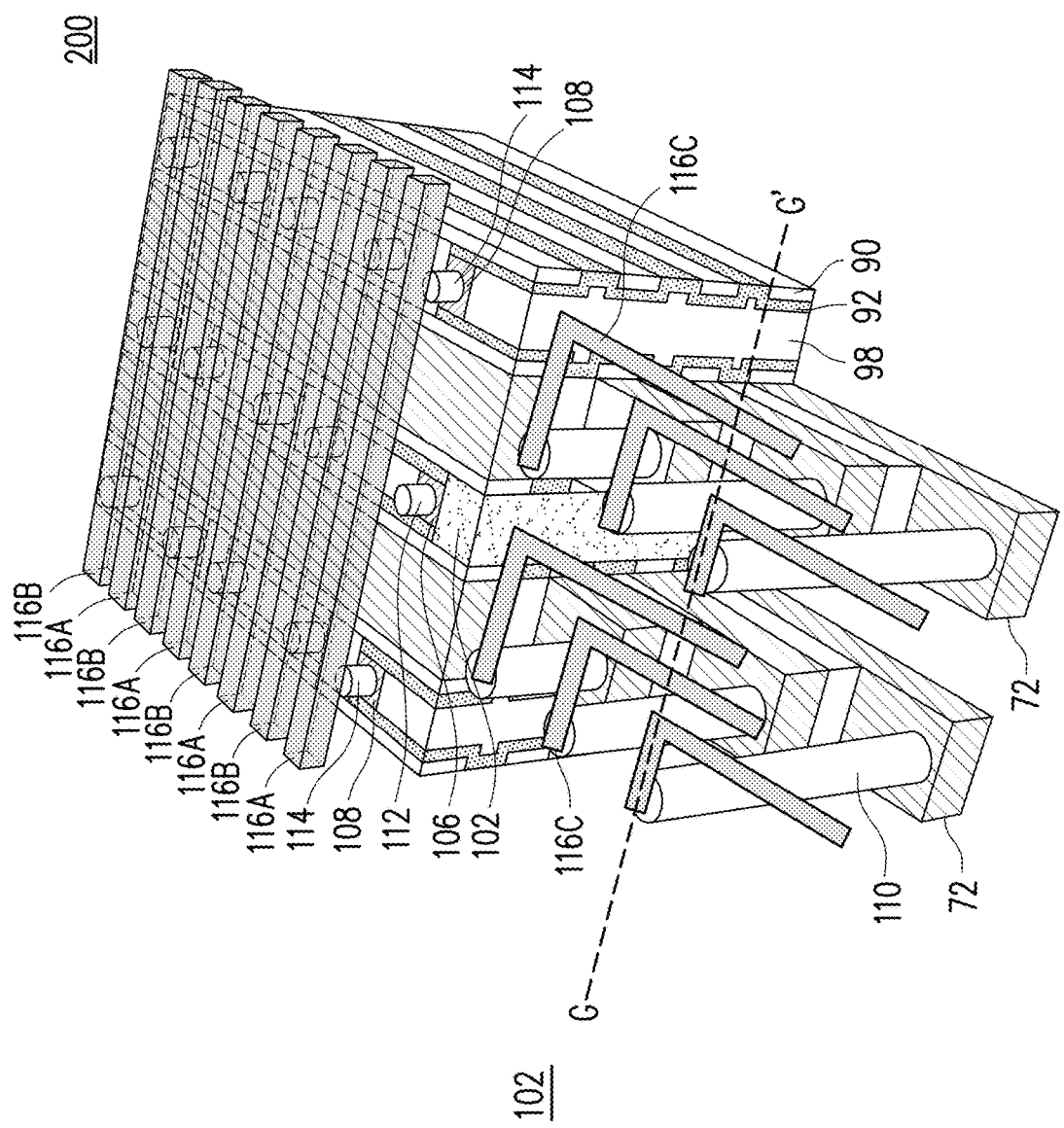
Figure 29B:
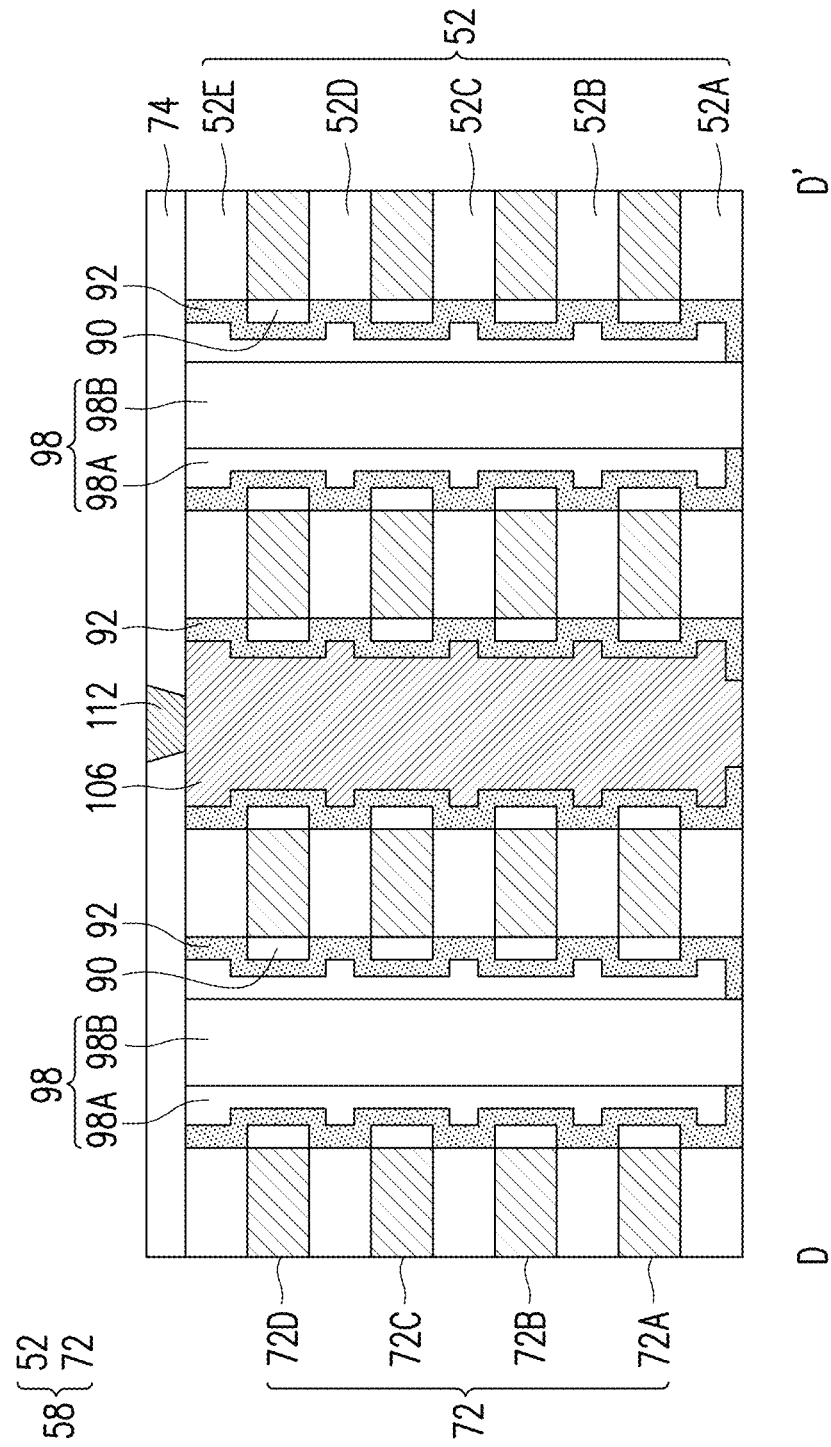
Figure 29C:
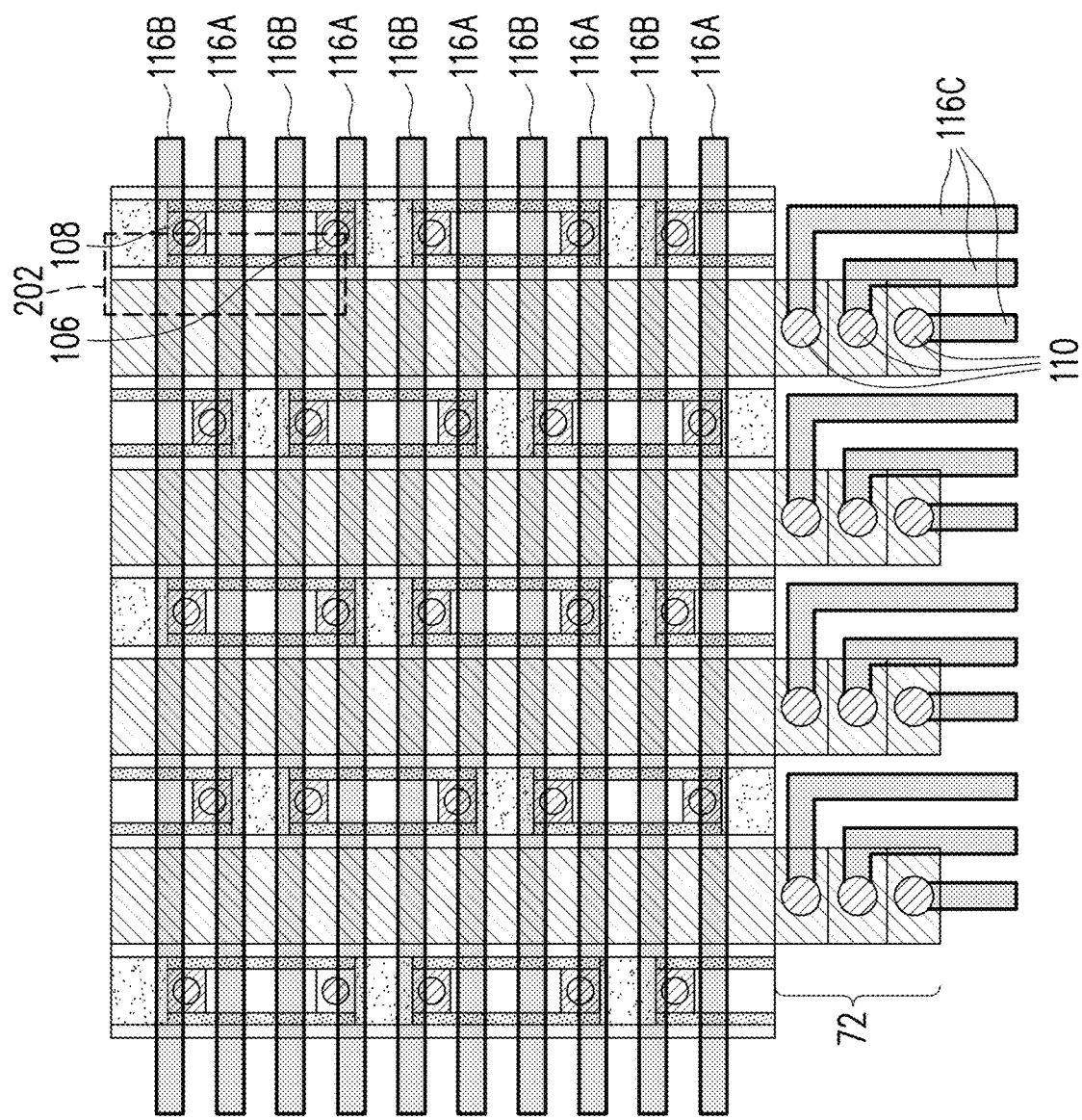
Figure 29D:
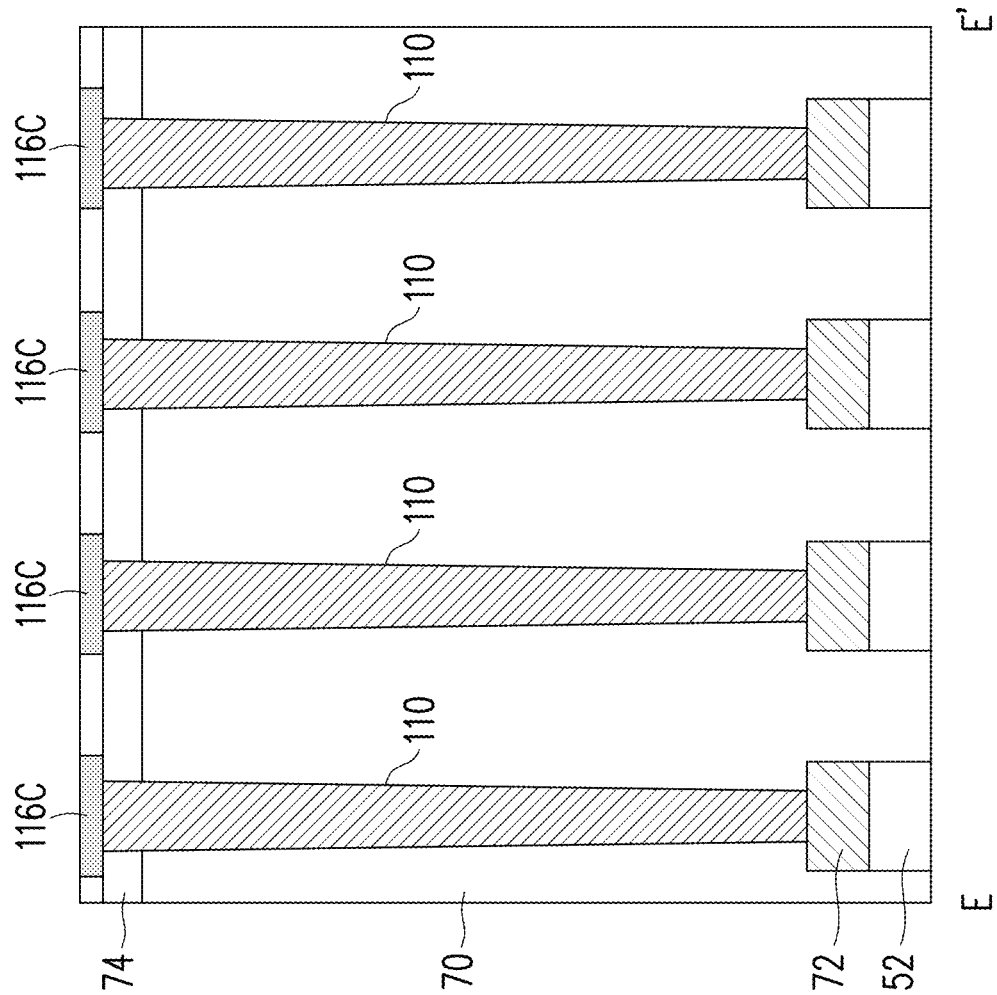
Figure 29E:
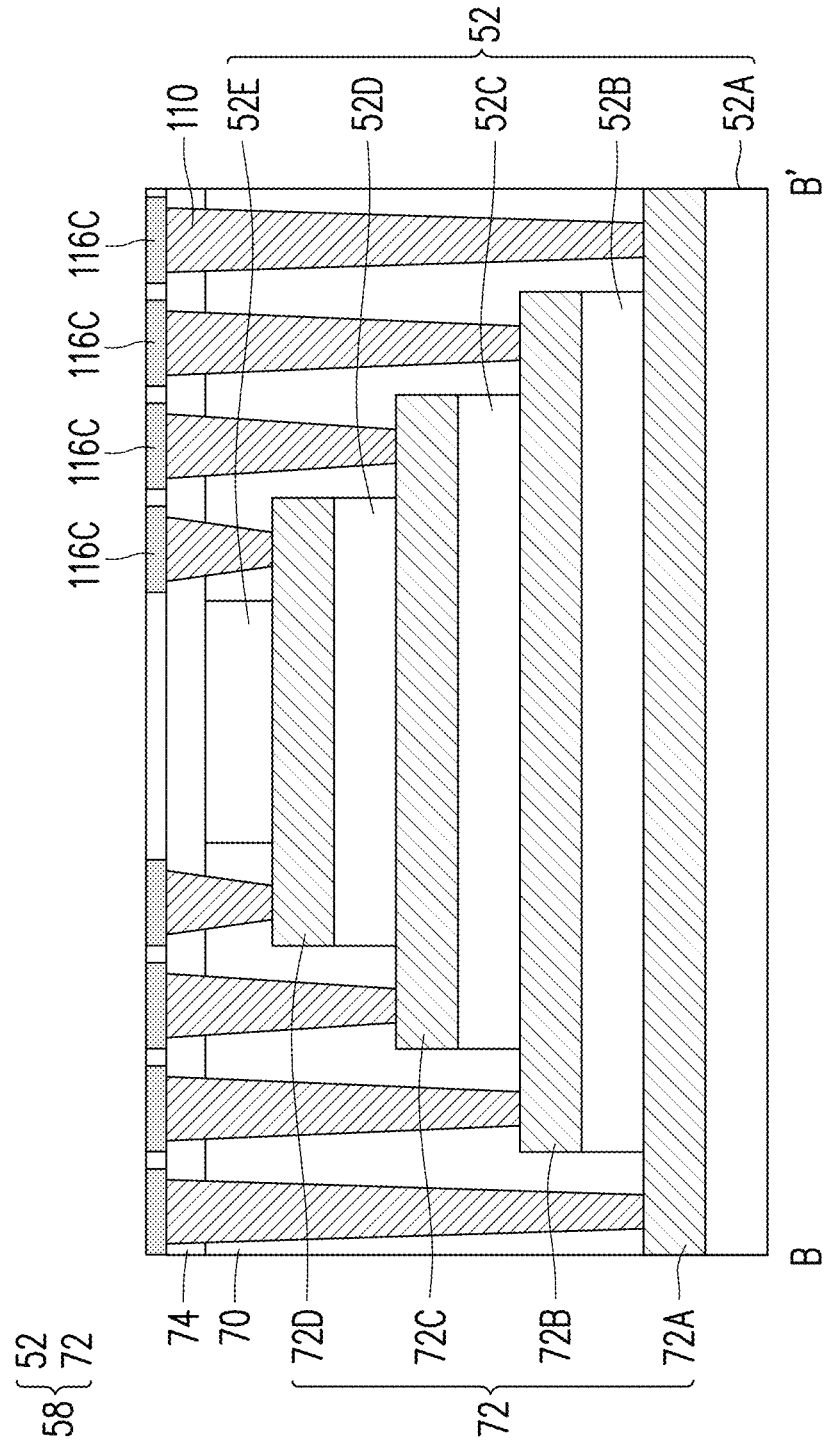

FIGS. 29A, 29B, 29C, and 29D illustrate forming conductive lines 116A, 116B, and 116C for the memory array 200. FIG. 29A illustrates a perspective view of the memory array 200; FIG. 29B illustrates a cross-sectional view of the memory array 200 along line D-D' of FIG. 1A; FIG. 29C illustrates a top-down view of the memory array 200 of FIG. 29A; and FIG. 29D illustrates a cross-sectional view along the line E-E' of FIG. 1A; and FIG. 29E illustrates a cross-sectional view of the device along line B-B' of FIG. 1A.

In FIGS. 29A, 29B, 29C, 29D, and 29E, an IMD 74 is formed on top surfaces of the multi-layer stack 58 (e.g., the dielectric layer 52E), the ferroelectric portions 90, the channel layer 92, the conductive pillars 106, and the conductive pillars 108 and the IMD 70. Conductive contacts 110, 112, and 114 are made on the conductive lines 72, the conductive pillars 106, and the conductive pillars 108, respectively.

The IMD 74 may be formed of a dielectric material, and may be deposited by any suitable method, such as CVD, PECVD, flowable CVD (FCVD), or the like. The dielectric materials may include phospho-silicate glass (PSG), boro-silicate glass (BSG), boron-doped phospho-silicate glass (BPSG), undoped silicate glass (USG), a low-k dielectric material or the like. In some embodiments, the IMD 74 may include an oxide (e.g., silicon oxide or the like), a nitride (e.g., silicon nitride or the like), a combination thereof or the like. Other dielectric materials formed by any acceptable process may be used. Thereafter, a removal process is applied to the IMD 74 to remove excess dielectric material over the multi-layer stack 58 and the IMD 70. In some embodiments, the removal process may be a planarization process, such as a chemical mechanical polish (CMP), an etch-back process, combinations thereof, or the like.

In some embodiments, the staircase shape of the conductive lines 72 may provide a surface on each of the conductive lines 72 for the conductive contacts 110 to land on. In some embodiments, forming the conductive contacts 110 may include patterning openings in the IMD 74 and IMD 70 to expose portions of the conductive lines 72 using a combination of photolithography and etching, for example. A liner (not shown), such as a diffusion barrier layer, an adhesion layer, or the like, and a conductive material are formed in the openings. The liner may include titanium, titanium nitride, tantalum, tantalum nitride, or the like. The conductive material may include copper, a copper alloy, silver, gold, tungsten, cobalt, aluminum, nickel, or the like. A planarization process, such as a CMP, may be performed to remove excess material from the surface of the IMD 74. The remaining liner and conductive material form the conductive contacts 110 in the openings.

As also illustrated by the perspective view of FIG. 29A, conductive contacts 112 and 114 may also be made on the conductive pillars 106 and the conductive pillars 108, respectively. The conductive contacts 112, 114 and 110 may be electrically connected to conductive lines 116A, 116B, and 116C, respectively, which connect the memory array to an underlying/overlying circuitry (e.g., control circuitry) and/or signal, power, and ground lines in the semiconductor die. For example, as shown in FIG. 30D, the conductive contacts 110 may extend through the IMD 74 and IMD 70 to electrically connect conductive lines 116C to the conductive lines 72. Other conductive contacts or vias may be formed through the IMD 74 to electrically connect the conductive lines 116A and 116B to the underlying active devices one the substrate. In alternate embodiments, routing and/or power lines to and from the memory array may be provided by an interconnect structure formed over the memory array 200 in addition to or in lieu of the interconnect structure 320. Accordingly, the memory array 200 may be completed.

Figure 30A:
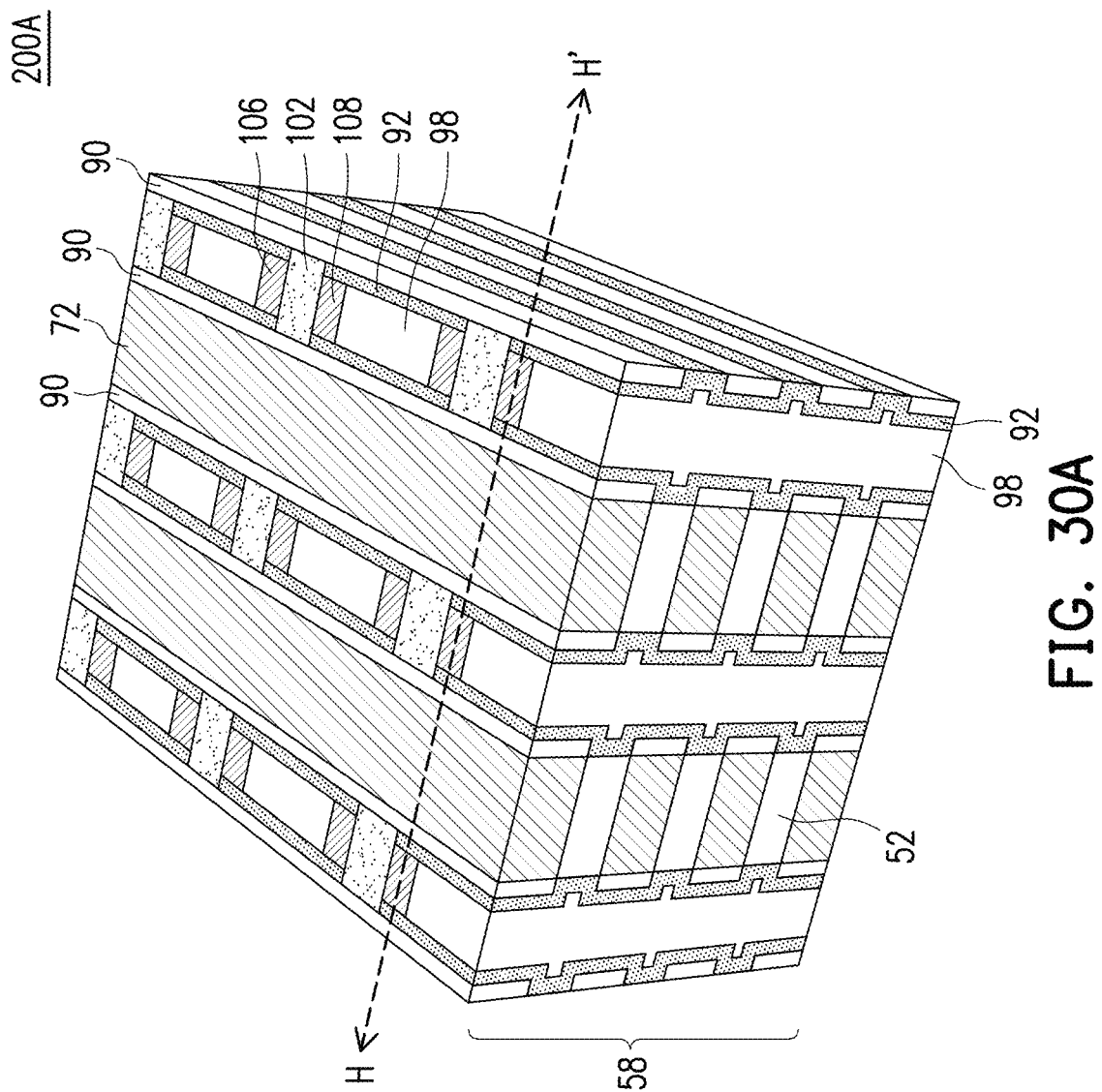
FIGS. 30A, 30B and 30C illustrate varying views of a memory array in accordance with alternative embodiments.
Figure 30B:
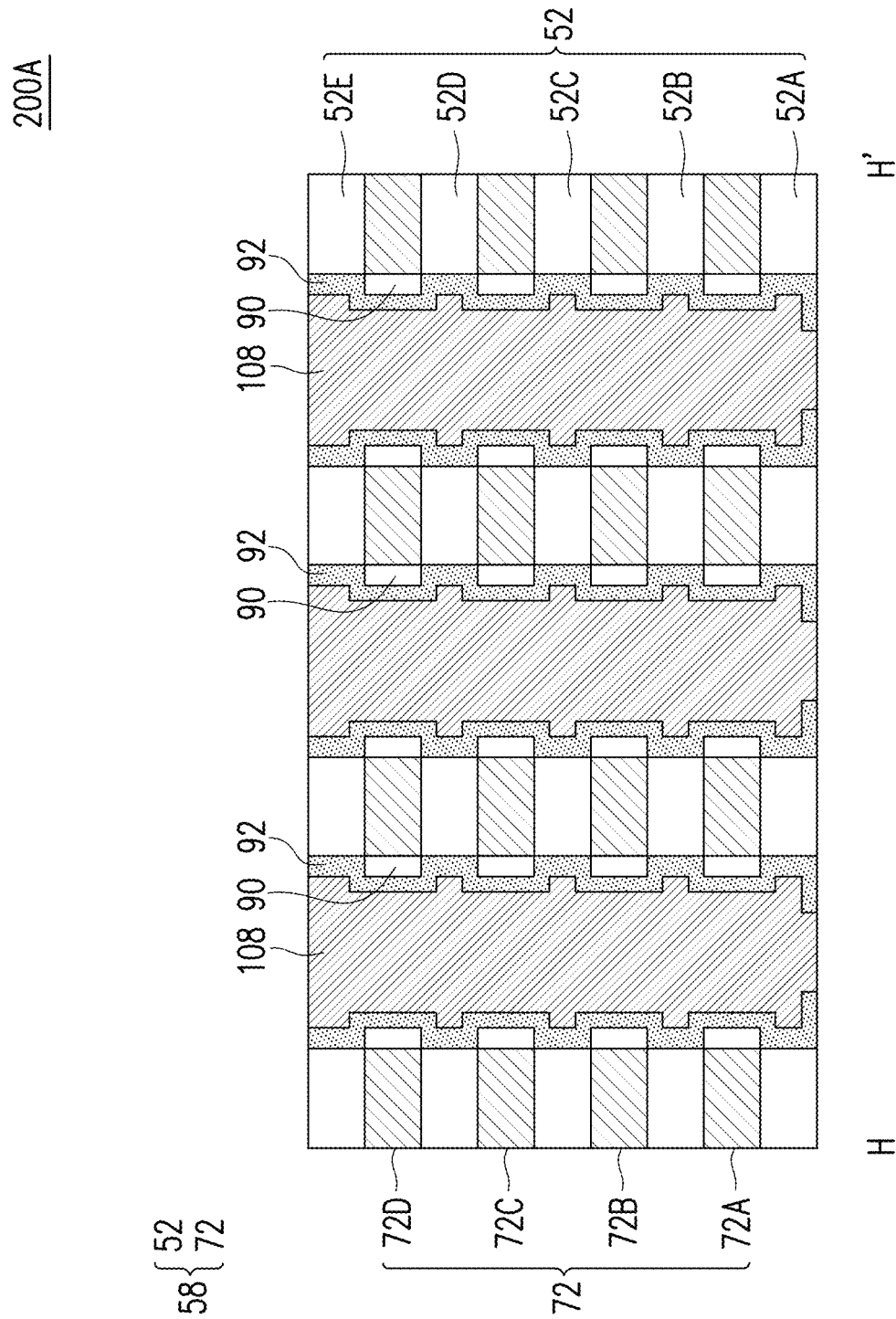
Figure 30C:
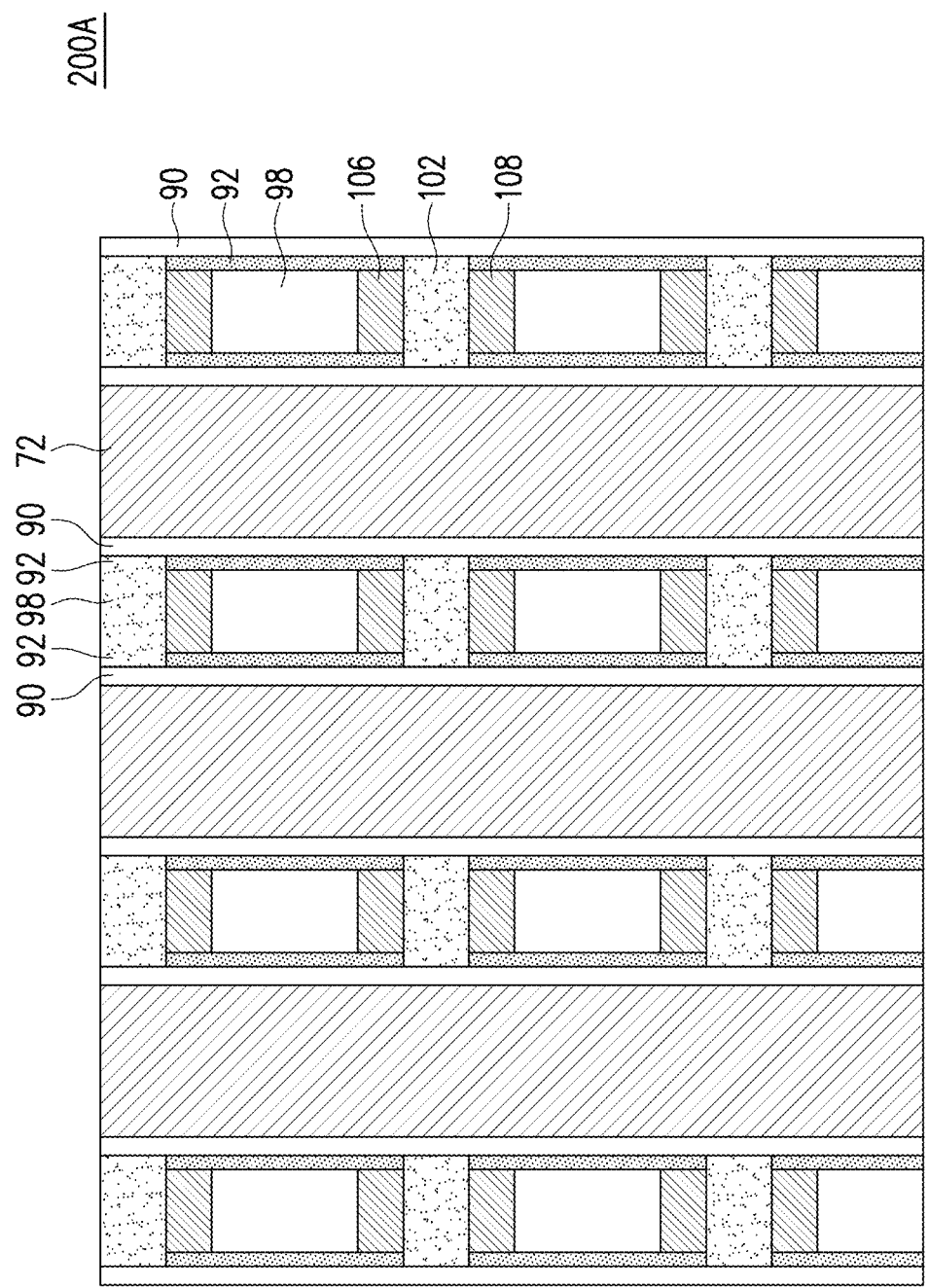

Although the embodiments of FIGS. 1A through 29D illustrate a particular pattern for the conductive pillars 106 and 108, other configurations are also possible. For example, in these embodiments, the conductive pillars 106 and 108 have a staggered pattern. However, in other embodiments, the conductive pillars 106 and 108 in a same row of the array are all aligned with each other, as shown in the ferroelectric memory array 200A of FIGS. 30A, 30B and 30C. FIGS. 30A, 30B and 30C illustrate examples of a memory array 200A according to alternative embodiments. FIG. 30A illustrates a perspective view of the memory array 200A; FIG. 30B illustrates a cross-sectional view of the device along line H-H' of FIG. 30A; and FIG. 30C illustrates a top-down view of the memory array 200A.

Figure 31:
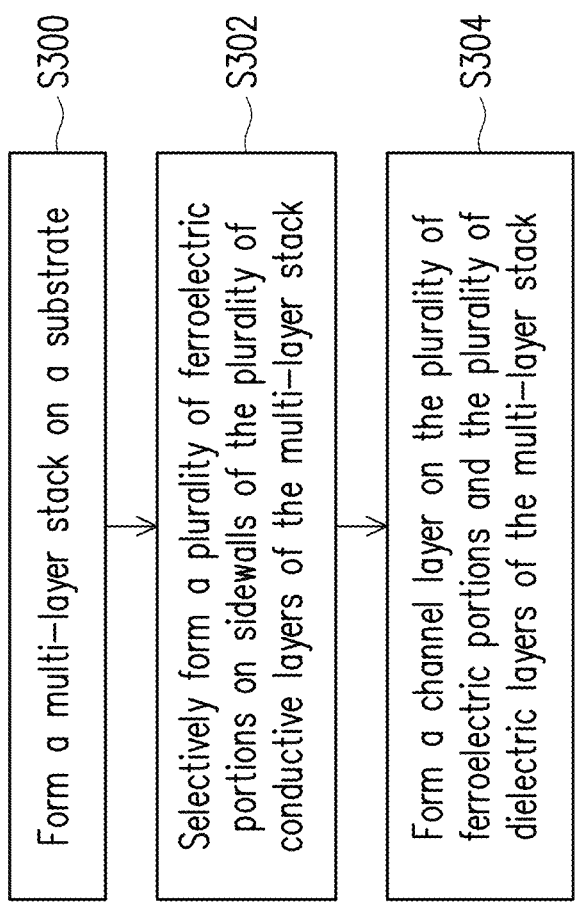
FIG. 31 illustrates a method of forming a memory array in accordance with some embodiments.

FIG. 31 illustrates a method of forming a ferroelectric memory device in accordance with some embodiments. Although the method is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act S300, a multi-layer stack is formed over a substrate. The multi-layer stack comprises a plurality of dielectric layers and a plurality of conductive layers stacked alternately and has a trench penetrating therethrough. FIG. 4 to FIG. 16B illustrate varying views corresponding to some embodiments of act S300.

At act S302, a plurality of ferroelectric portions are selectively formed. The plurality of ferroelectric portions are discretely formed on sidewall surfaces of the plurality of conductive layers. In some embodiments, the selectively forming a plurality of ferroelectric portions comprises performing a surface treatment on the plurality of dielectric layers; and depositing the plurality of ferroelectric portions on the sidewalls of the plurality of conductive layers. The surface treatment comprises selectively forming a plurality of inhibitor portions on the sidewall surfaces of the plurality of dielectric layers. The plurality of inhibitor portions comprises a plurality of self-assembled monolayers. The plurality of self-assembled monolayers comprise an alkanethiol, an alkanephophonic acid or a combination thereof, for example. The plurality of self-assembled monolayers comprise 1-octadecanethiol (ODT), or octadecylphophonic acid (ODPA). After the plurality of ferroelectric portions are deposited, an annealing process is performed to remove the plurality of self-assembled monolayers. FIG. 17A to FIG. 19B illustrate varying views corresponding to some embodiments of act S302.

At act S304, a channel layer is formed on the plurality of ferroelectric portions. FIG. 20A to FIG. 20A to 20F illustrate varying views corresponding to some embodiments of act S304.

In some embodiments of the disclosure, inhibitor portions are selectively formed on the sidewall surfaces of the dielectric-layer multi-layer stack, and thus ferroelectric portions are discretely disposed on the conductive layers of the multi-layer stack. Since the sidewall surfaces of the dielectric layers are blocked by the inhibitor portions, a ferroelectric material is hardly formed on the sidewall surfaces of the dielectric layers. Therefore, the issue of different growth rate of the ferroelectric material on the dielectric layers and conductive layers and different proportion of the orthogonal phase of the ferroelectric material on the dielectric layers and the conductive layers may be solved. In addition, since the ferroelectric material is not formed on the dielectric layers, the ferroelectric material on the conductive layers is not suppressed by the ferroelectric material on the dielectric layers, thus facilitating the formation of the orthorhombic phase and increasing the proportion of the orthorhombic phase. With the method of the disclosure, the proportion of the orthorhombic phase of the ferroelectric material on the sidewall surfaces of the conductive layers can be precisely controlled, so the method of the disclosure may be applied to the 3D high-density memory structure of in a small active HZO area. In addition, because the disclosed method is a low temperature process, it can be integrated into BEOL for embedded memory application.

In the above embodiments, the ferroelectric memory device is formed by a "staircase first process" in which the staircase structure is formed before the memory cells are formed. However, the disclosure is not limited thereto. In other embodiments, the ferroelectric memory device may be formed by a "staircase last process" in which the staircase structure is formed after the memory cells are formed.

In the above embodiments, the gate electrodes (e.g., word lines) are formed by depositing sacrificial dielectric layers followed by replacing sacrificial dielectric layers with conductive layers. However, the disclosure is not limited thereto. In other embodiments, the gate electrodes (e.g., word lines) may be formed in the first stage without the replacement step as needed.

Many variations of the above examples are contemplated by the present disclosure. It is understood that different embodiments may have different advantages, and that no particular advantage is necessarily required of all embodiments.

In accordance with some embodiments of the present disclosure, a ferroelectric memory device includes a multi-layer stack, disposed over a substrate and including a plurality of conductive layers and a plurality of dielectric layers stacked alternately; a channel layer, penetrating through the plurality of conductive layers and the plurality of dielectric layers; and a plurality of ferroelectric portions, discretely disposed between the channel layer and the plurality of conductive layers, the plurality of ferroelectric portions being vertically separated from one another by a non-zero distance.

In accordance with alternative embodiments of the present disclosure, a device includes a semiconductor substrate, a first memory cell over the semiconductor substrate, and a second memory cell over the first memory cell. The first memory cell includes a first thin film transistor. The first thin film transistor includes: a first ferroelectric portion on a sidewall of a first conductive line; and a first channel region of a channel layer around a top surface, a sidewall, and a bottom surface of the first ferroelectric portion. A conductive pillar vertically extends along sides of the first memory cell and the second memory cell, the first ferroelectric portion and the first channel region being laterally between the first conductive line and the conductive pillar In accordance with yet alternative embodiments of the present disclosure, a method of forming a ferroelectric memory device includes forming a multi-layer stack comprising a plurality of dielectric layers and a plurality of conductive layers stacked alternately over a substrate, sidewalls of the plurality of dielectric layers and the plurality of conductive layers define a trench penetrating therethrough; selectively forming a plurality of ferroelectric portions discretely on sidewalls of the plurality of conductive layers; forming a channel layer on the plurality of ferroelectric portions and the sidewalls of the plurality of dielectric layers; and forming a conductive pillar along sidewalls of the channel layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A ferroelectric memory device, comprising:
    a multi-layer stack disposed over a substrate and comprising a plurality of conductive layers and a plurality of dielectric layers stacked alternately;
    a channel layer penetrating through the plurality of conductive layers and the plurality of dielectric layers; and
    a plurality of ferroelectric portions discretely disposed laterally between the channel layer and the plurality of conductive layers, wherein the plurality of ferroelectric portions are vertically spaced apart from one another by one or more non-zero distances and are entirely laterally outside of the plurality of conductive layers and the plurality of dielectric layers.

2. The ferroelectric memory device of claim 1, wherein the channel layer has a sidewall with an uneven and wavy sidewall profile, the sidewall facing outermost sidewalls of both the plurality of conductive layers and the plurality of dielectric layers.

3. The ferroelectric memory device of claim 1, wherein the channel layer is in contact with a plurality of topmost surfaces, a plurality of bottommost surfaces, and a plurality of outermost sidewall surfaces of the plurality of ferroelectric portions.

4. The ferroelectric memory device of claim 3, wherein an outermost sidewall of the channel layer is in physical contact with the plurality of dielectric layers.

5. The ferroelectric memory device of claim 1, wherein the channel layer is directly over a top surface of one of the plurality of ferroelectric portions, the top surface being laterally outside of the plurality of conductive layers.

6. The ferroelectric memory device of claim 1, further comprising:
    a conductive pillar penetrating through the plurality of conductive layers and the plurality of dielectric layers, wherein the conductive pillar comprises:
        a plurality of first portions laterally adjacent to the plurality of dielectric layers; and
        a plurality of second portions, laterally adjacent to the plurality of conductive layers, wherein the plurality of first portions and the plurality of second portions have different widths.

7. The ferroelectric memory device of claim 6, wherein the channel layer is sandwiched between the plurality of dielectric layers and the plurality of first portions of the conductive pillar, and sandwiched between the plurality of ferroelectric portions and the plurality of second portions of the conductive pillar.

8. The ferroelectric memory device of claim 7, wherein the plurality of first portions of the conductive pillar have a first width greater than a second width of the plurality of second portions of the conductive pillar.

9. A device, comprising:
a semiconductor substrate;
a first memory cell over the semiconductor substrate, the first memory cell comprising a first thin film transistor, wherein the first thin film transistor comprises:
a first ferroelectric portion on a sidewall of a first conductive line; and
a first channel region of a channel layer around a topmost surface, an outermost sidewall, and a bottommost surface of the first ferroelectric portion;
a second memory cell over the first memory cell; and
a conductive pillar vertically extending along sides of the first memory cell and the second memory cell, wherein the first ferroelectric portion and the first channel region are laterally between the first conductive line and the conductive pillar.

10. The device of claim 9, wherein the second memory cell comprises a second thin film transistor, and the second thin film transistor comprises:
a second conductive line located over the first conductive line and separated from the first conductive line by a dielectric layer;
a second ferroelectric portion on a sidewall of the second conductive line; and
a second channel region of the channel layer around a top surface, a sidewall, and a bottom surface of the second ferroelectric portion.

11. The device of claim 10, wherein the channel layer continuously extends to physically contact the topmost surface, the outermost sidewall, and the bottommost surface of the first ferroelectric portion.

12. The device of claim 10, wherein the conductive pillar comprises:
a first region on a sidewall of the first channel region; and
a second region on a sidewall of the second channel region of the channel layer, wherein the first region and the second region have widths less than a width of a third region vertically therebetween.

13. The device of claim 9, wherein the first ferroelectric portion has a crystalline structure with an orthorhombic phase of more than 80 mol %.

14. A ferroelectric memory device, comprising:
a plurality of conductive lines vertically stacked over a substrate;
a plurality of dielectric layers vertically interleaved between the plurality of conductive lines;
a plurality of ferroelectric portions arranged on sidewalls of the plurality of conductive lines;
a channel layer extending through the plurality of conductive lines and the plurality of dielectric layers, wherein the channel layer is laterally separated from the plurality of conductive lines by the plurality of ferroelectric portions and wherein the plurality of ferroelectric portions are vertically separated from one another by the channel layer; and
a conductive pillar penetrating through the plurality of conductive lines and the plurality of dielectric layers, wherein the channel layer is laterally sandwiched between the conductive pillar and closest ones of the plurality of dielectric layers and the plurality of ferroelectric portions.

15. The ferroelectric memory device of claim 14, wherein the channel layer contacts outermost sidewalls, uppermost surfaces, and lowermost surfaces of respective ones of the plurality of ferroelectric portions.

16. The ferroelectric memory device of claim 14, wherein the conductive pillar comprises a conductive material that has one or more protrusions that extend outward from a sidewall of the conductive material to directly between an upper surface and a lower surface of the channel layer.

17. The ferroelectric memory device of claim 14, wherein the plurality of ferroelectric portions have first sidewalls facing the plurality of conductive lines and the channel layer has second sidewalls facing the plurality of dielectric layers, the first sidewalls aligned with the second sidewalls along a vertically extending line.

18. The ferroelectric memory device of claim 14, wherein the plurality of ferroelectric portions respectively comprise opposing outermost sidewalls that are laterally and completely confined between the plurality of conductive lines and the channel layer.

19. The ferroelectric memory device of claim 14, wherein the conductive pillar has a first width laterally adjacent to one of the plurality of conductive lines and a second width laterally adjacent to one of the plurality of dielectric layers, the second width being larger than the first width.

20. The ferroelectric memory device of claim 14,
wherein the plurality of conductive lines comprise a first conductive line and a second conductive line over the first conductive line; and
wherein the plurality of ferroelectric portions comprise a first ferroelectric portion on a sidewall of the first conductive line and a second ferroelectric portion on a sidewall of the second conductive line, the first ferroelectric portion being separated from the second ferroelectric portion by the channel layer.

* * * * *